United States Patent
Nomura et al.

(10) Patent No.: US 8,247,802 B2
(45) Date of Patent: Aug. 21, 2012

(54) MEMORY ELEMENT AND SEMICONDUCTOR DEVICE

(75) Inventors: Ryoji Nomura, Yamato (JP); Tamae Takano, Atsugi (JP); Takehisa Hatano, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1350 days.

(21) Appl. No.: 11/918,122

(22) PCT Filed: Apr. 21, 2006

(86) PCT No.: PCT/JP2006/308922
§ 371 (c)(1),
(2), (4) Date: Oct. 10, 2007

(87) PCT Pub. No.: WO2006/118229
PCT Pub. Date: Nov. 9, 2006

(65) Prior Publication Data
US 2009/0065768 A1    Mar. 12, 2009

(30) Foreign Application Priority Data
Apr. 28, 2005 (JP) .................................. 2005-133422

(51) Int. Cl.
*H01L 29/08* (2006.01)
*H01L 35/24* (2006.01)
*H01L 51/00* (2006.01)

(52) U.S. Cl. ........... 257/40; 257/E51.008; 257/E51.025; 257/E51.027

(58) Field of Classification Search .................... 257/40, 257/E51.008–E51.011, E51.025, E51.027
See application file for complete search history.

(56) References Cited

U.S. PATENT DOCUMENTS

| | | | |
|---|---|---|---|
| 6,828,685 B2 | 12/2004 | Stasiak | |
| 7,075,105 B2 | 7/2006 | Kano | |
| 2003/0194630 A1 | 10/2003 | Beck et al. | |
| 2004/0026690 A1* | 2/2004 | Bernds et al. | 257/40 |
| 2004/0122233 A1 | 6/2004 | Beck et al. | |
| 2005/0249975 A1* | 11/2005 | Sandberg et al. | 428/690 |

FOREIGN PATENT DOCUMENTS

| | | |
|---|---|---|
| JP | 03-129604 | 6/1991 |
| JP | 2004-304180 | 10/2004 |
| JP | 2005-228804 | 8/2005 |
| WO | WO 03/107426 | 12/2003 |

OTHER PUBLICATIONS

Search Report (Application No. 06745803.4), dated May 7, 2010.
International Search Report (Application No. PCT/JP2006/308922) dated Aug. 1, 2006.
Written Opinion (Application No. PCT/JP2006/308922) dated Aug. 1, 2006.

* cited by examiner

*Primary Examiner* — J. H. Hur
(74) *Attorney, Agent, or Firm* — Eric J. Robinson; Robinson Intellectual Property Law Office, P.C.

(57) ABSTRACT

To provide a memory element, a memory device, and a semiconductor device, which can be easily manufactured at low cost; are nonvolatile and data-rewritable; and have preferable switching properties and low operating voltage. A memory element of the invention includes a first conductive layer, a second conductive layer facing the first conductive layer, and an organic compound layer provided between the first and the second conductive layers. For the organic compound layer, a high molecular material having an amide group at least at one kind of side chains is used.

16 Claims, 27 Drawing Sheets

A  30  27  B

29

28  39

31

230 248 226 222 243 240

249

244

245
241

256

401a 401b 400 410

402

403 405 404

406

407 409 408

400  411  412

413

414a  414b 415  419

416  418  417

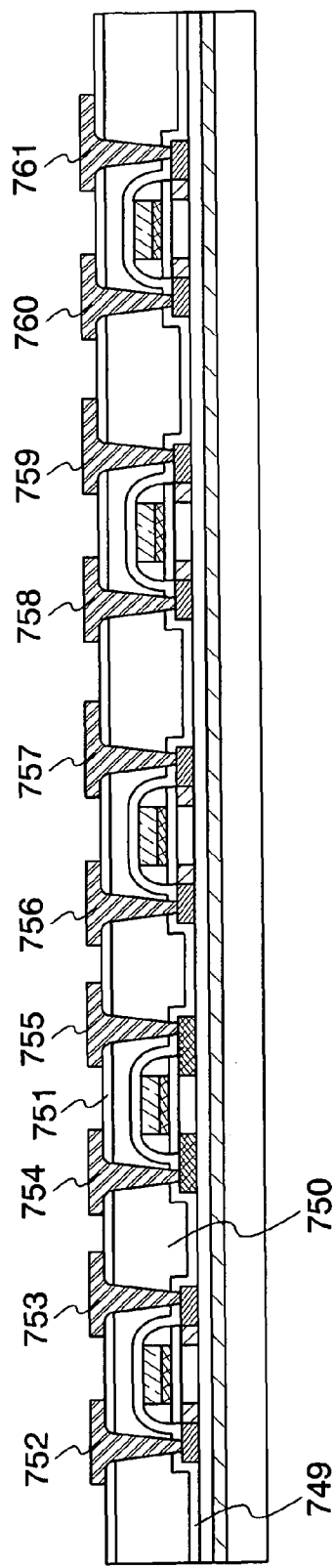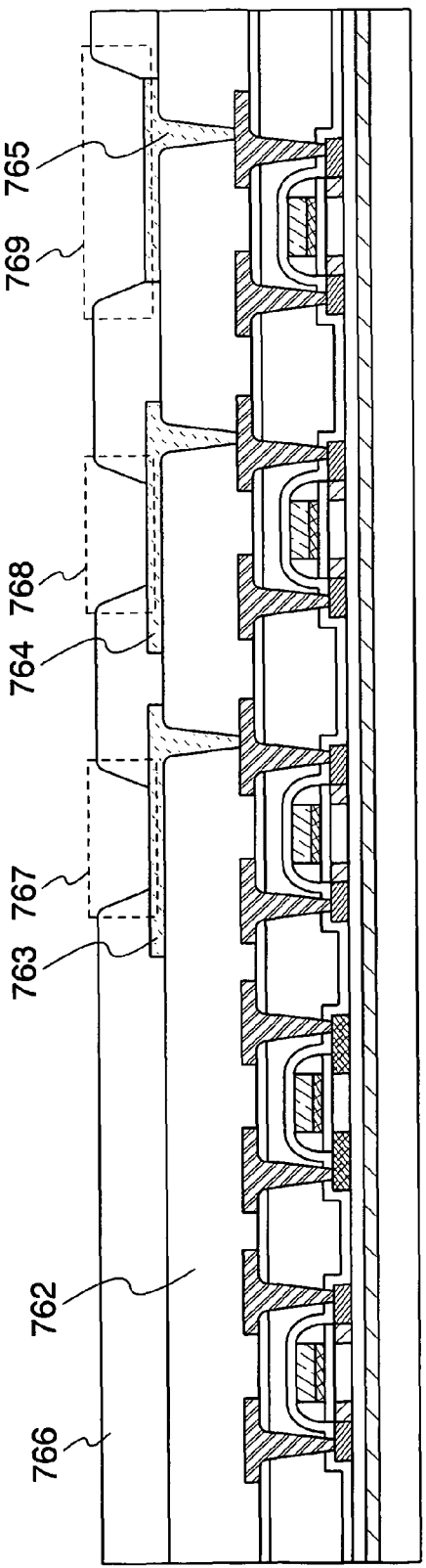

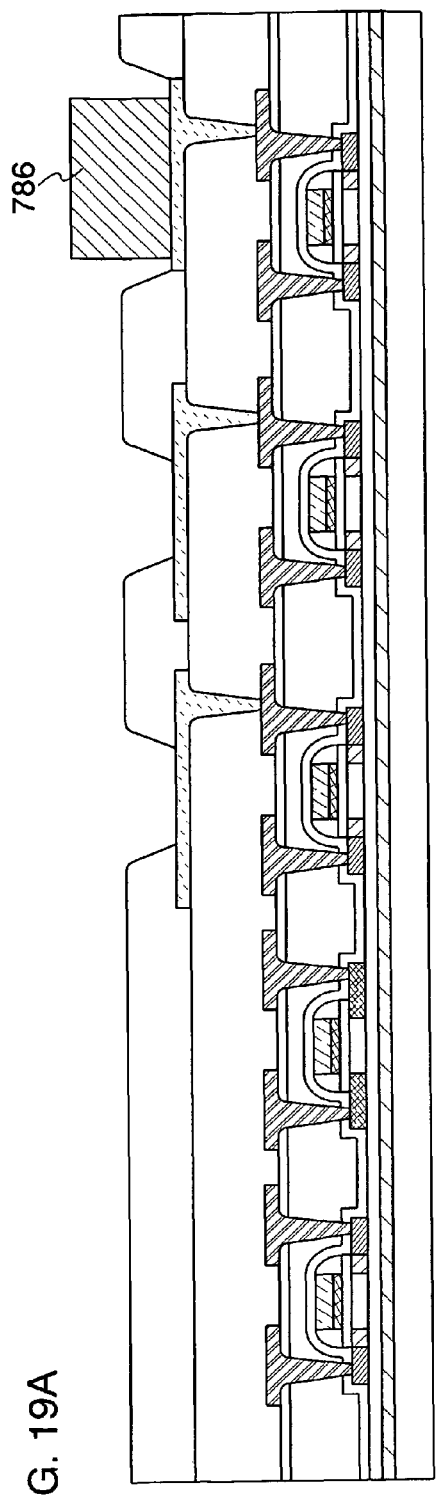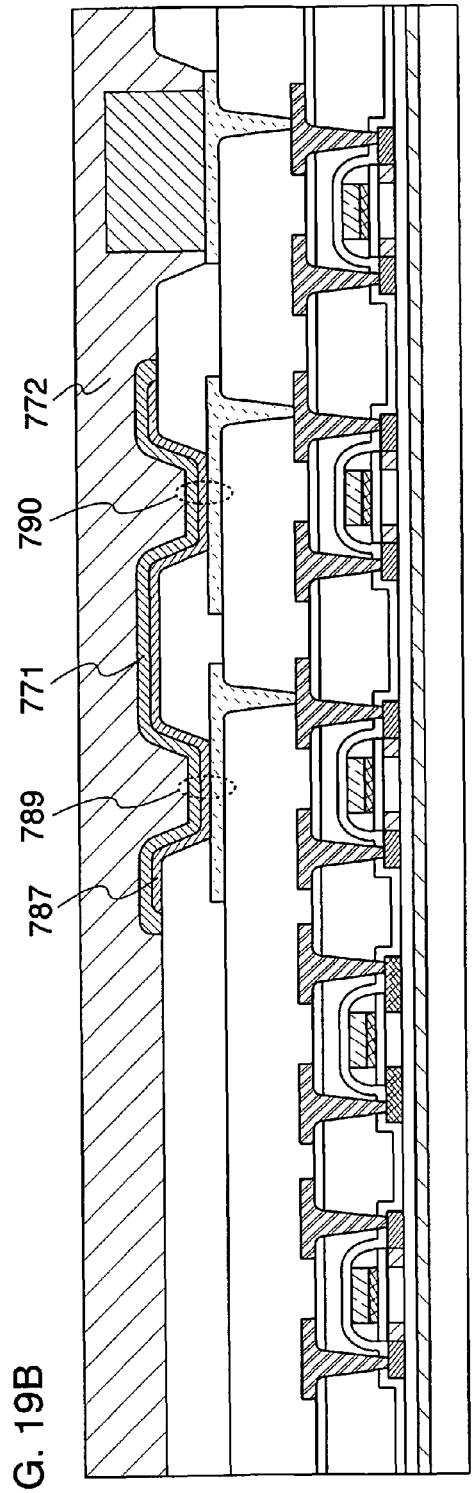
FIG. 19A
FIG. 19B

MEMORY ELEMENT AND SEMICONDUCTOR DEVICE

TECHNICAL FIELD

The present invention relates to a semiconductor device, and particularly relates to a semiconductor device capable of storing, erasing, and rewriting data by using an organic compound in a memory circuit.

BACKGROUND ART

Recently, an individual-recognition technology has received attention, in which by giving an ID (individual identification number) to each object, information such as a history of the object is clarified and manufacturing and management are conducted by making use of the information. A semiconductor device capable of non-contact data transmission and reception has been developed. As such a semiconductor device, an RFID (Radio Frequency Identification) (also referred to as an ID tag, an IC chip, an IC tag, an RF (Radio Frequency) tag, a wireless tag, an electronic tag, or a wireless chip) or the like specifically begins to be introduced into companies, markets, or the like.

Most of these semiconductor devices which are practically used at present include a circuit (also referred to as an IC (Integrated Circuit) chip) which uses a semiconductor substrate such as an Si substrate and an antenna, and the IC chip is formed of a memory circuit (also, referred to as a memory), a control circuit, or the like. A semiconductor device having high function and high added value can be provided by being equipped with a memory circuit which is particularly capable of storing much data.

DISCLOSURE OF INVENTION

Generally as a memory circuit provided on a semiconductor device, a DRAM (Dynamic Random Access Memory), an SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory, or the like can be used for example. Among the memory circuits, the DRAM and the SRAM are volatile memory circuits. Accordingly, since data is erased when power is turned off in the DRAM and the SRAM, every time power supply is on, data needs to be written in.

Among nonvolatile memories, the EPROM, the EEPROM, the flash memory, and the FeRAM are memories in which a user can freely write and erase information. In accordance with the recent development in information technology, a memory in which a greater amount of data can be stored, erased, and read out is required, and miniaturization, cost reduction, and integration of these nonvolatile memories are important issues. However, there is a disadvantage that the EPROM needs to be irradiated with ultraviolet light in order to erase information. Although the EEPROM and the flash memory are nonvolatile memory circuits, since they each use an element including two gate electrodes, manufacturing steps thereof are inevitably increased. On the contrary, the FeRAM uses a ferroelectric thin film material and can be compatible with a material used in Si process and the process. Accordingly, the FeRAM has a possibility of price reduction in addition to preferable characteristics. However, practical realization of this FeRAM is substantially delayed. This is due to technical difficulty in thinning a film of ferroelectrics.

From the point of view, a memory element using a ferroelectric high molecular material has recently been examined. This is because a film of a high molecular material can be easily formed by a wet process such as spin coating, an inkjet method, a dip coating method, an LB method, a printing method, or a spray method, and a thin film with a favorable film quality can be formed. In addition, the thickness of the film can be easily controlled. Accordingly, the technical difficulty relating to the thinning of the ferroelectrics can be solved by using the high molecular material.

As a high molecular material which has been examined, there is polyvinylidene fluoride (hereinafter referred to as PVDF), a copolymer of vinylidene fluoride and trifluoroethylene (hereinafter referred to as P(VDF/TrFE)), polyvinyl fluoride (referred to as PVF), polyacrylonitrile, nylon, a copolymer of dicyanoethylene and acrylic ester, a copolymer of dicyanoethylene and methacrylic ester, polyparaxylylene, aromatic polyamide, polysulphone, or the like. Due to polarization formed by a permanent dipole included in a bond having high polarizability, these materials show ferroelectricity.

The bond having high polarizability can be broadly classified into two groups. One is a bond of carbon and a substitute having high electron withdrawing properties such as fluorine or a cyano group and has large dipole moment in the bond itself. For example, PVDF, P(VDF/TrFE), PVF, polyacrylonitrile, or the like includes this bond. The other is a hydrogen bond between amide groups. Although an amide group itself has high electron withdrawing properties, large dipole moment can be generated by forming the hydrogen bond between the amide groups. This is used in aromatic polyamide or nylon. The dipole moment generated by these bonds can be reversed by applying electric field. In addition, since polarization remains even after stopping the electric field supply, polyamide or nylon can be potentially applied to a nonvolatile and rewritable memory element or memory device by distinguishing difference in dipole moment directions as information of 1 and 0.

However, in order to change the direction of polarization by electric field, a high molecular chain needs to be rotated. In the case of using the latter hydrogen bond, a hydrogen bond is formed not only in a molecule but also between molecules; accordingly, this hydrogen bond between molecules inhibits the rotation of the high molecular chain. Thus, favorable switching properties cannot be obtained. On the other hand, although a polymer of the former type has favorable switching properties, it requires high operating voltage; therefore, the thickness of a high molecular film needs to be reduced. However, by reducing the film thickness, switching becomes slow and the time for reversing the polarization is lengthened. This means that the time required for writing into a memory element and erasing the memory is lengthened. In this manner, there are a lot of problems to be solved, in developing a memory element using a ferroelectric high molecular material.

In consideration of the above condition, it is an object of the present invention to provide a memory element, a memory device, and a semiconductor device, which can be easily manufactured at low cost, are nonvolatile and data-rewritable, and have preferable switching properties and low operating voltage.

In order to achieve the object, the following means is adopted in this invention.

One feature of a memory element of the invention is to include a first conductive layer, a second conductive layer facing the first conductive layer, and an organic compound layer provided between the first and the second conductive layers, in which the organic compound layer includes a high molecular material having an amide group at least at one kind of side chains. Here, it is preferable that a structure of a main chain in the high molecular material has a regularity of 90% or more. In addition, one feature of the memory element of the invention is that the high molecular material has an amide group at a side chain at a constant rate and an intramolecular hydrogen bond is formed between amide groups at side chains which are selected at a constant rate. It is preferable that the amide groups at side chains which are selected at a constant rate are accumulated along a high-molecular main chain due to the hydrogen bond and a high-molecular chain is formed. Another feature of the memory element of the invention is that the direction of the amide groups which are accumulated along the high-molecular main chain is controlled by applying voltage to a pair of electrodes thereby storing information.

One feature of a semiconductor device of the invention is to include a plurality of bit lines extending in a first direction, a plurality of word lines extending in a second direction which is perpendicular to the first direction, a plurality of memory cells each including a memory element portion, and a memory cell array including the plurality of memory cells, in which the memory element portion has a stack structure including a conductive layer forming the bit lines, an organic compound layer, and a conductive layer forming the word lines. Here, another feature thereof is that the organic compound layer contains a high molecular material having an amide group at least at one kind of side chains. Further, it is preferable that a structure of a main chain in the high molecular material has a regularity of 90% or more. In addition, still another feature thereof is that the high molecular material has an amide group at a side chain at a constant rate and an intramolecular hydrogen bond is formed between amide groups at high-molecular side chains which are selected at a constant rate. It is preferable that the amide groups at side chains which are selected at a constant rate are accumulated along a high-molecular main chain due to the hydrogen bond and a high-molecular chain is formed. Further, in the semiconductor device of the invention, a direction of the amide groups which are accumulated along the high-molecular main chain is controlled by applying voltage to a pair of electrodes and thereby storing information.

By utilizing the invention, a memory element and a memory device can be provided, in which data can be arbitrarily written, erased, and rewritten. In addition, by utilizing the invention, an inexpensive semiconductor device having a minute structure can be provided.

In addition, since an organic compound in which amide groups at side chains have hydrogen bonds is particularly used for a memory element and a memory device of the invention, a memory element and a memory device having preferable switching properties can be provided. In addition, a memory element and a memory device can be driven with low operating voltage.

BRIEF DESCRIPTION OF DRAWINGS

In the accompanying drawings:
FIGS. 18A and 18B show one example of a structure of a manufacturing method of a semiconductor device according to the invention;
FIGS. 19A and 19B show one example of a structure of a manufacturing method of a semiconductor device according to the invention.

BEST MODE FOR CARRYING OUT THE INVENTION

Embodiment Mode

Figure 1A:
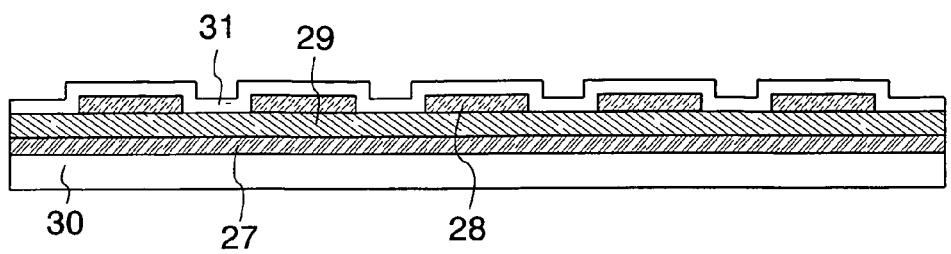
FIGS. 1A and 1B show one example of a structure of a semiconductor device according to the invention.

Embodiment modes and an embodiment of the invention will be described in detail with reference to the drawings. However, it is easily understood by those skilled in the art that the invention is not limited by the following descriptions and various changes may be made in forms and details without departing from the spirit and the scope of the invention. Therefore, the invention should not be limited to descriptions of the embodiment modes and embodiment below. The same reference numerals are commonly given to the same components or components having the same function in the structure of the invention.

Embodiment Mode 1

In Embodiment Mode 1, one example of a structure of a memory device in which an organic compound is provided between two conductive layers (hereinafter referred to as an organic memory) will be described with reference to drawings.

A memory element according to the invention includes, as shown in FIG. 1A, a first conductive layer 27, an organic compound layer 29, and a second conductive layer 28, which are provided over a substrate 30.

As the substrate 30 for example, a glass substrate such as barium borosilicate glass or aluminoborosilicate glass, a quartz substrate, a ceramic substrate, or the like can be used. In addition, a metal substrate containing stainless steel or a semiconductor substrate on which an insulating layer is formed may be used. A substrate including a flexible synthetic resin such as plastic, for example PET, generally tends to have lower heat resistance temperature, compared to that of the above-mentioned substrate; however, it can be used as long as it can withstand process temperature in a manufacturing process. Note that a surface of the substrate 30 may be planarized in advance by polishing such as a CMP method.

Over the substrate 30, the first conductive layer 27 is formed. In addition, the organic compound layer 29 is formed over the first conductive layer 27, and the second conductive layer 28 is formed over the organic compound layer 29. As the first conductive layer 27 and the second conductive layer 28, a single layer or a stack structure of an element selected from gold (Au); silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), tantalum (Ta), or the like or an alloy containing a plurality of the above elements can be used. As the alloy containing a plurality of the above elements, for example, an alloy containing Al, Ti, and C, an alloy containing Al and Ni, an alloy containing Al and C, an alloy containing Al, Ni, and C, an alloy containing Al and Mo, or the like can be used. Alternatively, a known conductive polymer of which conductivity is improved by doping or the like can be used, such as conductive polyaniline, conductive polypyrrole, conductive polythiophene, a complex of polyethylene dioxythiophene (PEDOT) and polystyrenesulphonic (PSS), or the like.

In addition, a transparent conductive material may be used. As the transparent conductive material, indium tin oxide (ITO), zinc oxide (ZnO), indium zinc oxide (IZO), zinc oxide in which gallium is added (GZO), or the like or another light-transmitting conductive oxide material can be used. ITO, indium tin oxide containing silicon oxide, or a material in which 2 to 20 wt % of zinc oxide (ZnO) is further mixed into indium oxide containing silicon oxide may be used. The above material can be formed by a droplet discharge method, a vapor-deposition method, a sputtering method, a CVD method, a spin coating method, or various printing methods such as screen printing and gravure printing. For example, Ag can be formed by a droplet discharge method, or Al can be formed by a vapor-deposition method.

The organic compound layer 29 is provided between two electrodes of the first conductive layer 27 and the second conductive layer 28. Note that the organic compound layer mentioned here means a layer formed with an organic compound, and the organic compound indicates a high molecular material including an amide group at a side chain. Specifically, favorable examples thereof are polyacrylamide indicated by the following general formula 1 and a derivative thereof, polymethacrylamide indicated by the following general formula 2 and a derivative thereof, and polypropargylamide indicated by the following general formula 3 and a derivative thereof.

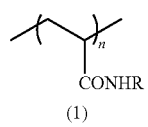

[Chemical Formula 1]

(1)

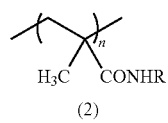

[Chemical Formula 2]

(2)

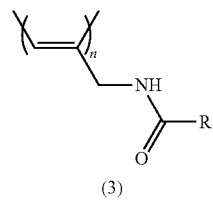

[Chemical Formula 3]

(3)

A high molecule in which tacticity of a main chain is highly controlled is a particularly favorable example. For example, in the polyacrylamide derivative or the polymethacrylamide derivative, tacticity of a main chain (syndiotactic, heterotactic, or isotactic) is preferably controlled at 90% or more. A material having high syndiotacticity can be made by polymerizing acrylic ester or methacrylic ester with a rare-earth catalyst and later producing polymeric reaction with primary amine. A material having high isotacticity can be made by, for example, polymerizing the monomer with Grignard reagent in a low polarity solvent such as ether. Meanwhile, it is preferable in the polypropargylamide derivative that geometry (cis, trans) of a main chain is highly controlled. It is specifically preferable to control the geometry to the cis form, and these polymers can be obtained by polymerizing a corresponding monomer (propargylamide derivative) with a rhodium catalyst or an iron catalyst.

By highly controlling the tacticity of a main chain, a specific and regular steric structure of the main chain such as a helical structure can be obtained. As a result, side chains are also arranged regularly, and in the case where the side chains are amide groups, the amide groups preferentially form intramolecular hydrogen bonds than intermolecular hydrogen bonds. Accordingly, rotation of the high molecular chain becomes hard to be inhibited, and preferable switching properties can be obtained. In addition, by highly controlling the tacticity of the main chain, amide groups which are selected at a constant rate can further form high-molecular chains by hydrogen bonding. In order to obtain such a specific and regular steric structure, tacticity of a main chain is required to be highly controlled, and it is preferable that the tacticity of a main chain is 90% or more. As a specific example, a polypropargylamide derivative is shown in the following general formula 4.

[Chemical Formula 4]

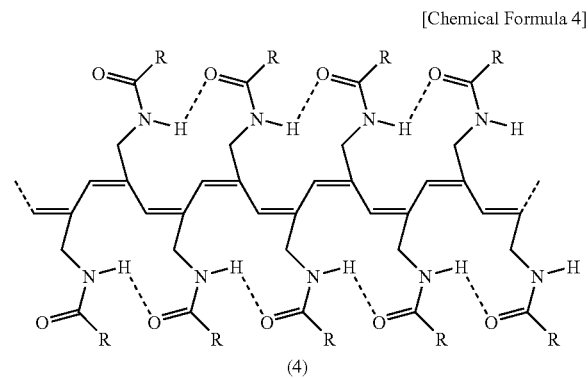

(4)

As shown in the above general formula 4, an n-th amide group and an (n+2)-th amide group form a hydrogen bond. In other words, first, third, fifth, seventh, . . . side chain amide groups form hydrogen bonds in a molecule, and a high-molecular chain is formed by the hydrogen bonds along a main chain. Similarly, second, fourth, sixth, eighth, tenth, . . . side chain amide groups form hydrogen bonds in a molecule, and a high-molecular chain is formed by the hydrogen bonds along the main chain. As a result, two hydrogen bonding high molecular chains are formed along an axis of the main chain. In each hydrogen bond high molecular chain, since the amide groups face in the same direction, huge dipole moment is generated along the axis of the main chain. The direction of the amide groups is controlled by applying an electric field from the outside. Therefore, by changing the direction of the electric field from the outside, the direction of the huge dipole moment can be changed, and huge remanent polarization can be given. In addition, in the case of changing the direction of the external electric field, directions of amide groups are changed in series by changing the direction of one amide group. Accordingly, preferable switching properties can be achieved. Note that the organic compound layer may be a single layer, a stacked layer, or a mixed layer.

An insulating layer 31 may be provided as a protective film so as to cover the second conductive layer 28. As the insulating layer 31, a single layer structure or a stack structure of an inorganic material or the like containing oxygen or nitrogen such as silicon oxide ($SiO_x$), silicon nitride ($SiN_x$), silicon oxynitride ($SiO_xN_y$) (x>y), silicon nitride oxide ($SiN_xO_y$) (x>y) can be used. Alternatively, a single layer or a stack structure of an organic material or the like such as polyimide, polyamide, polyvinylphenol, benzocyclobutene, acrylic, epoxy, siloxane can be used. A stack of an inorganic material and an organic material may be used instead. The siloxane has a skeletal structure formed from a bond of silicon (Si) and oxygen (O). As a substituent, an organic group containing at least hydrogen (for example, an alkyl group or aromatic hydrocarbon) is used. As the substituent, a fluoro group may also be used. Alternatively, an organic group containing at least hydrogen and a fluoro group may be used as a substituent.

Figure 2A:
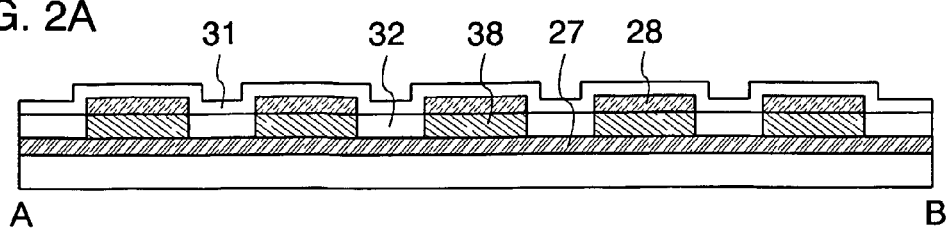
FIGS. 2A to 2E show examples of a structure of a semiconductor device according to the invention.

Note that the structure shown in FIG. 1A is only an example, and the invention is not limited to this structure. A case different from the above structure is shown in FIG. 2A.

The organic compound layer 29 is formed to cover an entire surface of the first conductive layer 27 in FIG. 1A. Alternatively, in the case where an effect of electric field on lateral directions between adjacent memory cells is concerned, an insulating layer 32 may be provided between organic compound layers provided in each memory cell 80, so as to separately form organic compound layers provided in each memory cell (FIG. 2A). In other words, an organic compound layer 38 is selectively provided in every memory cell. In this case, an organic compound layer can be effectively provided by selectively forming it in each memory cell by a droplet discharge method or a printing method.

Figure 2B:
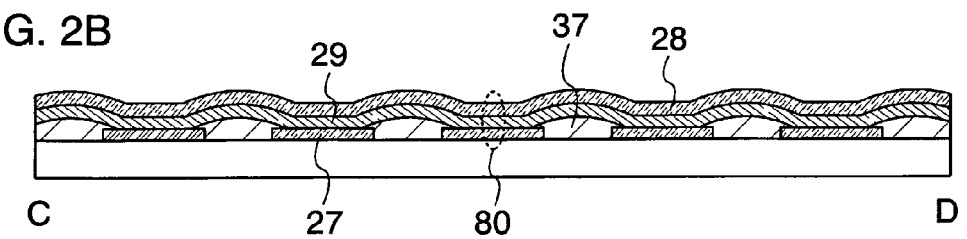

In addition, when providing the organic compound layer 29 to cover first conductive layers 27, an insulating layer 37 may be provided between the first conductive layers 27 to cover edge portions of the first conductive layers 27, in order to prevent disconnection of the organic compound layer 29 caused by a level difference in the first conductive layers 27 or effect of electric field on lateral directions between memory cells (FIG. 2B). In this case, the insulating layer 37 can be selectively formed between the plurality of first conductive layers 27 by a droplet discharge method.

Figure 2C:
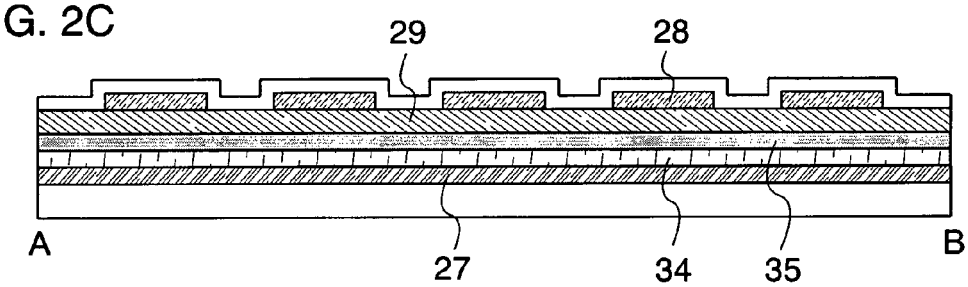

In addition, in the structure of FIG. 1A, a rectifying element may be provided between the first conductive layer 27 and the organic compound layer 29 (FIG. 2C). The rectifying element means a diode in which a gate electrode and a drain electrode are connected. Here, a case of providing a PN junction diode including semiconductor layers 34 and 35 is described. One of the semiconductor layers 34 and 35 is an n-type semiconductor, and the other is a p-type semiconductor. By providing the rectifying diode in this manner, current flows in only one direction. Accordingly, errors are reduced, and readout margin is improved. Note that in the case of providing a diode, a diode having another structure such as a PIN junction diode or an avalanche diode can also be used instead of using the PN junction diode. Note that the rectifying element may be provided between the organic compound layer 29 and the second conductive layer 28.

Figure 1B:
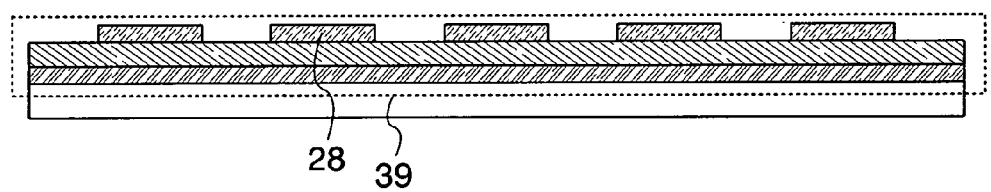
Figure 2D:
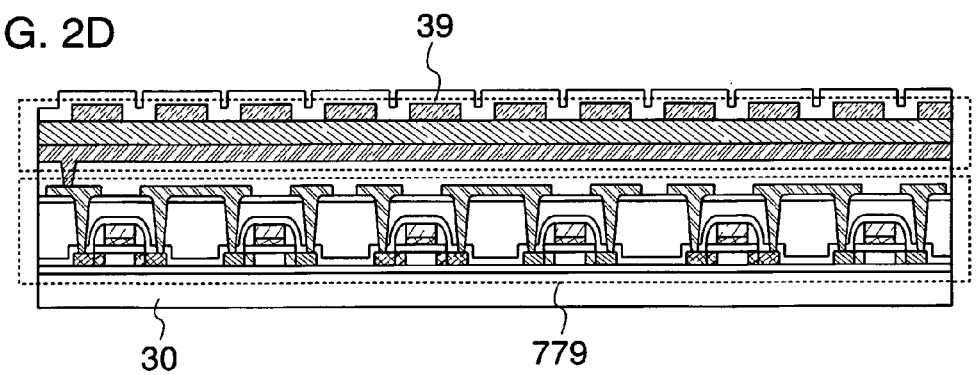
Figure 2E:
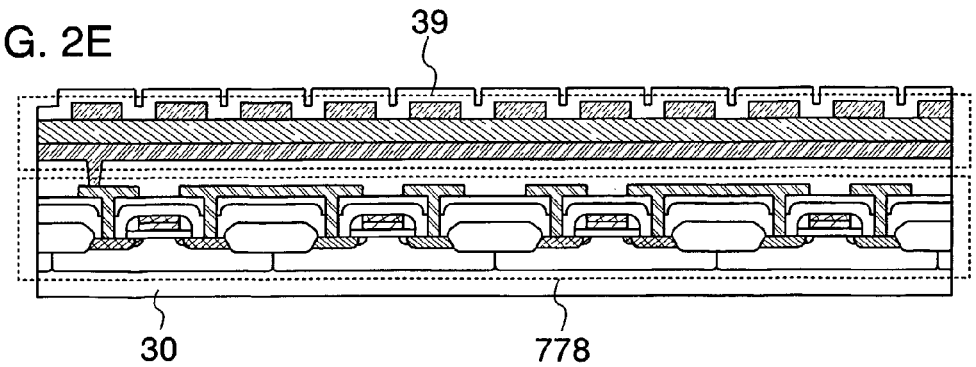

In FIG. 1B, a structure of providing a memory element portion 39 over the substrate 30 is described; however, the invention is not limited to this, and a thin film transistor (TFT) 779 may be provided over the substrate 30 and the memory element portion 39 may be formed thereover (FIG. 2D). Alternatively, a semiconductor substrate of Si or the like or an SOI substrate may be used as the substrate 30, a field effect transistor (FET) 778 may be formed with using the substrate as a channel portion, and the memory element portion 39 may be formed thereover (FIG. 2E). Note that the case of forming the memory element portion 39 over the thin film transistor 779 or the field effect transistor 778 is described; however, the memory element portion 39 and the thin film transistor 779 or the field effect transistor 778 may be attached. In this case, the memory element portion 39 and the thin film transistor 779 or the field effect transistor 778 are manufactured in different steps, and later they can be attached by using a conductive film or the like. In addition, the thin film transistor 779 or the field effect transistor 778 may have any structure as long as it is known.

As described above, since a high molecular material including an amide group in a side chain can be provided as an organic compound layer of a memory element portion by a droplet discharge method, a printing method, or a spin coating method in this embodiment mode, an inexpensive memory device or a semiconductor device can be manufactured simply. Further, since the organic memory described in this embodiment mode can be manufactured with a minuter structure, a memory device or a semiconductor device having large capacity can be obtained. With these structures, a memory element which is superior in switching properties and has low driving voltage and high productivity can be provided.

Embodiment Mode 2

In Embodiment Mode 2, an example of a structure of a memory circuit including an organic compound layer in a memory element portion (hereinafter also referred to as an organic memory) will be described with reference to drawings. Specifically, a case where the structure of the memory circuit is a passive type will be described.

Figure 3A:
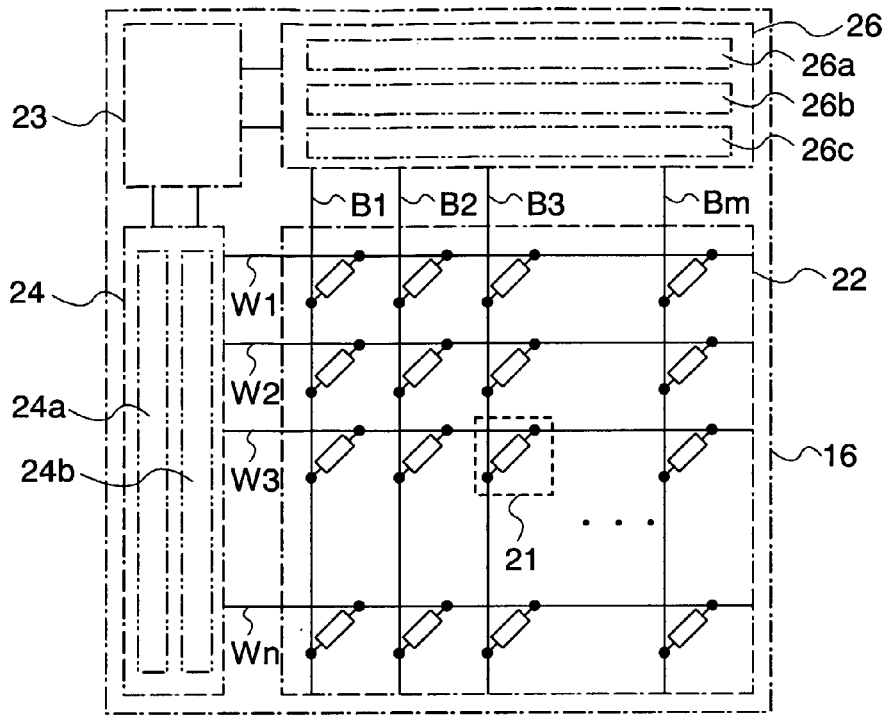
FIGS. 3A and 3B show one example of a structure of a manufacturing method of a semiconductor device according to the invention.

FIG. 3A shows an example of a structure of a semiconductor device according to the invention. The semiconductor device includes a memory cell array 22 in which memory cells 21 are arranged in matrix; a bit line driver circuit 26 including a column decoder 26a, a readout circuit 26b, and a selector 26c; a, word line driver circuit 24 including a row decoder 24a and a level shifter 24b; and an interface 23 having a writing circuit or the like, which communicates with the outside. Note that the structure of the memory circuit 16 shown here is only an example; accordingly, the memory circuit 16 may include another circuit such as a sense amplifier, an output circuit, a buffer, or the writing circuit provided on the bit line driver circuit.

The memory cell 21 includes a first conductive layer which forms a word line Wy ($1 \leq y \leq n$), a second conductive layer which forms a bit line Bx ($1 \leq x \leq m$), and an organic compound layer. The organic compound layer is a single layer or a stacked layer provided between the first conductive layer and the second conductive layer.

Figure 3B:
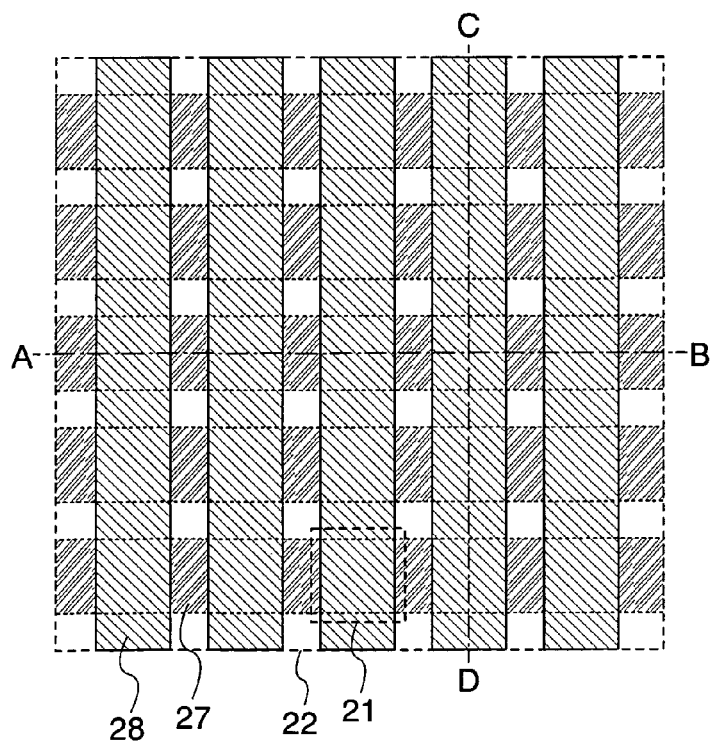

FIG. 3B shows an example of a planar structure of the memory cell array 22.

The memory cell array 22 includes a first conductive layer 27 which extends in a first direction, an organic compound layer provided to cover the first conductive layer 27, and a second conductive layer 28 which extends in a second direction that is perpendicular to the first direction. The organic compound layer is provided between the first conductive layer 27 and the second conductive layer 28. The first conductive layer 27 serves as the word line Wy and the second conductive layer 28 serves as the bit line Bx.

Next, a manufacturing method of an organic memory having the above structure will be described with reference to FIGS. 4A to 4D. FIGS. 4A to 4D show an example of a cross-sectional structure, which is taken along line A-B of the memory cell array 22 in FIG. 3B.

Figure 4A:
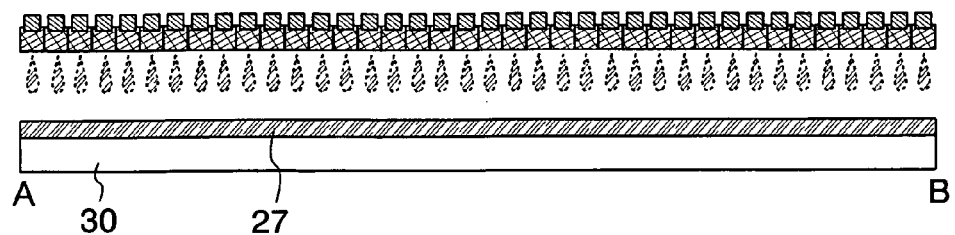
FIGS. 4A to 4D show one example of a structure of a semiconductor device according to the invention.

First, a first conductive layer 27 is formed by selectively discharging a conductive composition onto a substrate 30 (FIG. 4A). The first conductive layer 27 may be formed by a vapor-deposition method, a sputtering method, a CVD method, a spin coating method, or a printing method such as screen printing or gravure printing without limiting to a droplet discharge method.

Figure 4B:
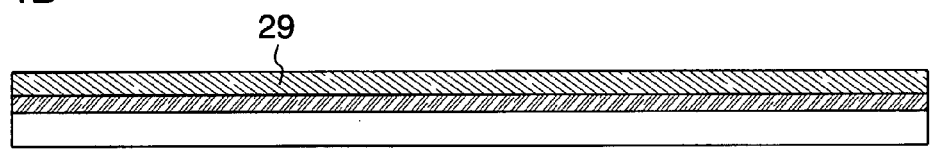

Next, an organic compound layer 29 is formed to cover the first conductive layer 27 (FIG. 4B). The organic compound layer 29 can be formed by a droplet discharge method, a printing method, or a spin coating method. Using such a method, the operation efficiency can be improved.

Figure 4C:
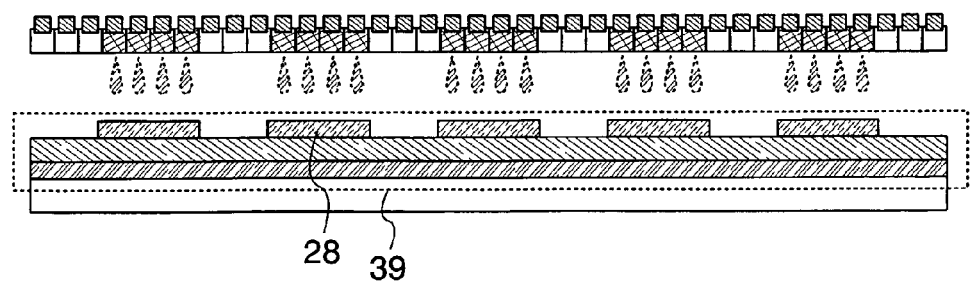

Next, a second conductive layer 28 is formed by selectively discharging a conductive composition onto an organic compound layer 29 (FIG. 4C). Further, the second conductive layer 28 can be formed by another method similarly to the case of the first conductive layer 27. The second conductive layer 28 may be formed by a method different from that of the first conductive layer 27. Thus, a memory element portion 39 is formed from a stack structure of the first conductive layer 27, the organic compound layer 29, and the second conductive layer 28.

Figure 4D:
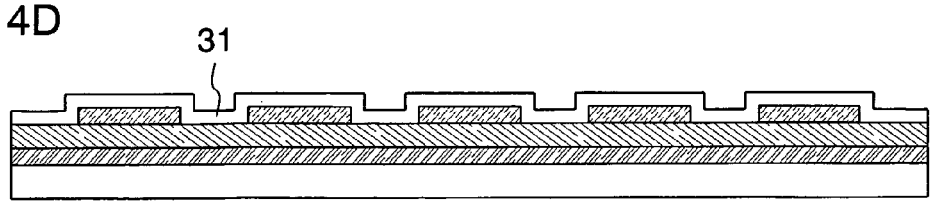

Next, an insulating layer 31 serving as a protective film is provided to cover the second conductive layer 28 (FIG. 4D).

Through the above steps, a passive matrix semiconductor device including a memory circuit can be formed. Next, a material or the like used in each step mentioned above will be specifically described below.

As the substrate 30, for example, a glass substrate such as barium borosilicate glass or aluminoborosilicate glass, a quartz substrate, a ceramic substrate, or the like can be used. Further, a metal substrate containing stainless steel or a semiconductor substrate on which an insulating layer is formed may be used as well. Although a substrate made of a flexible synthetic resin such as plastic, for example PET, generally tends to have lower heat-resistance temperature, compared to that of the above-mentioned substrate, it can be used as long as it can withstand process temperature in the manufacturing process. A surface of the substrate 30 may be planarized in advance by polishing such as a CMP method.

Further, as the first conductive layer 27 and the second conductive layer 28, a single layer or a stack structure of an element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), or tantalum (Ta) or an alloy containing a plurality of the elements can be used. As the alloy containing a plurality of the elements, for example, an alloy containing Al, Ti, and C, an alloy containing Al and Ni, an alloy containing Al and C, an alloy containing Al, Ni, and C, an alloy containing Al and Mo, or the like can be used.

Alternatively, a known conductive polymer of which conductivity is improved by doping or the like can be used, such as conductive polyaniline, conductive polypyrrole, conductive polythiophen, or a complex of polyethylene dioxythiophene (PEDOT) and polystyrenesulphonic (PSS). In addition, a transparent conductive material may also be used instead. As the transparent conductive material, indium tin oxide (ITO), zinc oxide (ZnO), indium zinc oxide (IZO), zinc oxide in which gallium is added (GZO), or the like or another light-transmitting conductive oxide material can be used. ITO, indium tin oxide containing silicon oxide, or a material in which 2 to 20 wt % of zinc oxide (ZnO) is mixed into indium oxide containing silicon oxide may be used instead. The above material can be provided by a droplet discharge, method, a vapor-deposition method, a sputtering method, a CVD method, a spin coating method, or a printing method such as screen printing or gravure printing. For example, Ag can be formed by a droplet discharge method, or Al can be formed by a vapor-deposition method.

The organic compound layer 29 is provided to have a single layer structure or a stack structure of a layer containing a high molecular material including an amide group in a side chain. Specifically, favorable examples thereof are polyacrylamide and a derivative thereof, polymethacrylamide and a derivative thereof, and polypropargylamide and a derivative thereof. A high molecule in which tacticity of a main chain is highly controlled is a particularly favorable example. For example, in the polyacrylamide derivative or the polymethacrylamide derivative, tacticity of a main chain (syndiotactic, heterotactic, isotactic) is preferably controlled at 90% or more. These materials can be formed by a spin coating method, a droplet discharge method, a printing method, or the like.

As the insulating layer 31, a single-layer structure or a stack structure of an inorganic material or the like containing oxygen or nitrogen can be used, such as silicon oxide ($SiO_x$), silicon nitride ($SiN_x$), silicon oxynitride ($SiO_xN_y$) (x>y), or silicon nitride oxide ($SiN_xO_y$) (x>y). Alternatively, an organic material or the like such as polyimide, polyamide, polyvinylphenol, benzocyclobutene, acrylic, epoxy, or siloxane may be used in the single-layer structure or the stack structure. A stack of an organic material and an inorganic material may be provided instead.

As described above, in this embodiment mode, since a high molecular material including an amide group in a side chain can be provided as an organic compound layer of a memory element portion by a droplet discharge method, a printing method, or a spin coating method, an inexpensive memory device or a semiconductor device can be manufactured simply. Further, since the organic memory described in this embodiment mode can be manufactured with a minuter structure, a memory device or a semiconductor device having large capacity can be obtained.

Note that the structure shown in FIGS. 4A to 4D is only an example, and the invention is not limited to this structure.

Embodiment Mode 3

In Embodiment Mode 3, a semiconductor device having a different structure from that in Embodiment Mode 2 will be described. Specifically, a case where the structure of the memory circuit is an active matrix type will be described.

Figure 5A:
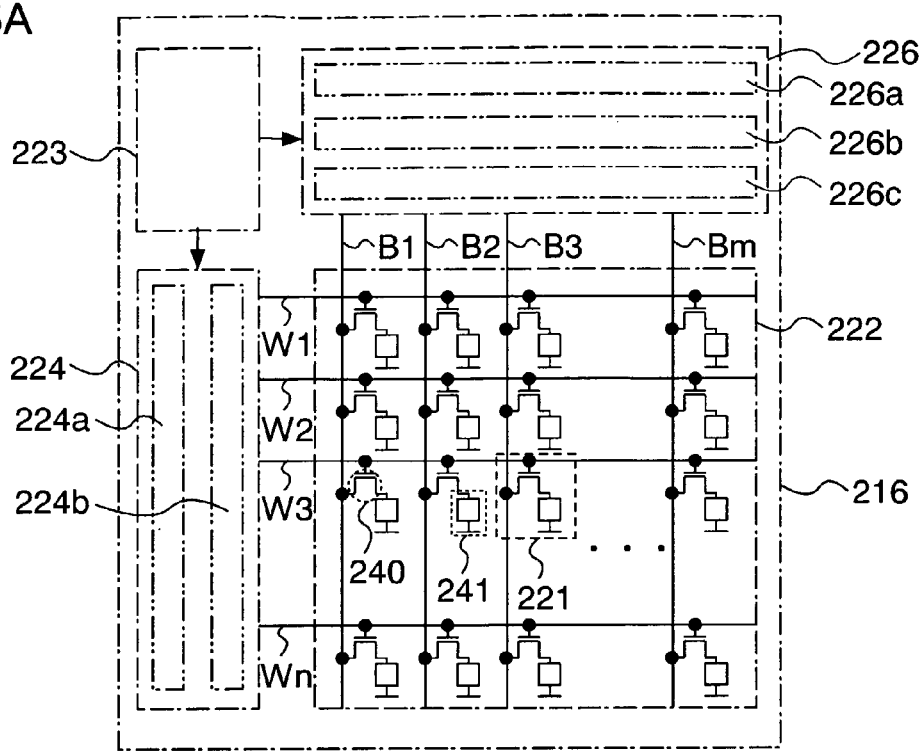
FIGS. 5A and 5B show one example of a structure of a semiconductor device according to the invention.

FIG. 5A shows an example of a structure of an organic memory according to this embodiment mode. The organic memory includes a memory cell array 222 in which memory cells 221 are arranged in matrix; a bit line driver circuit 226 including a column decoder 226a, a readout circuit 226b, and a selector 226c; a word line driver circuit 224 including a row decoder 224a and a level shifter 224b; and an interface 223 having a writing circuit or the like, which communicates with the outside. Note that the structure of the memory circuit 216 shown here is only an example; accordingly, the memory circuit 216 may include another circuit such as a sense amplifier, an output circuit, a buffer, or the writing circuit provided on the bit line driver circuit.

The memory cell 221 includes a first wire 231 which forms a word line Wy ($1 \leq y \leq n$), a second wire 232 which forms a bit line Bx ($1 \leq x \leq m$), a transistor 240, and a memory element portion 241. The memory element portion 241 has a structure in which an organic compound layer is interposed between a pair of conductive layers.

Figure 5B:
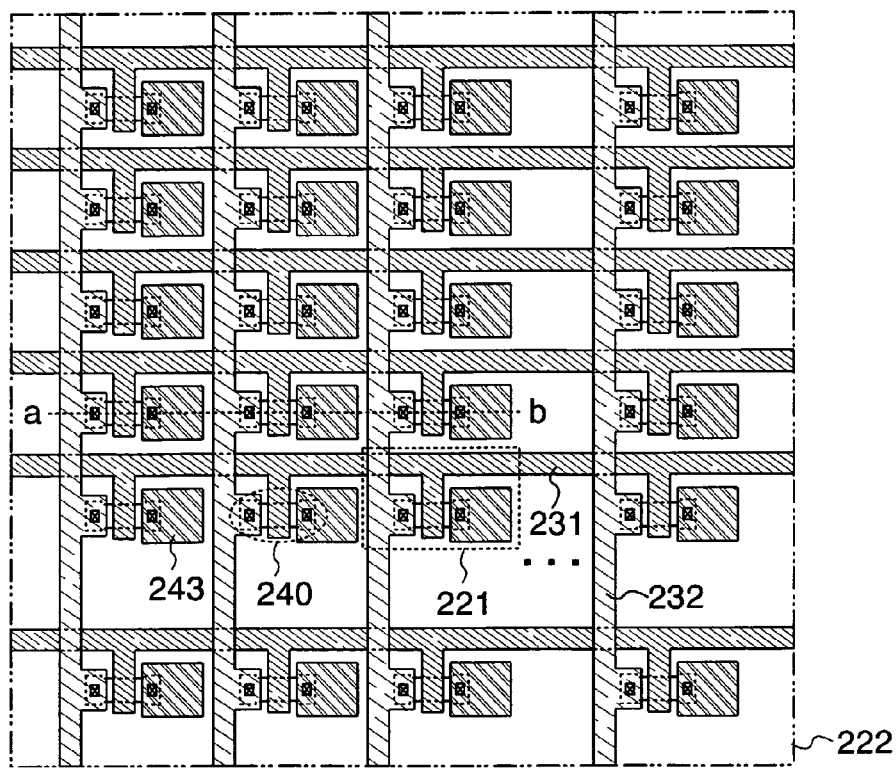

FIG. 5B shows an example of a planar structure of the memory cell array 222.

In the memory cell array 222, a first wire 231 extending in a first direction and a second wire 232 extending in a second direction which is perpendicular to the first direction are arranged in matrix. Further, the first wire is connected to the source electrode or drain electrode of the transistor 240, and the second wire is connected to the gate electrode of the transistor 240. Furthermore, the other one of the source and the drain electrodes of the transistor 240, which is not connected to the first wire, is connected to a first conductive layer 243. The memory element portion is provided with a stack structure of the first conductive layer 243, the organic compound layer, and a second conductive layer.

Next, a manufacturing method of an organic memory having the above structure will be explained with reference to FIGS. 6A to 6E. FIGS. 6A to 6E show cross-sectional views of the memory cell array 222 taken along line a-b shown in FIG. 5B, and cross-sectional views of a CMOS circuit included in the bit line driver circuit 226.

Figure 6A:
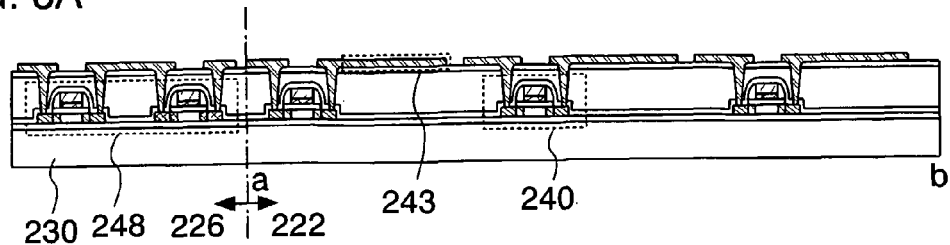
FIGS. 6A to 6E show one example of a structure of a manufacturing method of a semiconductor device according to the invention.

First, a plurality of transistors 240 each of which serves as a switching element of a memory element portion and a transistor 248 partially constituting a CMOS circuit which is included in a bit line driver circuit 226 are formed over a substrate 230. Subsequently, a source electrode and a drain electrode are formed so as to be connected to the source region and the drain region of the transistors 240, respectively (FIG. 6A). Here, one of the source and the drain electrodes of the transistor 240 serves as the first conductive layer 243. Further, in the case of using different materials for the first conductive layer 243 and the source electrode or the drain electrode, after the source electrode or the drain electrode is formed, the first conductive layer 243 may be separately formed. The first conductive layer can be formed by a vapor-deposition method, a sputtering method, a CVD method, a droplet discharge method, a spin coating method, or a printing method such as screen printing or gravure printing.

Figure 6B:
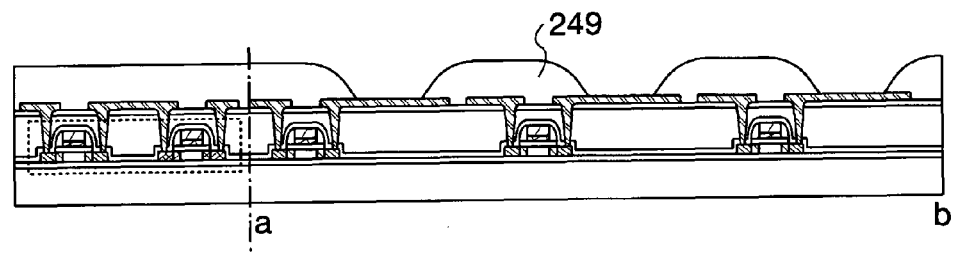

Next, an insulating layer 249 serving as a protective film is formed to cover an edge portion of the first conductive layer 243 (FIG. 6B). The insulating layer 249 can be formed by a droplet discharge method, a printing method, or a spin coating method.

Figure 6C:
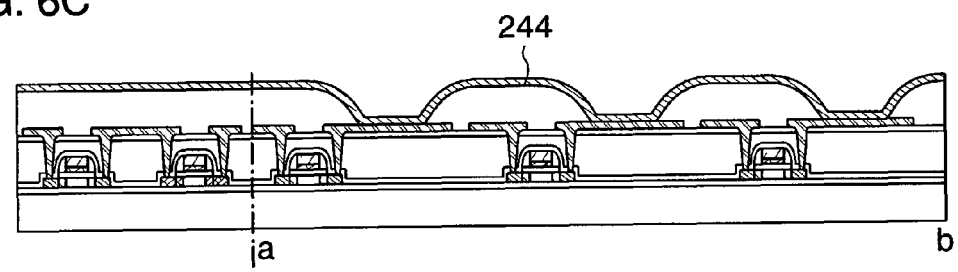

Subsequently, an organic compound layer 244 is formed over the first conductive layer 243 (FIG. 6C). Note that the organic compound layer 244 may be formed over an entire surface as shown in FIG. 6C, or may be selectively formed so as to be provided separately from the organic compound layers in other memory cells. The organic compound layer 244 can be formed by a droplet discharge method, a printing method, a spin coating method, or the like. In the case of providing the organic compound layer 244 over the entire surface above the substrate 230 as shown in FIG. 6C, a droplet discharge method, a printing method, a spin coating method, or the like can be used; however, the operation efficiency can be improved particularly when using a spin coating method. Meanwhile, in the case of selectively providing the organic compound layer 244 only over a portion of the memory cell array 222, the efficiency in the use of the material can be improved by using a droplet discharge method or a printing method.

Further, even in the case of using a spin coating method, the organic compound layer can be selectively formed by providing a mask in advance over a portion except the memory cell array 222, or by forming it over the entire surface and using a photolithography step or the like thereafter. A method to be employed may be determined appropriately by the practitioner.

Figure 6D:
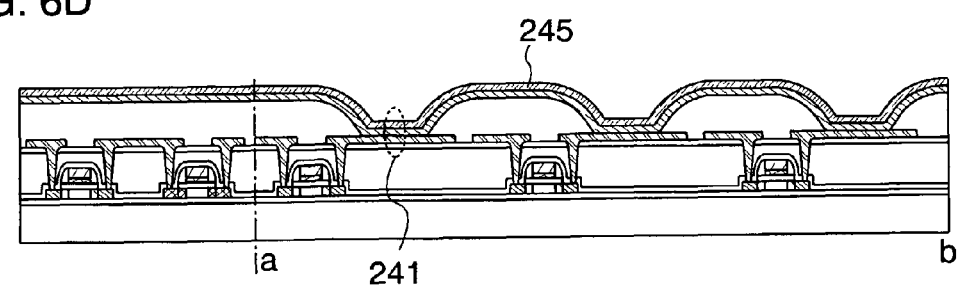

Next, a second conductive layer 245 is formed over the organic compound layer 244 (FIG. 6D). The second conductive layer 245 can be formed by a vapor-deposition Method, a sputtering method, a CVD method, a droplet discharge method, a spin coating method, or a printing method such as screen printing or gravure printing similarly to the first conductive layer. The first conductive layer 243 and the second conductive layer 245 may be formed by different methods. Thus, the memory element portion 241 having a stack structure of the first conductive layer 243, the organic compound layer 244, and the second conductive layer 245 is formed.

Figure 6E:
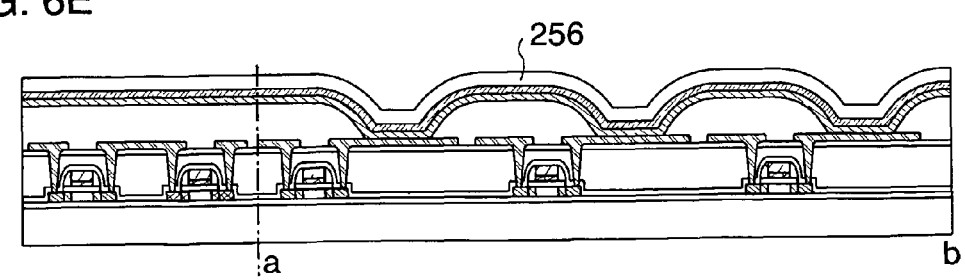

Next, an insulating layer 256 serving as a protective film is provided to cover the second conductive layer 245 (FIG. 6E). The insulating layer 256 can be formed to have a single layer or a stack structure by a droplet discharge method, a printing method, a spin coating method, or the like.

Through the above process, a semiconductor device having an active matrix memory circuit can be formed. Next, materials used in each step above will be specifically described.

As the substrate 230, for example, a glass substrate such as barium borosilicate glass or aluminoborosilicate glass, a quartz substrate, a ceramic substrate, or the like can be used. Further, a metal substrate containing stainless steel or a semiconductor substrate on which an insulating layer is formed may be used. Although a substrate made of a flexible synthetic resin such as plastic, for example PET, generally tends to have lower heat-resistance temperature, compared to that of the above-mentioned substrate, it can be used as long as it can withstand process temperature in the manufacturing process. Note that a surface of the substrate 230 may be planarized in advance by polishing such as a CMP method.

The transistors 240 may have any structure as long as it can function as a switching element. For example, a thin film transistor (TFT) may be formed over a substrate such as a glass substrate or a flexible substrate. Alternatively, a semiconductor substrate of Si or the like, or an SOI substrate may be used and a field effect transistor (FET) using the substrate as a channel portion may be formed. Further alternatively, an organic transistor using an organic compound for a semiconductor layer may be formed. Although the example of providing a planar thin film transistor over a substrate having insulating properties is shown in FIGS. 5A and 5B, a transistor having a structure such as a staggered type or an inversely staggered type can be formed.

A semiconductor layer included in the transistor 240 or the transistor 248 may also have any structure; for example, an impurity region (including a source region, a drain region, a GOLD region, and an LDD region) can be formed. Any of a p-channel type only, an n-channel type only, or a CMOS type may be used. Further, an insulating layer (sidewall) may be provided so as to be in contact with a side surface of the gate electrode, or a silicide layer may be formed in either or both of the source or drain region and the gate electrode. As a material of the silicide layer, nickel, tungsten, molybdenum, cobalt, platinum, or the like can be used.

As a material of the first conductive layer 243 or the second conductive layer 245, a single layer or a stack structure of an element selected from gold (Au), silver (Ag), platinum (Pt), nickel (Ni), tungsten (W), chromium (Cr), molybdenum (Mo), iron (Fe), cobalt (Co), copper (Cu), palladium (Pd), carbon (C), aluminum (Al), manganese (Mn), titanium (Ti), or tantalum (Ta) or an alloy containing a plurality of the elements can be used. As the alloy containing a plurality of the elements, for example, an alloy containing Al, Ti, and C, an alloy containing Al and Ni, an alloy containing Al and C, an alloy containing Al, Ni, and C, an alloy containing Al and Mo, or the like can be used.

Alternatively, a known conductive polymer of which conductivity is improved by doping or the like can be used, such as conductive polyaniline, conductive polypyrrole, conductive polythiophen, or a complex of polyethylene dioxythiophene (PEDOT) and polystyrenesulphonic (PSS). A light-transmitting conductive material may also be used instead. As the light-transmitting conductive material, indium tin oxide (ITO), zinc oxide (ZnO), indium zinc oxide (IZO), zinc oxide in which gallium is added (GZO), or the like or another light-transmitting conductive oxide material can be used. ITO, indium tin oxide containing silicon oxide (hereinafter referred to as ITSO), or a material in which 2 to 20 wt % of zinc oxide (ZnO) is further mixed into indium oxide containing silicon oxide may be used instead. The above-described material can be provided by a droplet discharge method, a vapor-deposition method, a sputtering method, a CVD method, a spin coating method, or a printing method such as screen printing or gravure printing. For example, Ag can be provided by a droplet discharge method, or Al can be provided by a vapor-deposition method.

For the organic compound layer 244, the same material and the same manufacturing method as those for the organic compound layer 29 described in Embodiment Mode 1 can be used. For example, polyacrylic amide can be formed as the organic compound layer over ITO or indium tin oxide containing silicon oxide, and Ag or the like can be formed thereover by a droplet discharge method so as to form a memory element portion. Further, poly(N-methylacrylic amide), poly(N-ethylacrylic amide), poly(N-methylmethacrylic amide), or the like may be used instead of polyacrylic amide.

As the insulating layers 249 and 256, a single layer or a stack of an inorganic material containing oxygen or nitrogen, such as silicon oxide ($SiO_x$), silicon nitride (SiNO, silicon oxynitride ($SiO_xN_y$) (x>y), or silicon nitride oxide ($SiN_xO_y$) (x>y), an organic material such as polyimide, polyamide, polyvinylphenol, benzocyclobutene, acrylic, epoxy, or siloxane, or the like can be used. In addition, a stack of an inorganic material and an organic material may be used. The material of polyimide, polyamide, polyvinylphenol, benzocyclobutene, acrylic, epoxy, siloxane, or the like can be efficiently provided by a droplet discharge method, a printing method, or a spin coating method.

Further, in the above structure, a rectifying element may be provided between the first conductive layer 243 and the organic compound layer 244 or between the organic compound layer 244 and the second conductive layer 245. As the rectifying element, a diode in which the gate electrode and the drain electrode are connected can be provided. For example, a PN junction diode which is formed by stacking an n-type semiconductor layer and a p-type semiconductor layer can be used. By providing the rectifying diode as described above, current flows in only one direction. Accordingly, errors are reduced, and readout margin is improved. Note that in the case of providing a diode, a diode having another structure such as a PIN junction diode or an avalanche diode may also be used instead of using the PN junction diode.

Figure 7A:
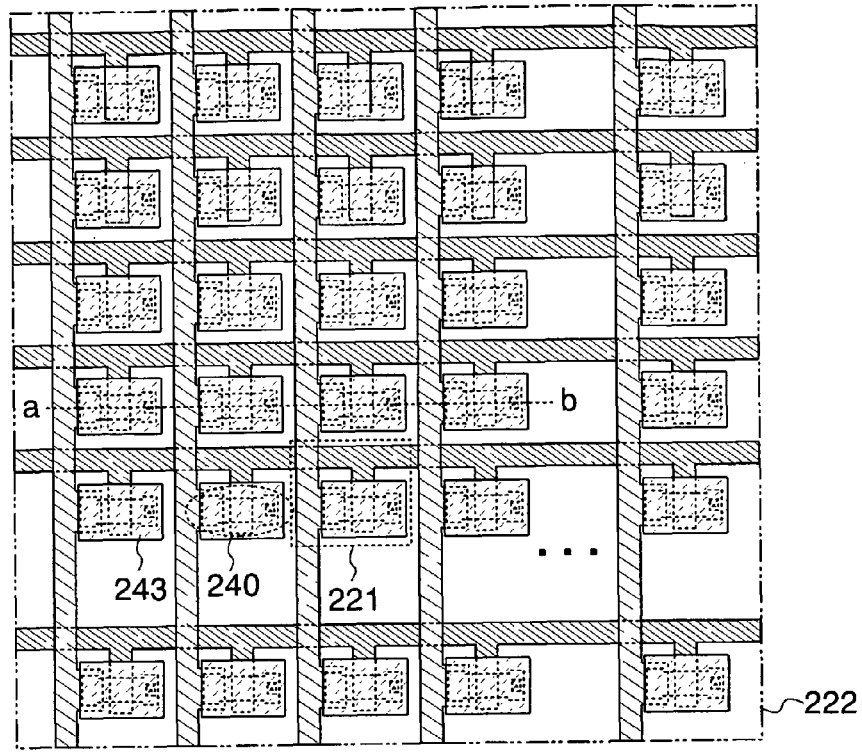
FIGS. 7A to 7C show examples of a structure of a semiconductor device according to the invention.
Figure 7B:
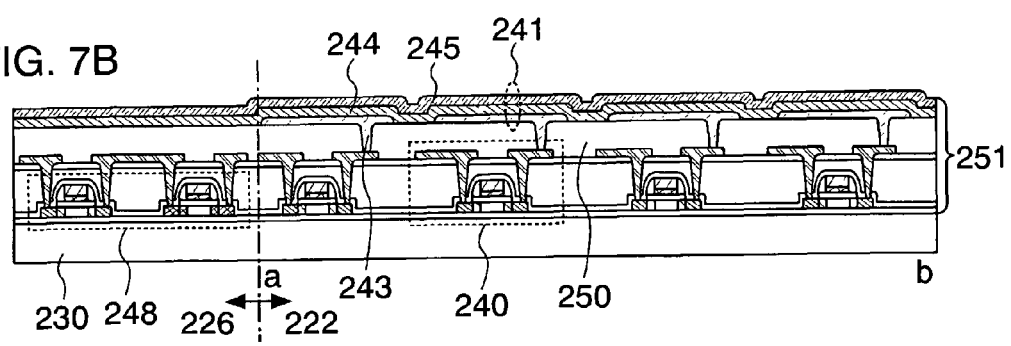
Figure 7C:
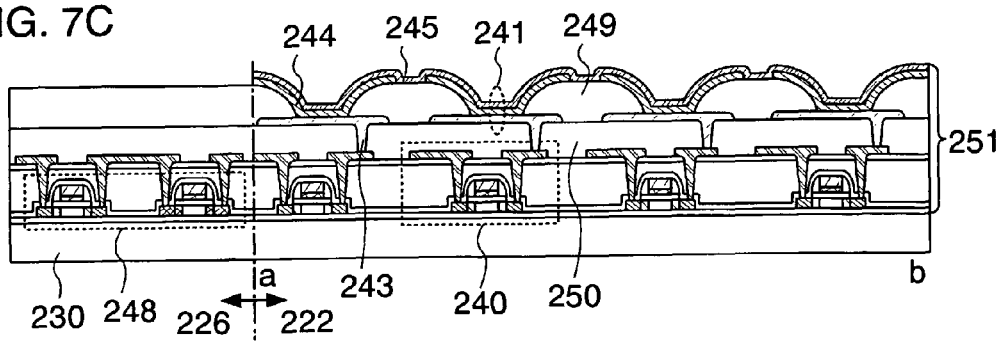

A different structure from that in the above structure can be employed in this embodiment mode. For example, an insulating layer 250 is provided so as to cover a source electrode and a drain electrode of the transistor 240, and a first conductive layer 243 can be provided over the insulating layer 250 (FIGS. 7A to 7C). In this case, the organic compound layer 244 can be formed over the entire surface to cover the first conductive layer 243 by a spin coating method (FIG. 7B). Further, when disconnection of the organic compound layer 244 or effect of electric field in lateral directions between adjacent memory cells is concerned, an insulating layer 249 may be provided to separately form the organic compound layers in each memory cell (FIG. 7C). Note that FIG. 7C shows the case where the organic compound layers 244 are provided selectively in each memory cell by a droplet discharge method, a printing method, or the like; however, the organic compound layer 244 may be provided over the entire surface as shown in FIG. 6C.

In such a structure where the insulating layer 250 is provided and a memory element portion is formed, the first conductive layer can be provided more freely. In other words, in the structure of FIGS. 6A to 6E, the memory element portion 241 is necessarily provided in a region other than the source electrode or the drain electrode of the transistor 240; however, by employing the above structure, for example, the memory element portion 241 can be formed above the transistors 240 in an element formation layer 251. Consequently, higher integration of the memory cell array 222 can be achieved (FIG. 7A).

Further, as another structure different from the above structure, a first conductive layer and a second conductive layer can be arranged in one layer to form a memory element portion. An example of the structure in this case will be explained with reference to FIGS. 16A to 16C.

Figure 16A:
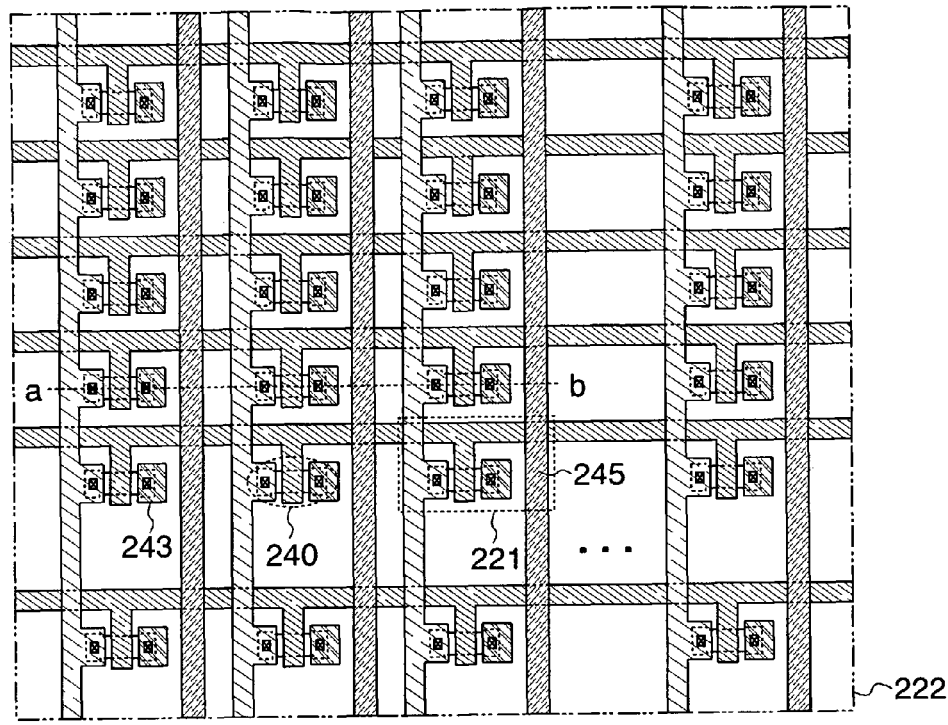
FIGS. 16A to 16C show examples of a structure of a semiconductor device according to the invention.
Figure 16B:
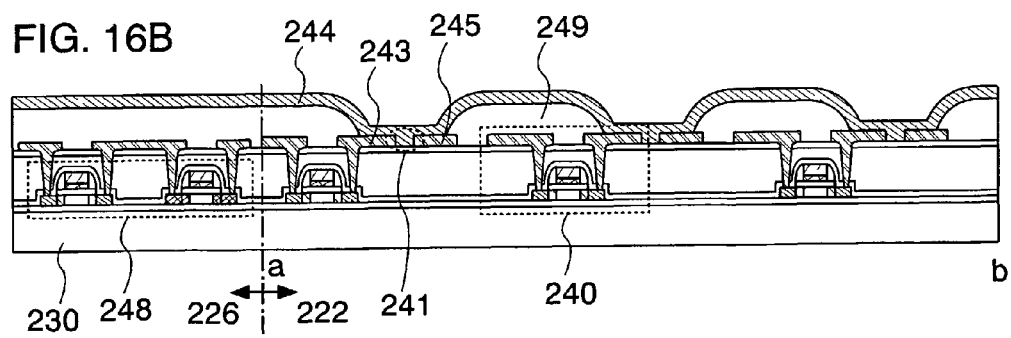

In FIGS. 6A to 7C, the memory element portion is formed with a stack in which the organic compound layer 244 is interposed between the first conductive layer 243 and the second conductive layer 245. Here, the first conductive layer 243 and the second conductive layer 245 are provided in the same layer to laterally interpose the organic compound layer 244, thereby forming the memory element portion (FIGS. 16A and 16B). In this case, the first conductive layer 243 has a function of a source or drain electrode of a transistor 240, and the second conductive layer 245 is also formed in the same layer as the source or drain electrode. When the first conductive layer 243 and the second conductive layer 245 can be formed by using the same material, the first conductive layer 243 and the second conductive layer 245 can be formed concurrently; thus, the number of manufacturing steps can be reduced. Here, an example of providing the organic compound layer 244 over the entire surface by a spin coating method, a droplet discharge method, a printing method, or the like is shown; however, the structure is not limited thereto, and the organic compound layer 244 can be selectively formed by a droplet discharge method, a printing method, a spin coating method using a mask, or the like.

Figure 16C:
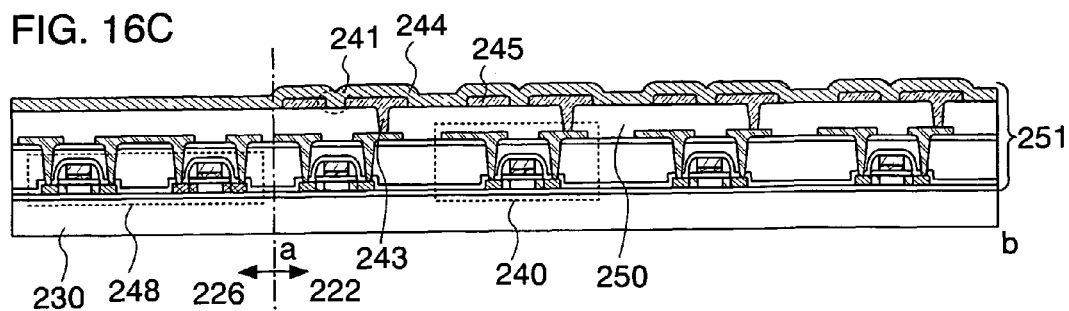

The insulating layer 250 serving as a protective film can be provided so as to cover the source electrode and the drain electrode of the transistor 240, and the first conductive layer 243 and the second conductive layer 245 can be provided over the insulating layer 250 (FIG. 16C). This structure is effective in the case of forming source and drain electrodes and the first conductive layer 243 with different materials, for example, in the case of providing the first conductive layer 243 with a light-transmitting material such as ITO. Further, by forming the insulating layers 250 in forming a memory element portion, the first conductive layer and the second conductive layer can be provided freely; accordingly, a more highly integrated memory element portion can be provided. Also in this case, when the first conductive layer 243 and the second conductive layer 245 are concurrently formed with the same material, the number of manufacturing steps can be reduced.

Note that, in the structure of FIGS. 16A to 16C, the first conductive layer 243 and the second conductive layer 245 are not necessarily provided in the same layer. For example, in the structure of FIG. 16C, the second conductive layer 245 may be formed above the organic compound layer 244, so that the first conductive layer 243 and the second conductive layer 245 are obliquely arranged and connected via the organic compound layer 244. With such a structure, even if a contaminant such as dust exists on the first electrode, effects of the contaminant can be prevented.

This embodiment mode can be freely combined with the above Embodiment Mode 1 or 2.

Embodiment Mode 4

In Embodiment Mode 4, another example of a semiconductor device different from those in Embodiment Mode 2 and 3 will be explained with reference to drawings.

A semiconductor device shown in this embodiment mode is capable of non-contact data reading and writing. Data transmission method is broadly classified into three types, which are an electromagnetic coupling method of communicating by mutual induction with a pair of coils disposed in the opposed position, an electromagnetic induction method of communicating by an inductive electromagnetic field, and an electric wave method of communicating by using electric waves, and any of these methods may be employed. An antenna that is used for transmitting data can be provided in two ways. One way is to provide an antenna over a substrate provided with a plurality of elements and memory elements, and the other way is to provide a terminal portion over a substrate provided with a plurality of elements and memory elements and to connect an antenna provided over another substrate to the terminal portion.

First, an example of a structure of a semiconductor device in the case of providing an antenna over a substrate provided with a plurality of elements and memory elements will be explained with reference to FIGS. 8A and 8B.

Figure 8A:
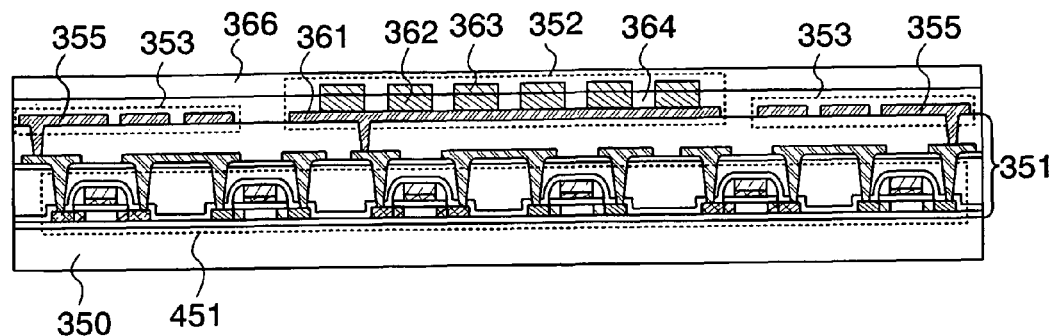
FIGS. 8A and 8B show examples of a structure of a semiconductor device according to the invention.

FIG. 8A shows a semiconductor device including a passive matrix organic memory. An element formation layer 351 including a plurality of transistors 451 is provided over a substrate 350, and a memory element portion 352 and an antenna portion 353 are provided above the element formation layer 351. Note that the case of providing the memory element portion 352 or the antenna portion 353 above the element formation layer 351 is shown here; however, the structure is not limited thereto. The memory element portion 352 and the antenna portion 353 can be provided below the element formation layer 351 or in the same layer.

The memory element portion 352 are provided with a stack of a first conductive layer 361, an organic compound layer 362, and a second conductive layer 363, and an insulating layer 366 which functions as a protective film is provided so as to cover the second conductive layer 363. Here, an insulating layer 364 is provided between memory cells so that an organic compound layer 362 is provided in each memory cell; however, the organic compound layer 362 may be formed over an entire surface so as to cover the first conductive layer 361. Note that the memory element portion 352 can be formed using the material and the method shown in Embodiment Mode 1.

In the memory element portion 352, a rectifying element may be provided between the first conductive layer 361 and the organic compound layer 362 or between the organic compound layer 362 and the second conductive layer 363 as shown in Embodiment Mode 1. The rectifying element can have a structure described in Embodiment Modes 1 to 3.

In an antenna portion 353, a conductive layer 355 which functions as an antenna is provided. Here, the conductive layer 355 is provided in the same layer as the first conductive layer 361, and the same material may be used to form the conductive layer 355 and the first conductive layer 361. The conductive layer 355 may be formed on the insulating layer 364 or the insulating layer 366 as well. When the conductive layer 355 is provided over the insulating layer 364, it can be concurrently formed using the same material as the second conductive layer 363.

As a material of the conductive layer 355, an element selected from gold (Au), platinum (Pt), nickel (Ni), tungsten (W), molybdenum (Mo), cobalt (Co), copper (Cu), aluminum (Al), manganese (Mn), titanium (Ti), or the like or an alloy containing a plurality of the elements can be used. Further, vapor deposition, sputtering, a CVD method, a printing method such as gravure printing or screen printing, a droplet discharge method, or the like can be used to form the conductive layer 355.

The element formation layer 351 includes at least a transistor. Using the transistor, any kind of integrated circuit such as a CPU (central processing unit), a memory, or a microprocessor can be provided. Further, in this embodiment mode, the transistor 451 included in the element formation layer 351 can be a p-channel TFT, an n-channel TFT, or both of a p-channel transistor and an n-channel transistor, which is called a CMOS circuit. Further, any structure may be used for a semiconductor layer included in the transistor 451. For example, an impurity region (including a source region; a drain region, a GOLD region, and an LDD region) may be formed, and a p-channel type or an n-channel type may be employed. An insulating layer (sidewall) may be provided to be in contact with a side surface of the gate electrode, or a silicide layer may be formed in either or both of the source or a drain region and the gate electrode. As a material of the silicide layer, nickel, tungsten, molybdenum, cobalt, platinum, or the like can be used.

The transistor 451 included in the element formation layer 351 may be an organic transistor in which the semiconductor layer of the transistor 451 is formed of an organic material. In this case, the element formation layer 351 having the organic transistor can be formed directly over the substrate 350 that is a flexible substrate such as a plastic substrate by a printing method or a droplet discharge method. Further, in that case, a semiconductor device can be manufactured at low cost by also forming the memory element portion 352 by a printing method or a droplet discharge method as described above.

Figure 8B:
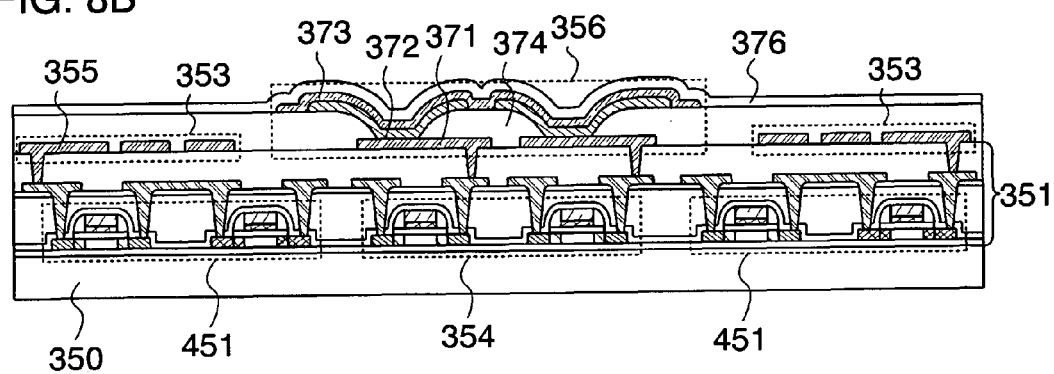

FIG. 8B shows an example of a semiconductor device having an active matrix organic memory. A point in FIG. 8B different from that in FIG. 8A will be described.

As for a semiconductor device shown in FIG. 8B, an element formation layer 351 including transistors 451 and 354 is provided over a substrate 350, and a memory element portion 356 and an antenna portion 353 are provided above the element formation layer 351. Here, the transistor 354 which functions as a switching element of the memory element portion 356 is provided in the same layer as the transistor 451, and the memory element portion 356 and the antenna portion 353 are formed above the element formation layer 351. However, the structure is not limited thereto, and the transistor 354 may be provided above or below the element formation layer 351, or the memory element portion 356 and the antenna portion 353 can be provided below the element formation layer 351 or in the same layer as the element formation layer 351.

The memory element portion 356 has a stack of a first conductive layer 371, an organic compound layer 372, and a second conductive layer 373, and an insulating layer 376 is provided as a protective film so as to cover the second conductive layer 373. Here, an insulating layer 374 is formed to cover an edge portion of the first conductive layer 371, and the organic compound layer 372 is selectively formed in each memory cell; however, the organic compound layer 372 may be formed over an entire surface so as to cover the first conductive layer 371 and the insulating layer 374. The memory element portion 356 can be formed by using the material and the method shown in Embodiment Mode 1. Further, also in the memory element portion 356, a rectifying element may be provided between the first conductive layer 371 and the organic compound layer 372 or between the organic compound layer 372 and the second conductive layer 373, as described above.

The conductive layer 355 provided in the antenna portion 353 may be formed in the same layer as the first conductive layer 371 or over the insulating layer 374 or the insulating layer 376. In the case where the conductive layer 355 is provided in the same layer as the first conductive layer 371 or the second conductive layer 373, the conductive layer 355 can be formed with the same material and in the same step as those in the first conductive layer 371 or the second conductive layer 373.

The transistor 354 provided in the element formation layer 351 functions as a switching element in writing data into the memory element portion 356 or reading data. Therefore, the transistor 354 is preferably formed with either structure of a p-channel TFT or an n-channel TFT. Further, a semiconductor layer included in the transistor 354 may have any structure. For example, an impurity region (including a source region, a drain region, and an LDD region) may be formed, and either a p-channel type or an n-channel type may be used. An insulating layer (sidewall) may be provided to be in contact with a side surface of the gate electrode, or a silicide layer may be formed in either or both of a source or drain region and the gate electrode. As a material of the silicide layer, nickel, tungsten, molybdenum, cobalt, platinum, or the like can be used.

Further, the element formation layer 351, the memory element portion 356, and the antenna portion 353 can be formed by vapor deposition, a sputtering method, a CVD method, a printing method, a droplet discharge method, or the like as described above. In addition, different methods may be used to form different parts. For example, the transistor 451 which requires high-speed operation can be formed by forming a semiconductor layer such as a Si layer, over a substrate and crystallizing it with heat treatment, and thereafter the transistor 354 which functions as a switching element can be provided as an organic transistor above the element formation layer 351 by a printing method or a droplet discharge method.

The memory element portion 356 shown in FIG. 8B has a structure in which the first conductive layer 371 is connected to a source or a drain electrode of the transistor 354 included in the element formation layer 351 with an insulating layer interposed therebetween. However, the first conductive layer 371 may be provided in the same layer as the source or drain electrode of the transistor 354 as shown in FIGS. 16A to 16C. In FIG. 8B, the organic compound layer 372 is selectively provided in each memory cell; however, the organic compound layer may be formed over an entire surface as shown in FIG. 6C. In the case where an organic compound layer is separately provided in each memory cell, a droplet discharge method is preferably used. Meanwhile, in the case where an organic compound layer is provided over the entire surface, a spin coating method is preferably used.

Figure 9A:
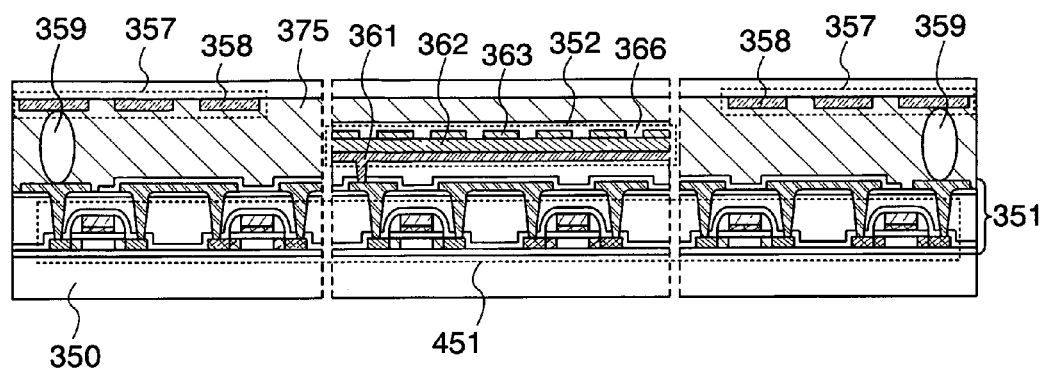
FIGS. 9A and 9B show examples of a structure of a semiconductor device according to the invention.
Figure 9B:
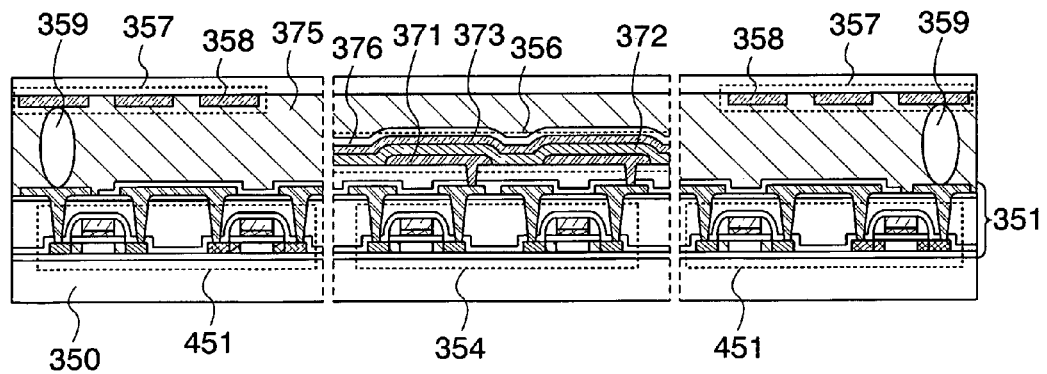

Next, an example of a structure of a semiconductor device in which a terminal portion is provided on a substrate provided with a plurality of elements and memory elements, and an antenna provided on another substrate is connected to the terminal portion will be descried with reference to FIGS. 9A and 9B. Note that a point in FIGS. 9A and 9B different from that in FIGS. 8A and 8B will be explained.

FIG. 9A shows a semiconductor device including a passive matrix organic memory. The element formation layer 351 including a plurality of transistors 451 is provided over a substrate 350, a memory element portion 352 is provided above the element formation layer 351, and an antenna portion 357 provided over the substrate 350 is provided so as to be connected to the transistor 451 of the element formation layer 351. Here, the memory element portion 352 and the antenna portion 357 are provided above the element formation layer 351; however, the structure is not limited thereto. The memory element portion 352 can be provided below the element formation layer 351 or in the same layer as the element formation layer 351, or the antenna portion 357 can be provided below the element formation layer 351.

The memory element portion 352 has a stack of a first conductive layer 361, an organic compound layer 362, and a second conductive layer 363. When disconnection in the organic compound layer 362 or influence of electric field in lateral directions between adjacent memory cells is concerned, an insulating layer may be provided between memory cells to separately form organic compound layers. Note that the memory element portion 352 can be formed by using the material and the manufacturing method shown in Embodiment Mode 1.

The substrate provided with the element formation layer 351 and the memory element portion 352 is attached to the substrate 350 provided with the antenna portion 357 with an adhesive resin 375. The element formation layer 351 and a conductive layer 358 are electrically connected via conductive fine particles 359 contained in the resin 375. Alternatively, the substrate provided with the element formation layer 351 and the memory element portion 352 may be attached to the substrate 350 provided with the antenna portion 357 by a conductive adhesive such as silver paste, copper paste, or carbon paste, or by solder bonding.

FIG. 9B shows a semiconductor device provided with an active matrix organic memory. The element formation layer 351 including transistors 451 and 354 is provided over a substrate 350, a memory element portion 356 is provided above the element formation layer 351, and an antenna portion 357 provided over the substrate 350 is provided so as to be connected to the element formation layer 351. Here, the transistor 354 is provided in the same layer as the transistor 451 in the element formation layer 351, and the antenna portion 357 is provided above the element formation layer 351; however, the structure is not limited thereto. The memory element portion 356 may be provided below the element formation layer 351 or in the same layer as the element formation layer 351, or the antenna portion 357 may be provided below the element formation layer 351.

The memory element portion 356 has a stack of a first conductive layer 371, an organic compound layer 372, and a second conductive layer 373. When influence of electric field in lateral directions between adjacent memory cells is concerned, an insulating layer may be provided between memory cells to separately form organic compound layers. Note that the memory element portion 356 can be formed using the material and the manufacturing method shown in Embodiment Mode 1.

Further, also in FIG. 9B, the substrate provided with the element formation layer 351 and the memory element portion 356 is attached to the substrate provided with the antenna portion 357 with the resin 375 containing the conductive fine particle 359.

Thus, a semiconductor device provided with an organic memory and an antenna can be formed. Further, in this embodiment mode, thin film transistors can be provided as the transistors 354 and 451 over the substrate 350. Alternatively, a semiconductor substrate such as a Si substrate may be used as the substrate 350 and a field effect transistor (FET) using the substrate as a channel portion may be provided. Furthermore, an SOI substrate may be used as the substrate 350, and the transistors 354 and 451 may be fabricated using the substrate. In this case, the SOI substrate can be formed by attaching wafers or by using a method called SIMOX by which an insulating layer is formed inside a Si substrate by implanting oxygen ions into the Si substrate.

This embodiment mode can be freely combined with Embodiment Modes 1 to 3.

Embodiment Mode 5

In Embodiment Mode 5, a manufacturing method of a semiconductor device including a thin film transistor, a memory element, and an antenna according to the invention will be described with reference to drawings.

Figure 17A:
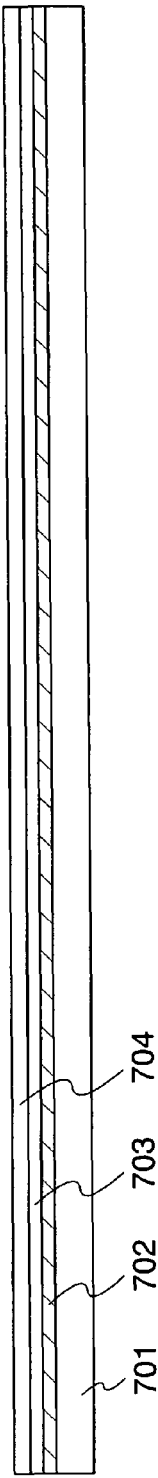
FIGS. 17A to 17C show one example of a structure of a manufacturing method of a semiconductor device according to the invention.

First, a peeling layer 702 is formed over a surface of a substrate 701 (FIG. 17A). The substrate 701 may be a glass substrate, a quartz substrate, a substrate in which an insulating layer is formed over a surface of a metal substrate or a stainless-steel substrate, or a plastic substrate which can withstand the process temperature of the manufacturing process. In the case of using such substrates, the area and the shape thereof are not particularly limited; therefore, by using a rectangular substrate with at least one meter length on a side, the productivity can be drastically improved, for example. This merit is a great advantage, as compared to the case of using a circular silicon substrate. In addition, the peeling layer 702 is formed over an entire surface of the substrate 701 in this process; however, the peeling layer 702 may be selectively provided as necessary by patterning with photolithography after the peeling layer 702 is formed over the entire surface of the substrate 701. It is to be noted that the peeling layer 702 is formed so as to be in contact with the substrate 701; however, an insulating layer may be formed as a base film to be in contact with the substrate 701 as necessary and the peeling layer 702 may be formed to be in contact with the insulating layer.

The peeling layer 702 is formed with a single layer or a stack of a film using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir), or silicon (Si) or an alloy material or a compound material containing the above described element as its main component by using a known means (a sputtering method, a plasma CVD method, or the like). The crystal structure of the layer containing silicon may be any of amorphous, microcrystal, or polycrystalline structure.

In the case where the peeling layer 702 has a single-layer structure, a tungsten layer, a molybdenum layer, or a layer containing a mixture of tungsten and molybdenum may be formed, for example. Alternatively, a layer containing oxide or oxynitride of tungsten, a layer containing oxide or oxynitride of molybdenum, or a layer containing oxide or oxynitride of a mixture of tungsten and molybdenum may be formed. It is to be noted that the mixture of tungsten and molybdenum is an alloy of tungsten and molybdenum. Further, the oxide of tungsten can be referred to as tungsten oxide.

In the case where the peeling layer 702 has a stack structure, a tungsten layer, a molybdenum layer, or a layer containing a mixture of tungsten and molybdenum may be formed as a first layer. A layer containing oxide, nitride, oxynitride, or nitride oxide of tungsten, a layer containing oxide, nitride, oxynitride, or nitride oxide of molybdenum, or a layer containing oxide, nitride, oxynitride, or nitride oxide of a mixture of tungsten and molybdenum may be formed as a second layer.

When a stack of a layer containing tungsten and a layer containing oxide of tungsten is formed as the peeling layer 702, the layer containing tungsten is formed and a layer containing silicon oxide may be formed thereover so that the layer containing oxide of tungsten is formed at an interface between the tungsten layer and the silicon oxide layer. This also applies to the case of forming a layer containing nitride, oxynitride, and nitride oxide of tungsten. In this case, after a layer containing tungsten is formed, a silicon nitride layer, a silicon oxynitride layer; a silicon nitride oxide layer may be formed thereover. The tungsten oxide is denoted by $WO_x$ and X is in the range of 2 to 3; there are $WO_2$ in the case where X is 2, $W_2O_5$ in the case where X is 2.5, $W_4O_{11}$ in the case where X is 2.75, $WO_3$ in the case where X is 3, and the like. In forming an oxide of tungsten, the above value of X is not particularly limited, and composition can be determined based on an etching rate or the like. The layer containing tungsten oxide ($WO_x$, $0<x<3$) which is formed by a sputtering method in an oxygen atmosphere is most preferable to obtain a preferable etching rate. Therefore, in order to reduce manufacturing time, the peeling layer is preferably formed with a layer containing tungsten oxide by a sputtering method in an oxygen atmosphere.

Next, an insulating layer 703 to be a base is formed to cover the peeling layer 702. The insulating layer 703 is formed with a single layer or a stack layer of a layer containing oxide of silicon or nitride of silicon by a known means (a sputtering method, a plasma CVD method, or the like). Oxide of silicon is a material containing silicon (Si) and oxygen (O), such as silicon oxide, silicon oxynitride, or silicon nitride oxide. Nitride of silicon is a material containing silicon and nitrogen (N), such as silicon nitride, silicon oxynitride, or silicon nitride oxide. In the case where the insulating layer to be a base has a two-layer structure, a silicon nitride oxide layer may be formed as a first layer, and a silicon oxynitride layer may be formed as a second layer, for example. In the case where the insulating layer to be a base has a three-layer structure, a silicon oxide layer, a silicon nitride oxide layer, and a silicon oxynitride layer may be formed as a first insulating layer, a second insulating layer, and a third insulating layer, respectively. Alternatively, a silicon oxynitride layer, a silicon nitride oxide layer, and a silicon oxynitride layer may be formed as a first insulating layer, a second insulating layer, and a third insulating layer, respectively. The insulating layer to be a base functions as a blocking film for preventing impurities from entering from the substrate 701.

Figure 17B:
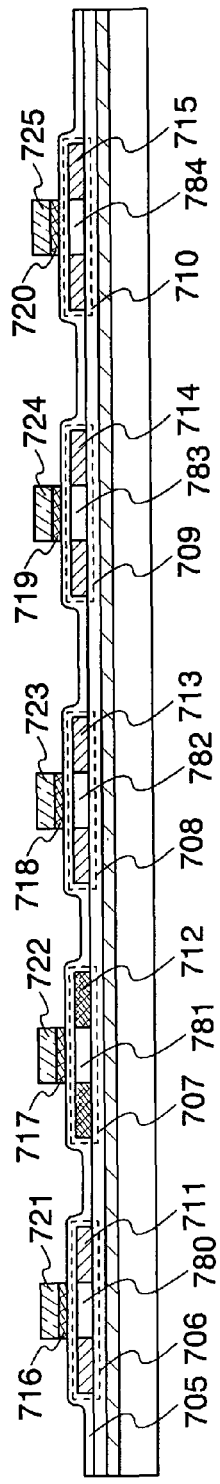

Subsequently, an amorphous semiconductor layer 704 (for example, a layer containing amorphous silicon) is formed over the insulating layer 703. The amorphous semiconductor layer 704 is formed to have a thickness of 25 nm to 200 nm (preferably 30 nm to 150 nm) by a known means (a sputtering method, an LPCVD method, a plasma CVD method, or the like). Then, the amorphous semiconductor layer 704 is crystallized by a known crystallization method (a laser crystallization method, a thermal crystallization method using an RTA or an annealing furnace, a thermal crystallization method using a metal element for promoting crystallization, a method in which the laser crystallization method is combined with the thermal crystallization method using a metal element for promoting crystallization, or the like) to form a crystalline semiconductor layer. The obtained crystalline semiconductor layer is then etched into a desired shape, thereby crystalline semiconductor layers 706 to 710 are formed (FIG. 17B).

An example of formation process of the crystalline semiconductor layers 706 to 710 will be described briefly as follows. First, an amorphous semiconductor layer is formed to have a thickness of 66 nm by a plasma CVD method. Next, a solution containing nickel that is a metal element for promoting crystallization is applied onto the amorphous semiconductor layer, and dehydrogenation treatment (at 500° C., for 1 hour) and thermal crystallization treatment (at 550° C., for 4 hours) are performed to the amorphous semiconductor layer, thereby a crystalline semiconductor layer is formed. After that, the crystalline semiconductor layer is irradiated with laser light as needed, and etching treatment with photolithography is performed to form the crystalline semiconductor layers 706 to 710. In the case where the laser crystallization method is employed for forming the crystalline semiconductor layer, continuous wave or pulsed gas laser or solid-state laser may be used. As the gas laser, excimer laser, YAG laser, $YVO_4$ laser, YLF laser, $YAlO_3$ laser, glass laser, ruby laser, Ti:sapphire laser, or the like may be used. As the solid-state laser, laser using a crystal such as YAG, $YVO_4$, YLF, or $YAlO_3$ doped with Cr, Nd, Er, Ho, Ce, Co, Ti, or Tm may be used.

In addition, the crystallization of the amorphous semiconductor layer by using the metal element for promoting crystallization, is advantageous because the crystallization can be performed at low temperature in short time and the direction of crystals becomes uniform. Meanwhile, there is also a problem that the characteristics are not stable because the off-state current is increased due to a residue of the metal element in the crystalline semiconductor layer. Therefore, it is preferable to form an amorphous semiconductor layer as a gettering site over the crystalline semiconductor layer. The amorphous semiconductor layer to be a gettering site is required to contain an impurity element such as phosphorous or argon; accordingly, it is preferably formed by a sputtering method by which argon can be contained at high concentration. Subsequently, heat treatment (an RTA method, thermal annealing using an annealing furnace, or the like) is performed to diffuse the metal element into the amorphous semiconductor layer, and the amorphous semiconductor layer containing the metal element is removed. In this manner, the content of the metal element in the crystalline semiconductor layer can be reduced or eliminated.

Then, a gate insulating layer 705 is formed to cover the crystalline semiconductor layers 706 to 710. The gate insulating layer 705 is formed with a single layer or a stack of a layer containing oxide of silicon or nitride of silicon by a known means (a plasma CVD method or a sputtering method). Specifically, a single layer or a stack of a layer containing silicon oxide, a layer containing silicon oxynitride; or a layer containing silicon nitride oxide is formed.

Subsequently, a first conductive layer and a second conductive layer are stacked over the gate insulating layer 705. The first conductive layer is formed with a thickness of 20 nm to 100 nm by a known means (a plasma CVD method or a sputtering method). The second conductive layer is formed with a thickness of 100 nm to 400 nm by a known means. The first conductive layer and the second conductive layer are formed by using an element selected from tantalum (Ta), tungsten (W), titanium (Ti), molybdenum (Mo), aluminum (Al), copper (Cu), chromium (Cr), niobium (Nb), or the like or an alloy material or a compound material containing the above-described element as its main component.

Alternatively, a semiconductor material typified by polycrystalline silicon doped with an impurity element such as phosphorus, may be used. As a combination of the first conductive layer and the second conductive layer, a tantalum nitride (TaN) layer and a tungsten (W) layer, a tungsten nitride (WN) layer and a tungsten layer, a molybdenum nitride (MoN) layer and a molybdenum (Mo) layer, or the like can be used for example. Since tungsten and tantalum nitride have high heat resistance, heat treatment for thermal activation can be performed after forming the first conductive layer and the second conductive layer. Alternatively, in the case of employing a three-layer structure instead of the two-layer structure, a stack structure of a molybdenum layer, an aluminum layer, and a molybdenum layer may be employed.

Then, resist masks are formed by photolithography and etching treatment for forming a gate electrode and a gate line is performed, thereby conductive layers (also referred to as gate electrodes) 716 to 725 functioning as gate electrodes are formed.

Next, resist masks are formed by photolithography. Then, an impurity element imparting n-type conductivity is added at low concentration into the crystalline semiconductor layers 706, and 708 to 710 by ion doping or ion implantation to form n-type impurity regions 711, and 713 to 715 and channel forming regions 780, and 782 to 784. An element belonging to group 15 of the periodic table may be used for the impurity element imparting n-type conductivity. For example, phosphorus (P) or arsenic (As) is used.

Next, resist masks are further formed by photolithography. Then, an impurity element imparting p-type conductivity is added into the crystalline semiconductor layer 707 to form a p-type impurity region 712 and a channel forming region 781. For example, boron (B) is used for the impurity element imparting p-type conductivity.

Figure 17C:
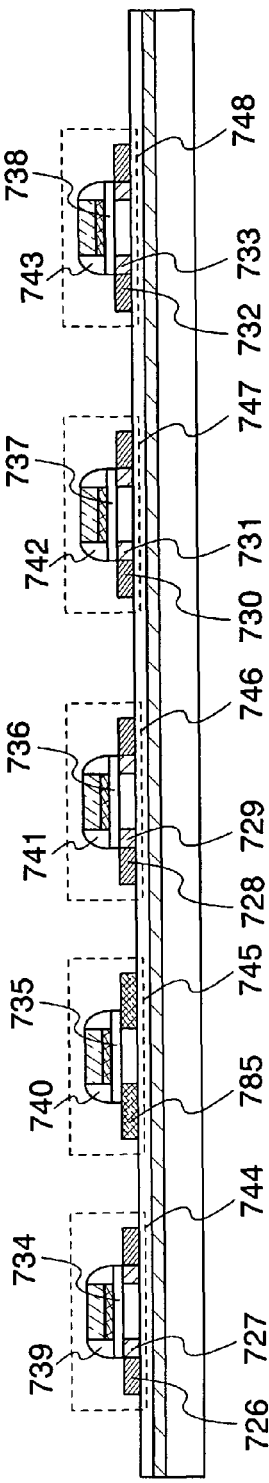

Next, an insulating layer is formed so as to cover the gate insulating layer 705 and the conductive layers 716 to 725. The insulating layer is formed with a single layer or a stack of a layer containing an inorganic material such as silicon, oxide of silicon, or nitride of silicon, or a layer containing an organic material such as an organic resin by a known means (a plasma CVD method or a sputtering method). Then, the insulating layer is selectively etched by anisotropic etching mainly in the vertical direction, thereby insulating layers (also referred to as sidewalls) 739 to 743 in contact with the side surfaces of the conductive layers 716 to 725 are formed (FIG. 17C). Concurrently with the formation of the insulating layers 739 to 743, insulating layers 734 to 738 are formed by etching the gate insulating layer 705. The insulating layers 739 to 743 are used as masks for doping in forming an LDD (Lightly Doped Drain) region subsequently.

Then, using the masks formed of a resist by photolithography and the insulating layers 739' to 743 as masks, an impurity element imparting n-type conductivity is added into the crystalline semiconductor layers 706, and 708 to 710 so that first n-type impurity regions (also referred to as LDD regions) 727, 729, 731, and 733 and second n-type impurity regions 726, 728, 730, and 732 are formed. The concentration of the impurity element in the first n-type impurity regions 727, 729, 731, and 733 is lower than the concentration of the impurity element in the second n-type impurity regions 726, 728, 730, and 732. Through the above-described steps, n-type thin film transistors 744, and 746 to 748 and a p-type thin film transistor 745 are completed.

It is to be noted that there are the following two methods for forming the LDD region. One is a method in which a gate electrode is formed with a stack structure having two or more layers, and the gate electrode is etched to have a tapered shape or anisotropic etching is performed to the gate electrode, so that a conductive layer of the lower layer included in the gate electrode is used as a mask. The other is a method in which a sidewall insulating layer is used as a mask. A thin film transistor that is formed by the former method has a structure in which an LDD region is overlapped with a gate electrode with a gate insulating film interposed therebetween. In this structure, since etching to the gate electrode to have a tapered shape or anisotropically etching is used, it is difficult to control the width of the LDD region, and the LDD region cannot be formed if the etching step is not performed appropriately. On the other hand, the latter method which uses a sidewall insulating layer as a mask is, as compared with the former method, easier to control the width of the LDD region, and the LDD region can be formed without fail.

Then, a single layer or a stack structure of an insulating layer is formed so as to cover the thin film transistors 744 to 748 (FIG. 18A). The insulating layer covering the thin film transistors 744 to 748 is formed with a single layer or a stack using an inorganic material such as oxide of silicon or nitride of silicon, an organic material such as polyimide, polyamide, benzocyclobutene, acrylic, epoxy, or siloxane, or the like by a known means (an SOG method, a droplet discharge method, or the like). For example, in the case where the insulating layer covering the thin film transistors 744 to 748 has a three-layer structure, a layer containing silicon oxide may be preferably formed as a first insulating layer 749, a layer containing a resin may be preferably formed as a second insulating layer 750, and a layer containing silicon nitride may be preferably formed as a third insulating layer 751.

It is to be noted that before forming the insulating layers 749 to 751 or after forming one or more of thin layers among the insulating layers 749 to 751, heat treatment for recovering the crystallinity of the semiconductor layer, for activating the impurity element which has been added into the semiconductor layer, or for hydrogenating the semiconductor layer is preferably performed. For the heat treatment, thermal annealing, laser annealing, RTA, or the like is preferably used.

Then, the insulating layers 749 to 751 are etched by using photolithography to form contact holes so that the n-type impurity regions 726, 728, 730, and 732 and the p-type impurity region 785 are exposed. Subsequently, a conductive layer is formed so as to fill the contact holes and patterned to form conductive layers 752 to 761 each functioning as a source or drain wire.

The conductive layers 752 to 761 are formed with a single layer or a stack using an element selected from titanium (Ti), aluminum (Al), or neodymium (Nd) or an alloy material or a compound material containing the above-described element as its main component by a known means (a plasma CVD method or a sputtering method). An alloy material containing aluminum as its main component is an alloy material whose main component is aluminum and also containing nickel or an alloy material whose main component is aluminum and also containing nickel and one or both of carbon and silicon, for example. Each of the conductive layers 752 to 761 preferably uses, for example, a stack structure of a barrier layer, an aluminum-silicon (Al—Si) layer, and a barrier layer, or a stack structure of a barrier layer, an aluminum-silicon (Al—Si) layer, a titanium nitride (TiN) layer, and a barrier layer.

It is to be noted that the barrier layer corresponds to a thin film which is formed with titanium, nitride of titanium, molybdenum, or nitride of molybdenum. Aluminum and aluminum silicon which are inexpensive and have low resistance, are suitable for forming the conductive layers 752 to 761. In addition, generation of a hillock of aluminum or aluminum silicon can be prevented when upper and lower barrier layers are provided. Further, when the barrier layer is formed with titanium that is a highly-reducible element, even if a thin natural oxide film is formed on the crystalline semiconductor layer, the natural oxide film is reduced so that preferable contact with the crystalline semiconductor layer can be obtained.

Next, an insulating layer 762 is formed so as to cover the conductive layers 752 to 761 (FIG. 18B). The insulating layer 762 is formed with a single layer or a stack using an inorganic material or an organic material by a known means (an SOG method, a droplet discharge method, or the like). The insulating layer 762 is preferably formed with a thickness of 0.75 μm to 3 μm.

Subsequently, the insulating layer 762 is etched by using photolithography to form contact holes which expose the conductive layers 757, 759, and 761. Then, a conductive layer is formed so as to fill the contact holes. The conductive layer is formed by a known means (a plasma CVD method or a sputtering method) using a conductive material. The conductive layer is patterned to form conductive layers 763 to 765. Note that each of the conductive layers 763 to 765 corresponds to one of a pair of conductive layers included in a memory element. Therefore, the conductive layers 763 to 765 are preferably formed with a single layer or a stack using titanium, an alloy material or a compound material containing titanium as its main component.

Titanium which has low resistance enables size reduction of the memory element, thereby high integration can be realized. In addition, in the photolithography for forming the conductive layers 763 to 765, it is preferable to perform wet etching in order to prevent damage to the thin film transistors 744 to 748 that are lower layers, and hydrogen fluoride (HF) or a mixed solution of ammonia, hydrogen peroxide, and pure water is preferably used as an etchant.

Then, an insulating layer 766 is formed so as to cover the conductive layers 763 to 765. The insulating layer 766 is formed with a single layer or a stack using an inorganic material or an organic material by a known means (an SOG method, a droplet discharge method, or the like). In addition, the insulating layer 766 is preferably formed with a thickness of 0.75 μm to 3 μm. The insulating layer 766 is then etched by using photolithography to form contact holes 767 to 769 which expose the conductive layers 763 to 765, respectively.

Subsequently, a conductive layer 786 functioning as an antenna is formed in contact with the conductive layer 765 (FIG. 19A). The conductive layer 786 is formed by a known means (a plasma CVD method, a sputtering method, a printing method, or a droplet discharge method) using a conductive material. Preferably, the conductive layer 786 is formed with a single layer or a stack using an element selected from aluminum (Al), titanium (Ti), silver (Ag), or copper (Cu) or an alloy material or a compound material containing the above-described element as its main component. Specifically, the conductive layer 786 is formed by screen printing with a paste containing silver and by heat treatment thereafter at 50° C. to 350° C. Alternatively, an aluminum layer is formed by a sputtering method, and is patterned to form the conductive layer 786. The patterning of the aluminum layer is preferably performed by wet etching, and heat treatment at 200° C. to 300° C. is preferably conducted after the wet etching.

Next, an organic compound layer 787 is formed in contact with the conductive layers 763 and 764 (FIG. 19B). The organic compound layer 787 is formed by a known means (a droplet discharge method, a vapor-deposition method, or the like). Subsequently, a conductive layer 771 is formed in contact with the organic compound layer 787. The conductive layer 771 is formed by a known means (a sputtering method or a vapor-deposition method).

Through the above-described process, a memory element portion 789 which is a stack including the conductive layer 763, the organic compound layer 787, and the conductive layer 771, and a memory element 790 which is a stack including the conductive layer 764, the organic compound layer 787, and the conductive layer 771 are completed.

It is to be noted that according to the manufacturing process described above, the step of forming the organic compound layer 787 is carried out after the step of forming the conductive layer 786 functioning as an antenna because the heat resistance of the organic compound layer 787 is not high.

Subsequently, an insulating layer 772 functioning as a protective layer is formed by a known means (an SOG method, a droplet discharge method, or the like) so as to cover the memory element portions 789 and 790 and the conductive layer 786 functioning as an antenna. The insulating layer 772 is formed with a layer containing carbon such as DLC (Diamond Like Carbon), a layer containing silicon nitride, a layer containing silicon nitride oxide, an organic material, or preferably formed of epoxy resin.

Figure 20A:
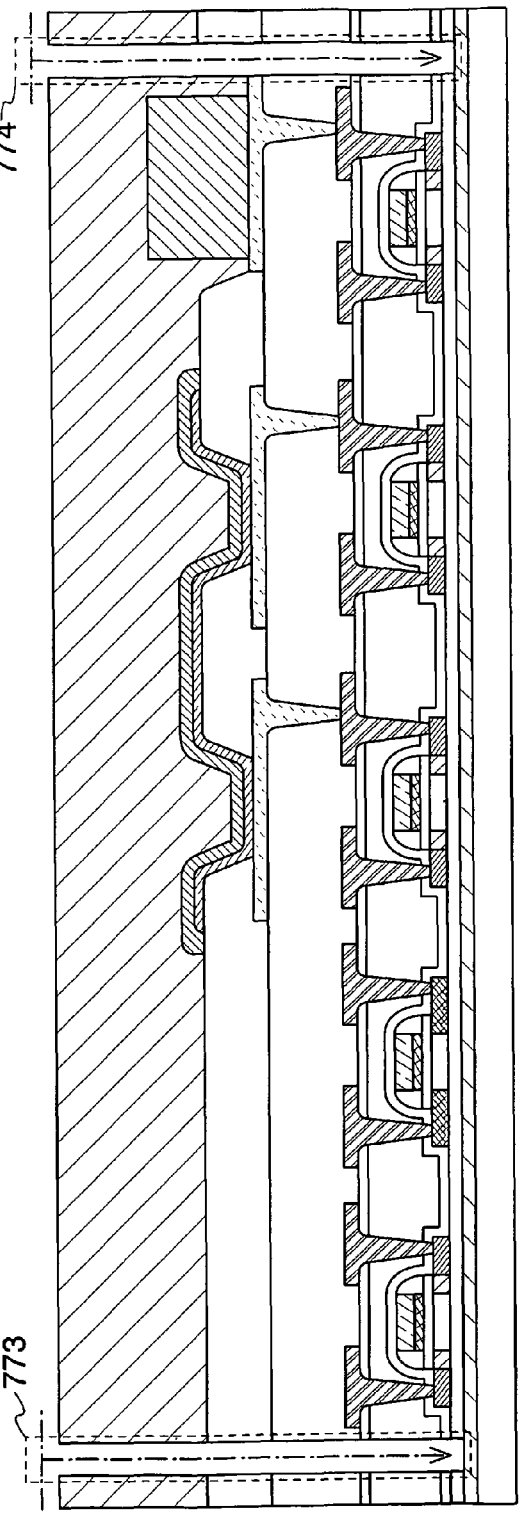
FIGS. 20A and 20B show one example of a structure of a manufacturing method of a semiconductor device according to the invention.

Then, the insulating layer is then etched by photolithography to form opening Portions 773 and 774 so that the peeling layer 702 is exposed (FIG. 20A).

Figure 20B:
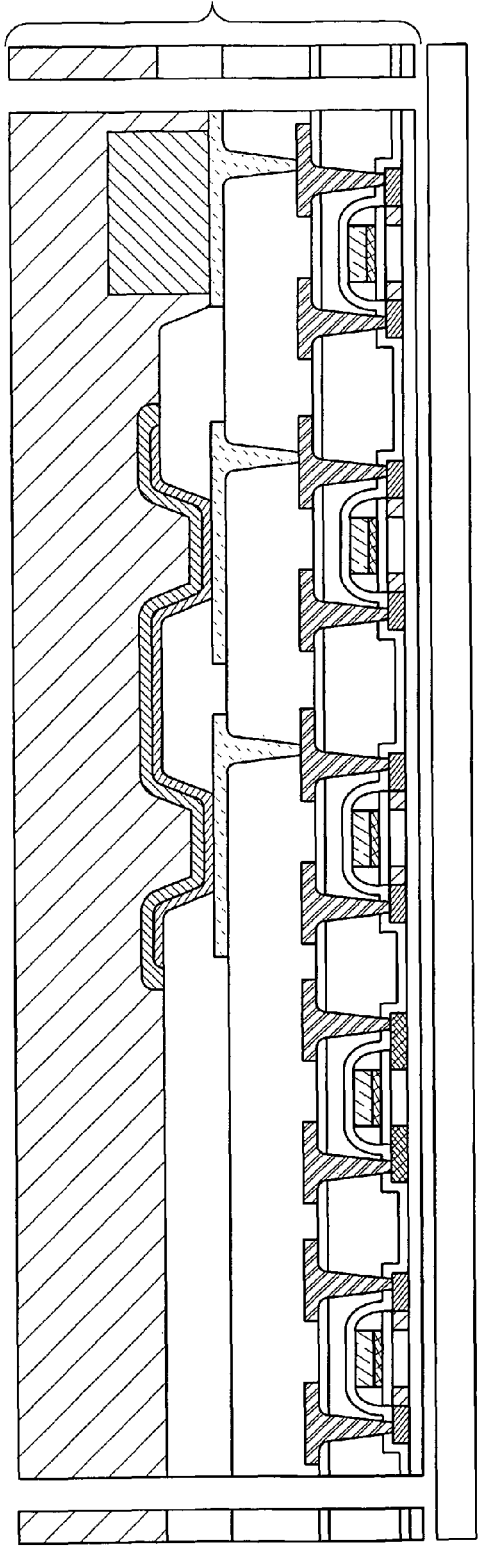

Subsequently, the peeling layer 702 is removed by pouring an etchant into the opening portions 773 and 774 (FIG. 20B). As the etchant, a gas or a liquid containing halogen fluoride or an interhalogen compound is used. For example, chlorine trifluoride ($ClF_3$) is used as the gas containing halogen fluoride. Accordingly, a thin film integrated circuit 791 is separated from the substrate 701. Note herein that the thin film integrated circuit 791 includes an element group having the thin film transistors 744 to 748 and the memory element portions 789 and 790, and the conductive layer 786 functioning as an antenna. The peeling layer 702 may be partially left without being removed entirely. By leaving a part of the peeling layer 702, manufacturing time can be shortened.

It is preferable to reuse the substrate 701 after the thin film integrated circuit 791 is separated, thereby reducing cost. In addition, the insulating layer 772 is formed to prevent the thin film integrated circuit 791 from scattering after the peeling layer 702 is removed. The thin film integrated circuit 791, which is small, thin, and light, easily scatters after the peeling layer 702 is removed since it is not attached firmly to the substrate 701. However, by forming the insulating layer 772 on the thin film integrated circuit 791, the thin film integrated circuit 791 receives weight and scattering from the substrate 701 can be prevented. In addition, by forming the insulating layer 772, the thin film integrated circuit 791 which is thin and light alone is not rolled, and strength can be ensured.

Figure 21:
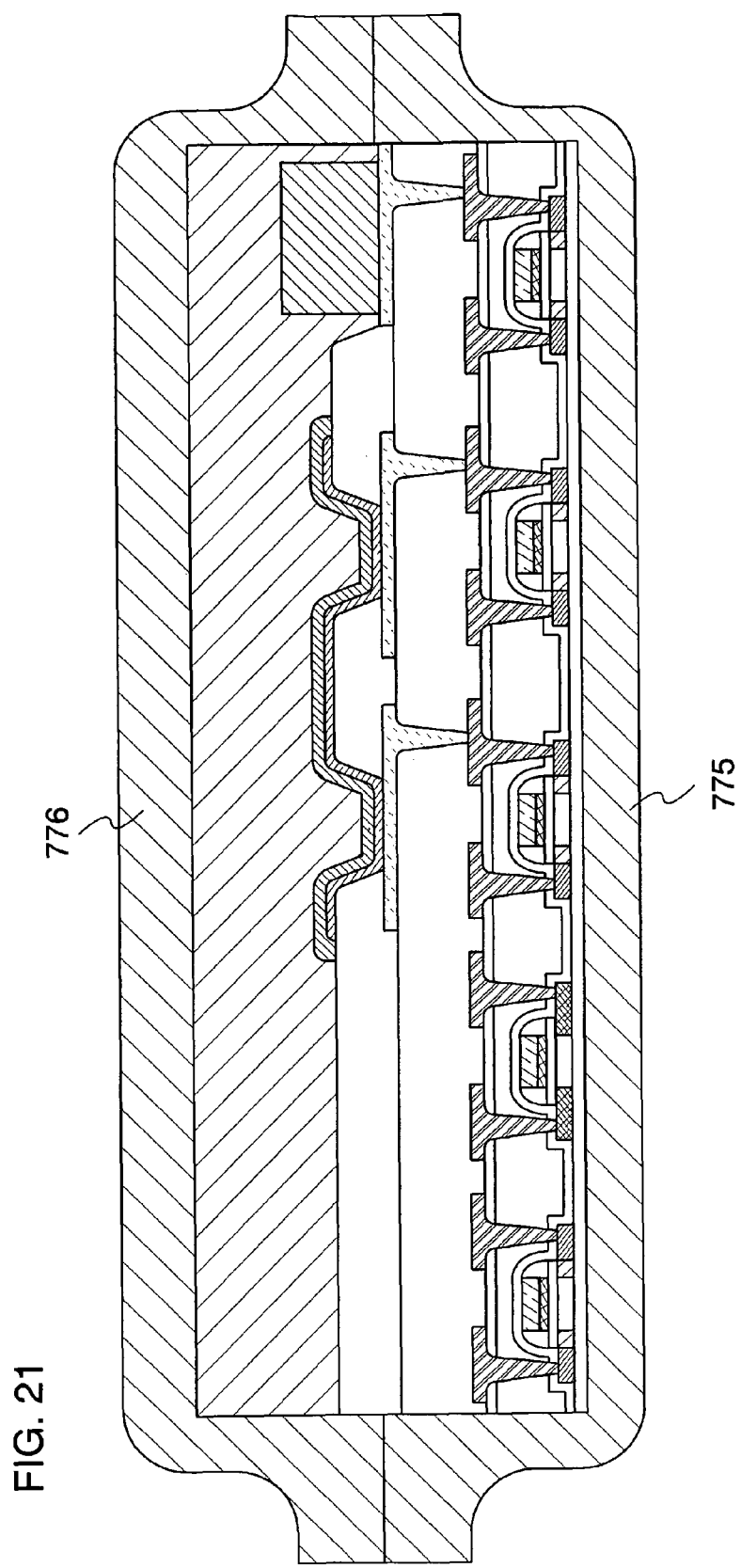
FIG. 21 shows one example of a structure of a manufacturing method of a semiconductor device according to the invention.

Subsequently, one surface of the thin film integrated circuit 791 is attached to a first substratum 776, and the thin film integrated circuit 791 is completely peeled off from the substrate 701 (FIG. 21). Then, a second substratum 775 is attached to the other surface of the thin film integrated circuit 791, and one or both of heat treatment and pressure treatment are performed to seal the thin film integrated circuit 791 with the first substratum 776 and the second substratum 775. Each of the first substratum 776 and the second substratum 775 is a film formed of polypropylene, polyester, vinyl, polyvinyl fluoride, vinyl chloride, or the like; paper of a fibrous material; a stacked films of a base film (polyester, polyamide, an inorganic vapor-deposition film, paper, or the like) and an adhesive synthetic resin film (an acrylic-based synthetic resin, an epoxy-based synthetic resin, or the like); or the like.

The films are attached to the processing object by heat treatment and pressure treatment (thermocompression bonding). An adhesive layer which is provided on the outermost surface of the films or a layer (not an adhesive layer) which is provided on the outermost layer of the films is melted by the heart treatment, and then is pressured so that the films are attached. An adhesive layer may be provided on a surface of the first substratum 776 or the second substratum 775, or it is not necessarily provided. The adhesive layer is a layer containing an adhesive such as a thermosetting resin, an ultraviolet-curable resin, an epoxy resin-based adhesive, or a resin additive.

Through the above process, a semiconductor device including a memory element portion and an antenna can be manufactured. Further, through the above process, a flexible semiconductor device can be obtained.

This embodiment mode can be freely combined with Embodiment Modes 1 to 4.

Embodiment Mode 6

In Embodiment Mode 6, a manufacturing method of a semiconductor device, which is different from those in Embodiment Modes 2 to 5 will be described.

Figure 10A:
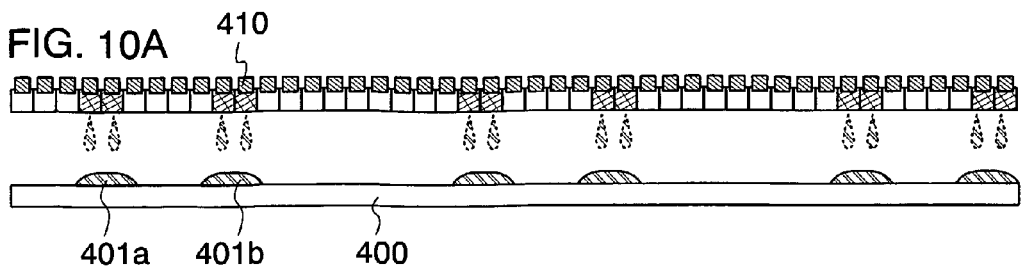
FIGS. 10A to 10E show one example of a structure of a manufacturing method of a semiconductor device according to the invention.

First, conductive layers 401a and 401b serving as a wire and an electrode are formed by selectively discharging a conductive composition from a nozzle 410 onto a substrate 400 (FIG. 10A). A base insulating layer may be provided in advance as a protective film over the substrate 400. Alternatively, the base insulating layer may be irradiated with short pulse laser such as picosecond laser or femtosecond laser to form a depression on the surface. This makes it possible to accurately control the position to dispose the conductive layers 401a and 401b in discharging the composition.

Figure 10B:
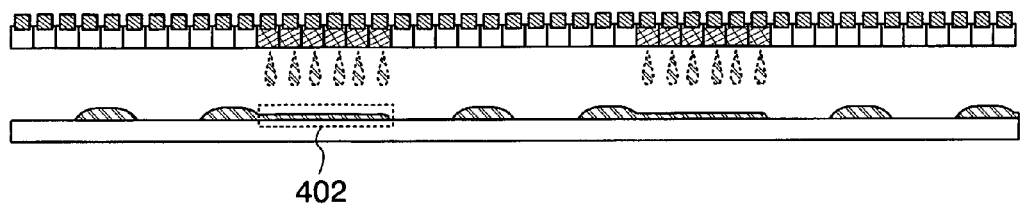

Next, a conductive layer 402 is formed by selectively discharging a conductive composition from the nozzle 410 (FIG. 10B). Note that the conductive layer 402 may be formed concurrently with the conductive layer 401b. In particular, if the same material is used for the conductive layer 401b and the conductive layer 402, they are preferably formed at the same time.

Figure 10C:
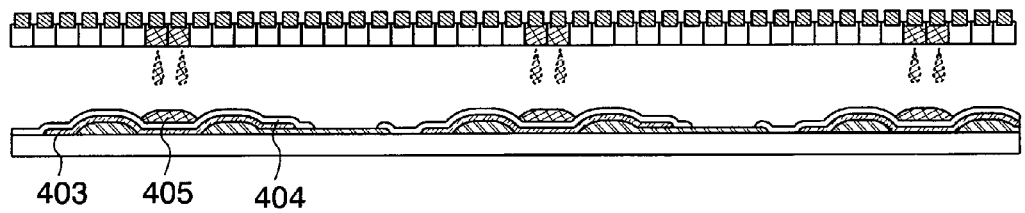

Subsequently, a semiconductor layer 403 is formed by selectively discharging a composition so as to cover the conductive layers 401a and 401b, and an insulating layer 404 is formed so as to cover the semiconductor layer 403. Then, a conductive layer serving as a gate electrode (hereinafter referred to as a gate electrode 405) is formed between the conductive layers 401a and 401b (FIG. 10C). Since the depression is formed between the conductive layers 401a and 401b, the position to provide the gate electrode 405 by discharging a composition can be controlled precisely.

Figure 10D:
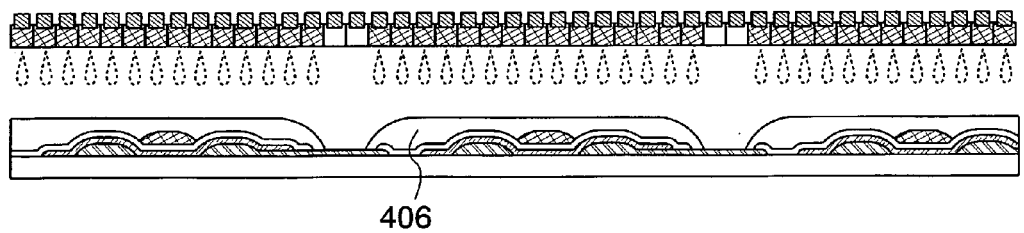

Next, an insulating composition is selectively discharged to form an insulating layer 406 so as to cover the conductive layers 401a and 401b, the semiconductor layer 403, the insulating layer 404, and the gate electrode 405 (FIG. 10D).

Figure 10E:
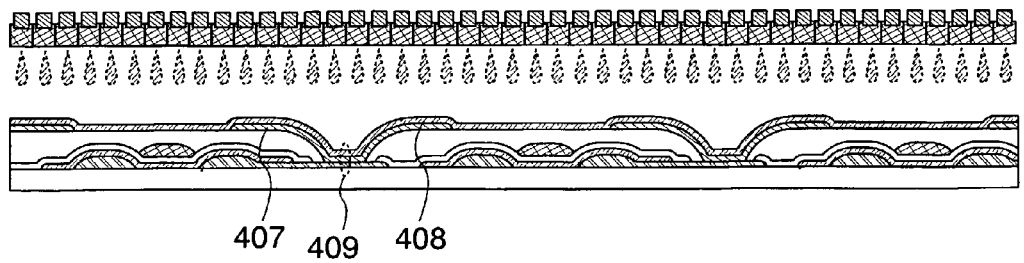

Subsequently, an organic compound layer 407 is formed so as to be in contact with the conductive layer 402 by selectively discharging a composition, and a conductive layer 408 is formed over the organic compound layer 407. The organic compound layer 407 may be provided over an entire surface or may be selectively provided so as to be formed separately from an adjacent organic compound layer which is in contact with the conductive layer 402 (FIG. 10E). Thus, a memory element 409 is formed with a stack of the conductive layer 402, the organic compound layer 407, and the conductive layer 408.

Through the above process, an active matrix organic memory can be formed. In FIGS. 10A to 10E, the case of employing a droplet discharge method in all the steps is shown; however, this embodiment mode is not limited thereto, and another method such as a vapor-deposition method, a CVD method, a sputtering method, a spin coating method, a printing method such as screen printing or gravure printing, or the like can be used in each step. Further, different method may be used in each step, in other words, the methods above may be combined. For example, the conductive layers 401a and 401b may be formed by a droplet discharge method, the semiconductor layer 403 may be formed by a vapor-deposition method, and the organic compound layer 407 can be formed by a spin coating method. Materials or the like used in each step will be described below.

As the substrate 400, for example, a glass substrate such as barium borosilicate glass or aluminoborosilicate glass, a quartz substrate, a ceramic substrate, or the like can be used. Further, a metal substrate containing stainless steel or a semiconductor substrate on which an insulating layer is formed may be used. Although a substrate made of a flexible synthetic resin such as plastic, for example PET, generally has lower heat-resistance temperature than that of the above-described substrate, it can be used as long as it can withstand process temperature in the manufacturing process. Note that a surface of the substrate 400 may be planarized in advance by polishing such as a CMP method.

Materials of the conductive layers 401a and 401b are not particularly limited as long as each of which is a conductive material, and a conductive material containing one or a plurality of elements selected from Ag, Au, Cu, Pd, Cr, Mo, Ti, Ta, W, Al, or the like or a metal compound thereof can be used. Alternatively, a known conductive polymer of which conductivity is improved by doping or the like can be used, such as conductive polyaniline, conductive polypyrrole, conductive polythiophen, a complex of polyethylene dioxythiophene (PEDOT) and polystyrenesulphonic (PSS), or the like.

The conductive layer 402 may be formed of a similar material to that of the conductive layers 401a and 401b. Alternatively, a transparent conductive material may be used instead. As the transparent conductive material, indium tin oxide (ITO), zinc oxide (ZnO), indium zinc oxide (IZO), zinc oxide in which gallium is added (GZO), or the like or another light-transmitting conductive oxide material can be used. ITO, indium tin oxide containing silicon oxide, or a material in which 2 to 20 wt % of zinc oxide (ZnO) is mixed into indium oxide containing silicon oxide may be used instead.

A semiconductor element (silicon, germanium, or the like) alone or an alloy thereof, an organic semiconductor material, or the like can be used for the semiconductor layer 403. The organic semiconductor material is an organic compound having semiconducting properties. A high molecular material having a skeletal structure including a π-conjugated double bond is desirable. Specifically, a soluble high molecular material such as polyphenylene vinylene, polythiophen, poly (3-alkylthiophen), or a polythiophen derivative can be used. Note that a transistor using an organic semiconductor material for a semiconductor layer is referred to as an organic transistor. In this embodiment mode, the organic compound can be provided by a droplet discharge method, a printing method, a spin coating method, or the like.

An inorganic insulating layer of silicon oxide, silicone nitride, silicon nitride oxide, or the like, an insulating layer of polyvinylphenol, polyimide, or siloxane, or the like can be used as the insulating layers 404 and 406. The insulating layer of polyvinylphenol, polyimide, siloxane can be efficiently formed by a droplet discharge method, a printing method, or a spin coating method. The siloxane can be, for example, classified by the structure into silica glass, an alkylsiloxane polymer, an alkylsilsesquioxane polymer, a hydrogen silsesquioxane polymer, a hydrogen alkylsilsesquioxane polymer, and the like. The insulating layer may also be formed using a material containing a polymer including an Si—N bond (polysilazane). Further, a stack using the above materials may be used as the insulating layer.

The organic compound layer 407 can be formed by using any one of the organic compound materials described in Embodiment Mode 1.

The conductive layer 408 can be formed by using any one of the materials for the conductive layers 401a, 401b, and 402.

Further, in the above structure, a rectifying element may be provided between the conductive layer 402 and the organic compound layer 407 or between the organic compound layer 407 and the conductive layer 408. A diode in which the gate electrode and the drain electrode are connected can be provided as the rectifying element. For example, a PN junction diode including a stack of an n-type semiconductor layer and a p-type semiconductor layer can be used. In this manner, by providing a rectifying diode, current flows in only one direction; thus, errors are reduced and readout margin is improved. In the case of providing a diode, a diode having another structure such as a PIN junction diode or an avalanche diode may be used instead of a PN junction diode.

Further, a top gate (staggered) structure in which a gate electrode is located in an upper position than those of the source and the drain electrodes is shown in FIGS. 10A to 10E. However, a bottom gate (inversely staggered) structure in which the gate electrode is located in a lower position than those of the source and the drain electrodes can naturally be used instead. The case of employing the bottom gate structure is shown in FIG. 12A.

Figure 12A:
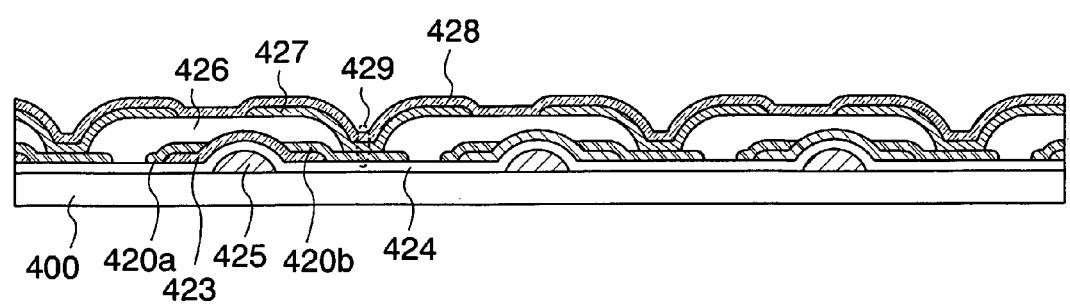
FIGS. 12A and 12B show examples of a structure of a semiconductor device according to the invention.

In FIG. 12A, a gate electrode 425, an insulating layer 424, a semiconductor layer 423, conductive layers 420a and 420b serving as a source electrode or a drain electrode, an insulating layer 426, an organic compound layer 427, and a conductive layer 428 are sequentially stacked over the substrate 400. Further, the same materials and the formation method as in FIGS. 10A to 10E can be used. Also in this case, a rectifying element 429 may be provided between the conductive layer 420b and the organic compound layer 427 or between the organic compound layer 427 and the conductive layer 428.

Next, a structure different from the above structure will be described with reference to FIGS. 11A to 11E. Specifically, the case of providing a memory element portion below a transistor will be shown.

Figure 11A:
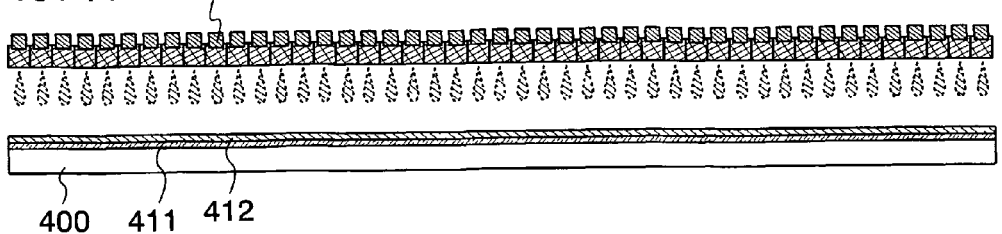
FIGS. 11A to 11E show one example of a structure of a manufacturing method of a semiconductor device according to the invention.

First, a conductive layer 411 and an organic compound layer 412 are provided in a stack over the substrate 400 (FIG. 11A).

Figure 11B:
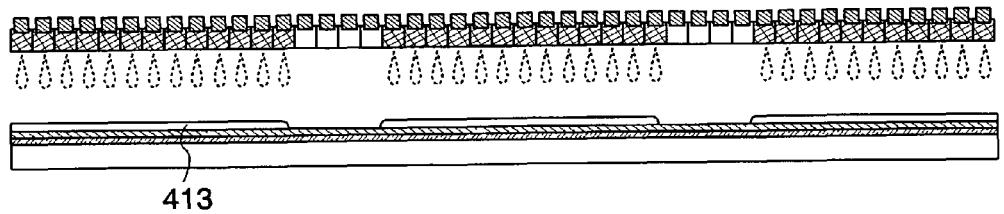

Next, an insulating layer 413 is formed by selectively discharging an insulating composition (FIG. 11B). Note that the insulating layer 413 is provided so as not to be formed in a region to be a memory element portion.

Figure 11C:
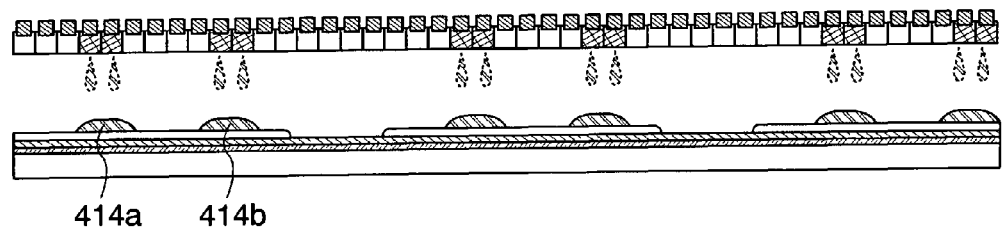

Subsequently, a conductive composition is selectively discharged onto the insulating layer 413 so as to selectively form conductive layers 414a and 414b each serving as a wire or an electrode (FIG. 11C). In this case, an area of the insulating layer 413 where the conductive layers 414a and 414b are to be provided may be irradiated with laser light to form a depression beforehand.

Figure 11D:
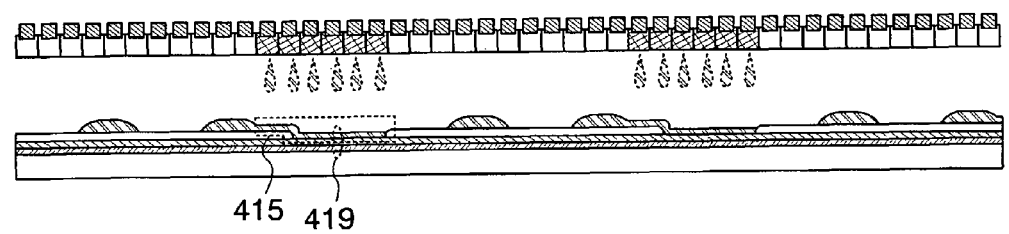

Next, a conductive layer 415 is formed so as to be connected to the conductive layer 414b (FIG. 11D). The conductive layer 415 is provided over the organic compound layer 412. Accordingly, a memory element portion 419 having a stack structure of the conductive layer 411, the organic compound layer 412, and the conductive layer 415 can be obtained. In addition, if a droplet discharge method or the like is used to provide the depression, the position of the conductive layer 415 can be easily controlled.

Figure 11E:
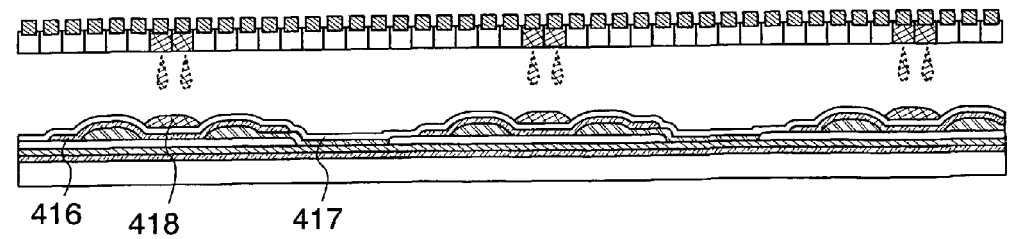

Then, a semiconductor layer 416 is formed to cover the conductive layers 414a and 414b. An insulating layer 417 is thereafter formed to cover the semiconductor layer 416, and a gate electrode 418 is formed between the conductive layer 414a and the conductive layer 414b (FIG. 11E). A depression is provided between the conductive layer 414a and the conductive layer 414b; therefore, the position to provide the gate electrode 418 by a droplet discharge method or the like can be easily controlled.

Through the above process, an organic memory in which the memory element portion 419 is provided below the transistor can be completed. In FIGS. 11A to 11E, the case of using a droplet discharge method in each step is described; however, without limitation thereto, another method such as a vapor-deposition method, a CVD method, a sputtering method, a spin coating method, or a printing method such as screen printing or gravure printing may be used in each step. Further, a combination of the above-described methods may also be used in each step. In particular, the material which is to be formed over the entire surface of the substrate, such as the conductive layer 411 or the organic compound layer 412 is preferably formed by a spin coating method.

In FIGS. 11A to 11E, the conductive layers 411, 414a, 414b, and 415, insulating layers 413 and 417, and the semiconductor layer 416 can be formed by using any of the materials described in FIGS. 10A to 10E. The organic compound layer 412 can be formed using any of the materials described in Embodiment Mode 1.

Figure 12B:
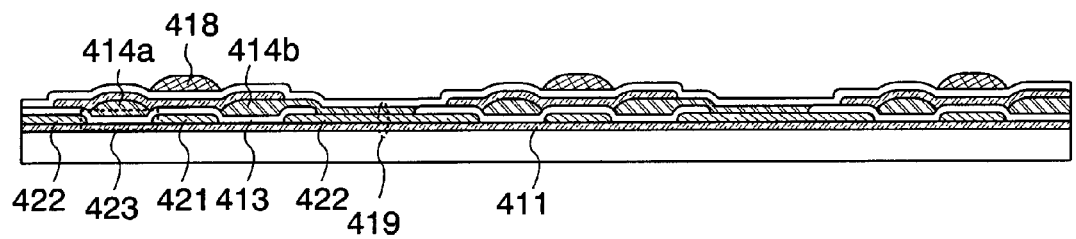

Next, an organic memory having a structure partly different from the structure of FIGS. 11A to 11E will be shown in FIG. 12B.

In a highly integrated memory element, there is a case where the influence of electric field in lateral directions between adjacent memory cells is concerned. Accordingly, the organic compound layers 422 provided in each memory element portion 419 can be separately formed as shown in FIG. 12B. Here, an organic compound layer 422 is selectively formed after forming the conductive layer 411 over the substrate 400. In FIG. 12B, the organic compound layer 422 partly constituting each memory element portion 419 is formed.

In FIG. 12B, an organic compound layer 421 is provided. The organic compound layer 421 is provided so that the position to form the conductive layers 414a and 414b over the insulating layer 413 can be controlled more easily by using a droplet discharge method or the like. By providing the organic compound layer 421, depressions can be formed in advance at positions where the conductive layers 414a and 414b are to be provided. Note that if another method such as a vapor-deposition method or a sputtering method is used or flatness is desired, the organic compound layer 421 is not necessarily provided. In this case, as described above, the positions in the insulating layer 413, which are to be provided with the conductive layers 414a and 414b, are preferably irradiated with laser light to form depressions in advance.

In structures shown in FIGS. 11A to 11E and FIG. 12B, a rectifying element may be provided between the conductive layer and the organic compound layer each of which partly constitutes the memory element portion 419, as in the above-described manner.

Thus, by providing a memory element portion and a transistor using an organic compound, an organic memory and a semiconductor device equipped with the organic memory can be manufactured through a simple process at low cost. Further, by providing a transistor using an organic compound, an organic memory and a semiconductor device equipped with the organic memory can be manufactured directly on a flexible substrate.

This embodiment mode can be freely combined with Embodiment Modes 1 to 5.

Embodiment Mode 7

In Embodiment Mode 7, the case of providing a semiconductor device described in Embodiment Modes 2 to 6 to a display device will be explained with reference to drawings. Here, the case where the pixel area is an active matrix type and a memory element portion is a passive matrix type or active matrix type will be described.

Figure 22A:
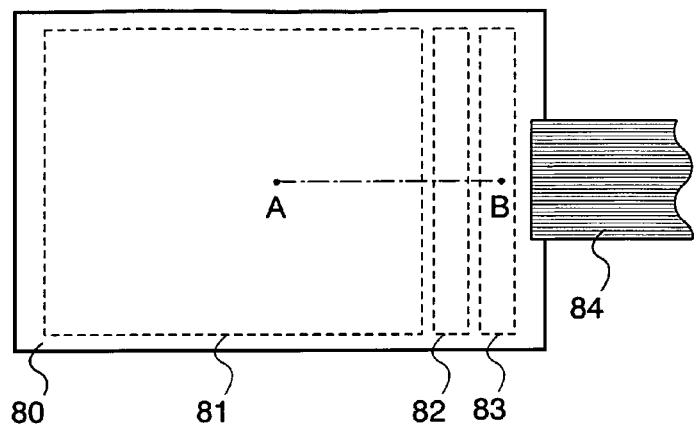
FIGS. 22A to 22C show examples of a structure in which a semiconductor device of the invention is provided to a display device.
Figure 22B:
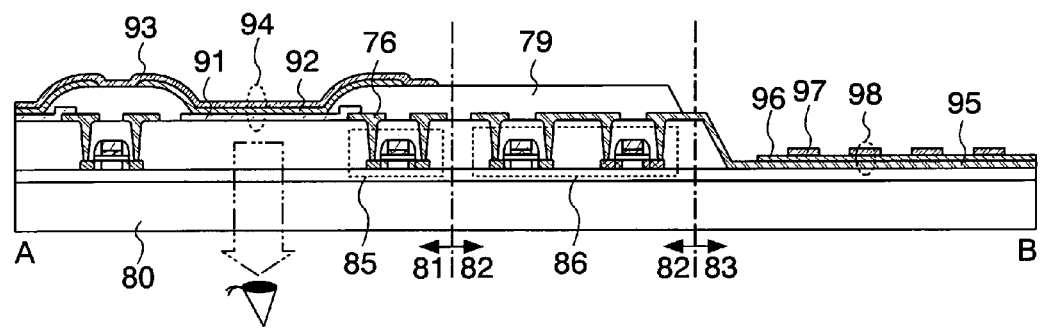

FIGS. 22A and 22B show the case where the pixel area is an active matrix type and the memory element portion is passive matrix type. Note that FIG. 22B corresponds to the cross-sectional view taken along line A-B in FIG. 22A.

In a pixel area 81, a light emitting element 94 is provided, and the light emitting element 94 includes a first conductive layer 91, an organic compound layer 92, and a second conductive layer 93. The first conductive layer 91, the organic compound layer 92, and the second conductive layer 93 are stacked. The first conductive layer 91 included in the light emitting element 94 is connected to a conductive layer 76 which functions as a source or drain wire of a driving transistor 85. An insulating layer 79 functioning as a partition wall is provided between adjacent light emitting elements 94.

An element formation layer is provided in a driver circuit area 82. The element formation layer includes a plurality of transistors 86. The element formation layer partly constitutes a driver circuit for controlling the operation of the pixel area 81 and the memory cell portion 83. The driver circuit for controlling the operation of the pixel area 81 is, for example, a shift register, a decoder, a buffer, a sampling circuit, a latch, or the like. Meanwhile, the driver circuit for controlling the operation of the memory cell portion 83 is, for example, a decoder, a sense amplifier, a selector, a buffer, a readout circuit, a writing circuit, or the like.

In the memory cell portion 83, a memory element portion 98 is provided. The memory element portion 98 includes a first conductive layer 95 serving as a word line Wy, an organic compound layer 96, and a second conductive layer 97 serving as a bit line Bx. The first conductive layer 95, the organic compound layer 96, and the second conductive layer 97 are stacked. In the structure of FIG. 22B, the memory element portion 98 may be provided over the insulating layer 79; thus, the memory cell portion 83 can be provided above the driver circuit area 82. With this structure, the area of the pixel area 81 can be increased.

Further, a connection film 84 is provided over the substrate 80. The connection film 84 specifically corresponds to a flexible printed circuit (FPC) or the like. A signal and the power supply potential for controlling the operation of a plurality of elements constituting the pixel area 81 and the memory cell portion 83 are input from the external through the connection film 84.

Data in the memory element portion 98 included in the memory cell portion 83 is read by applying electrical action. Specifically, voltage is applied between the first conductive layer 95 and the second conductive layer 97 of the memory element portion 98, and data is read by reading a resistance value of the memory element portion 98. When data is read in such a manner, the memory element 98 would emit light depending on the material used for the organic compound layer 96. Therefore, in the case where the organic compound layer 92 included in the light emitting element 94 and the organic compound layer 96 included in the memory element portion 98 are formed using the same material, a chassis may be preferably disposed to prevent light emitted from the memory element portion 98 from being seen. Alternatively, only the light emitting element 94 may be made to emit light by using different materials for the organic compound layer 92 included in the memory element 94 and the organic compound layer 96 included in the memory element portion 98.

Figure 22C:
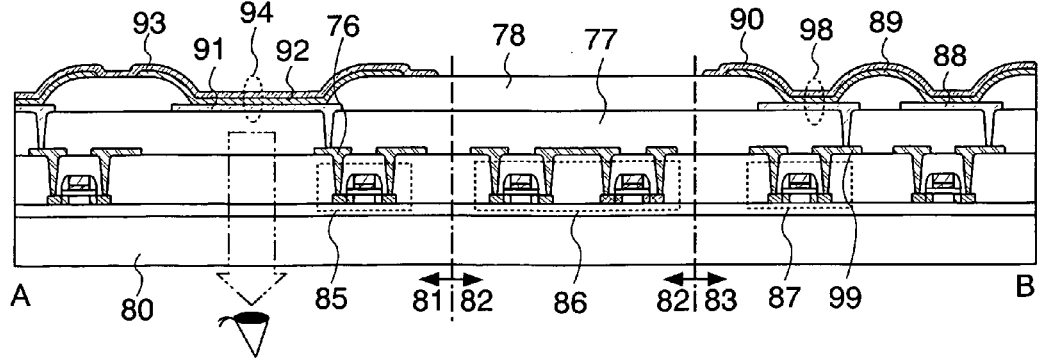

The case of providing a pixel area and a memory element portion which are both an active matrix type is shown in FIG. 22C.

In a pixel area 81, a light emitting element 94 is provided, and the light emitting element 94 includes a first conductive layer 91, an organic compound layer 92, and a second conductive layer 93. The first conductive layer 91, the organic compound layer 92, and the second conductive layer 93 are stacked. The first conductive layer 91 included in the light emitting element 94 is connected to a conductive layer 76 which functions as a source or drain wire of a driving transistor 85 with an insulating layer 77 interposed therebetween. An insulating layer 78 functioning as a partition wall is provided between adjacent memory element portions 98.

An element formation layer is provided in a driver circuit area 82. The element formation layer includes a plurality of transistors 86. The element formation layer partly constitutes a driver circuit for controlling the operation of the pixel area 81 and the memory cell portion 83. The driver circuit for controlling the operation of the pixel area 81 is, for example, a shift register, a decoder, a buffer, a sampling circuit, a latch, or the like. Meanwhile, the driver circuit for controlling the operation of the memory cell portion 83 is, for example, a decoder, a sense amplifier, a selector, a buffer, a readout circuit, a writing circuit, or the like.

In the memory cell portion 83, a memory element portion 98 is provided, and the memory element portion 98 includes a first conductive layer 88, an organic compound layer 89, and a second conductive layer 90. The first conductive layer 88, the organic compound layer 89, and the second conductive layer 90 are stacked. The first conductive layer 88 included in the memory element portion 98 is connected to a conductive layer 99 which functions as a source or drain wire of a switching transistor 87 with the insulating layer 77 interposed therebetween. An insulating layer 78 functioning as a partition wall is provided between adjacent light emitting elements 94. Further, in the structure shown in FIG. 22C, the first conductive layer 91 may be provided in the same layer as the conductive layer 76 serving as a source or drain wire without providing the insulating layer 77, or the first conductive layer 88 may be provided in the same layer as the conductive layer 99 serving as a source or drain wire of the switching transistor 87.

Further, in the above structure, any of a bottom emission type in which light emitted from the light emitting element 94 is directed toward the substrate 80, a top emission type in which the light is directed opposite to the substrate 80, or a dual emission type combining top emission and bottom emission may be employed.

In the above structure, the organic compound layers 96, 92, and 89 can be formed by a droplet discharge method; a spin coating method, a screen printing method, or the like. In FIGS. 22B and 22C, examples of selectively forming the organic compound layers 96, 92, and 89 by a droplet discharge method or a printing method are shown. In this case, an organic compound layer can be selectively formed in each pixel or memory cell; thus, the efficiency in the use of materials can be improved. Further, different materials can be used for the organic compound layers 96, 92, and 89.

Figure 23A:
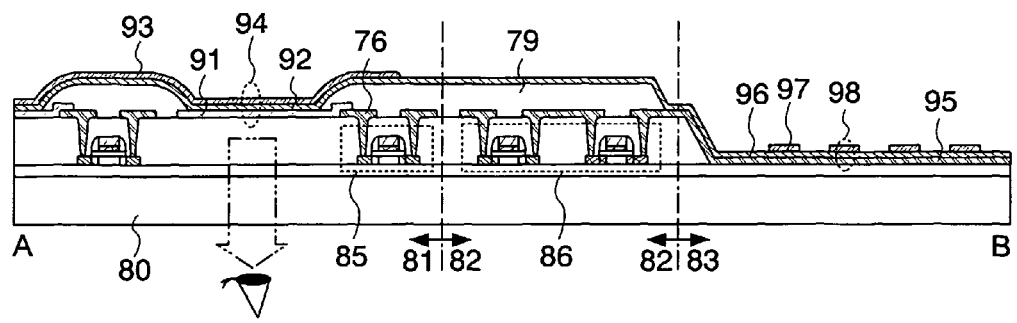
FIGS. 23A and 23B show examples of a structure in which a semiconductor device of the invention is provided to a display device.
Figure 23B:
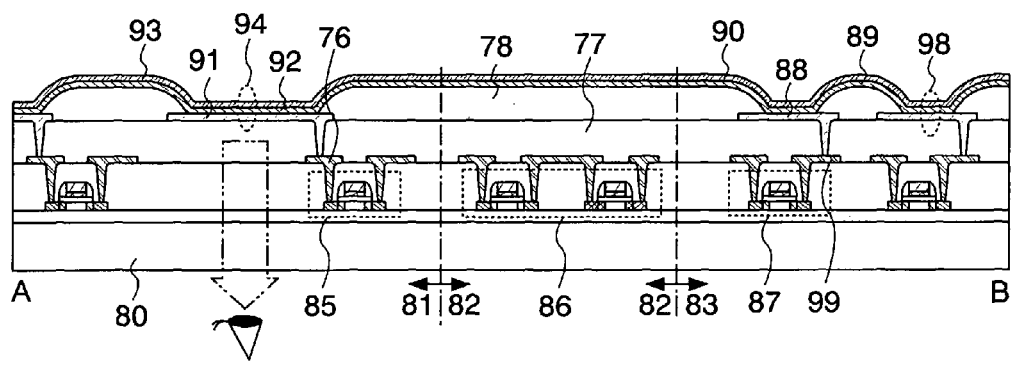

On the other hand, the case of forming the organic compound layers 96, 92, and 89 by a spin coating method is shown in FIGS. 23A and 23B. In FIGS. 23A and 23B, the organic compound layers 96, 92, and 89 are formed with the same material. The operation efficiency can be greatly improved by using a spin coating method.

One feature of a light emitting device having the above structure is to include a memory circuit having a memory element portion with a structure in which an organic compound layer is interposed between a pair of conductive layers. Since the memory element portion has the same structure as or a similar structure to that of a light emitting element and further has a simple structure, the memory element portion can be manufactured easily without increasing the number of manufacturing steps, so that an low-cost display device can be provided. In addition, since the area of a memory cell can be easily reduced, memory cells can be highly integrated easily. Therefore, a display device including a high-capacity memory circuit can be provided.

Further, another feature of a display device of the invention is that a plurality of pixels for displaying images and a memory circuit are provided over one substrate. Due to this feature, the number of IC chips that are connected to the external can be reduced, and hence, a small, thin, and light-weight display device can be provided.

Note that this embodiment mode can be freely combined with Embodiment Modes 2 to 6. Accordingly, the materials and the structures of the semiconductor device described in Embodiment Mode 1 can be freely combined with this embodiment mode.

Embodiment Mode 8

In Embodiment Mode 8, writing and reading of data in a semiconductor device having the above-described structure will be explained.

Figure 27:
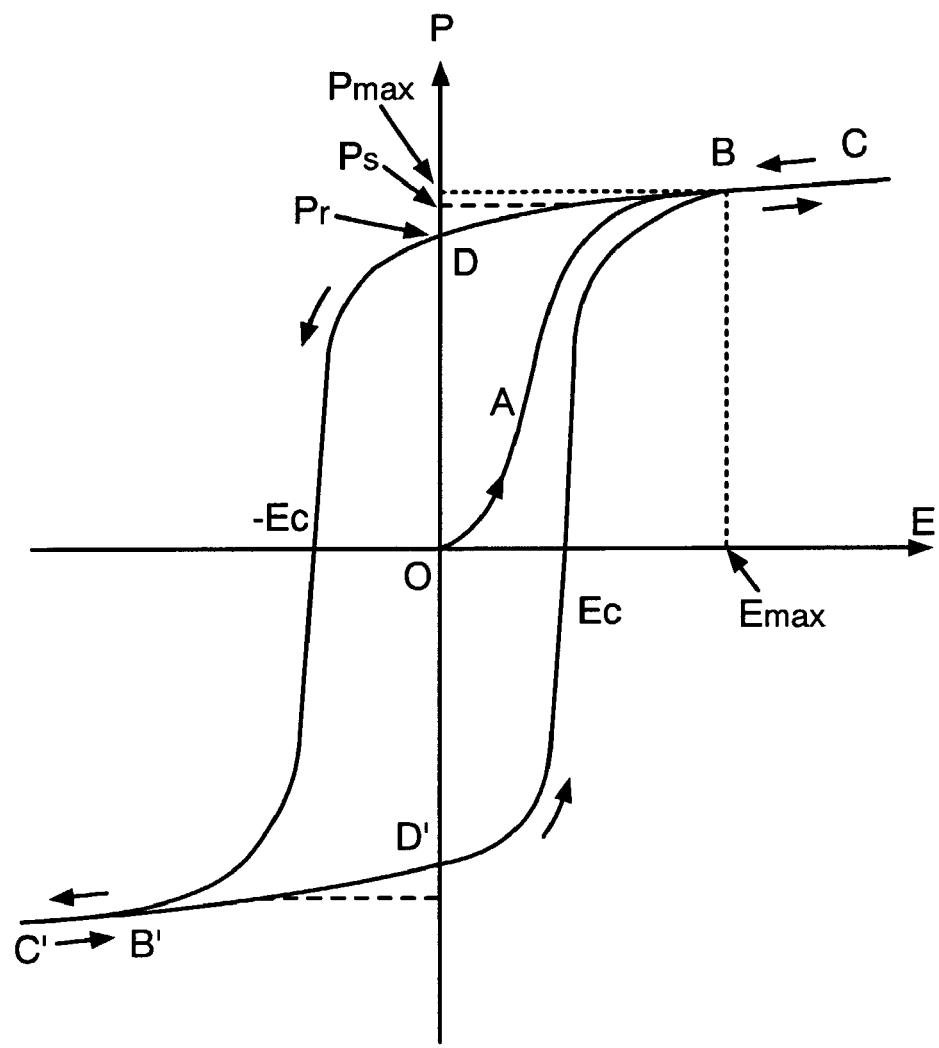
FIG. 27 shows a hysteresis curve of polarization-electric field of a memory element according to the invention.

Writing and reading of data to the semiconductor device having the above-described structure can be conducted by applying an electric action. The case where writing of data is conducted by applying the electric action will be described with reference to FIG. 27.

Ferroelectrics have spontaneous polarization and can reverse the direction of the spontaneous polarization by applying electric field. Accordingly, a relation between the polarization P of the ferroelectrics and the application electric field E is shown by the hysteresis curve as in FIG. 27. In other words, there is an area where two polarization values exist against one electric field value, except the portion of the initial curve A. Particularly when the electric field is 0 V, two polarizations show the same values but opposite in sign, and may have the remanent polarizations of $P_r$, which is close to maximum value of $P_{max}$, and $-P_r$. In addition, in the case of the remanent polarization of $P_r$, the state of the remanent polarization can be reversed to $-P_r$ by applying the electric field $-P_{max}$ and returning the electric field to 0 V. On the other hand, in the case of the remanent polarization of $-P_r$, the state of the remanent polarization can be reversed to $P_r$ by applying the electric field $+P_{max}$ and returning the electric field to 0 V.

The memory element of the invention is stable in the remanent polarization state. In addition, since an organic compound is used, which can change the remanent polarization between two states at low voltage and high speed, the memory element can be used as a nonvolatile memory.

Since an organic memory having the above structure or a semiconductor device including the organic memory is a nonvolatile memory, a battery for holding data is not necessarily provided, and a small, thin, and lightweight semiconductor device can be provided. Further, by using the organic compound material used in Embodiment Mode 1 as an organic compound layer, an organic memory of which data can be rewritten and a semiconductor device including the organic memory can be provided.

Note that even in the case of a passive matrix organic memory or an active matrix organic memory, writing or reading out of data can be conducted similarly.

This embodiment mode can be freely combined with the structure of the organic memory or the semiconductor device including the organic memory described in any of Embodiment Modes 1 to 7.

Embodiment Mode 9

In Embodiment Mode 9, the case of using a semiconductor device of the invention as an RFID 20 capable of non-contact data transmission and reception will be described with reference to FIGS. 13A to 13C.

Figure 13A:
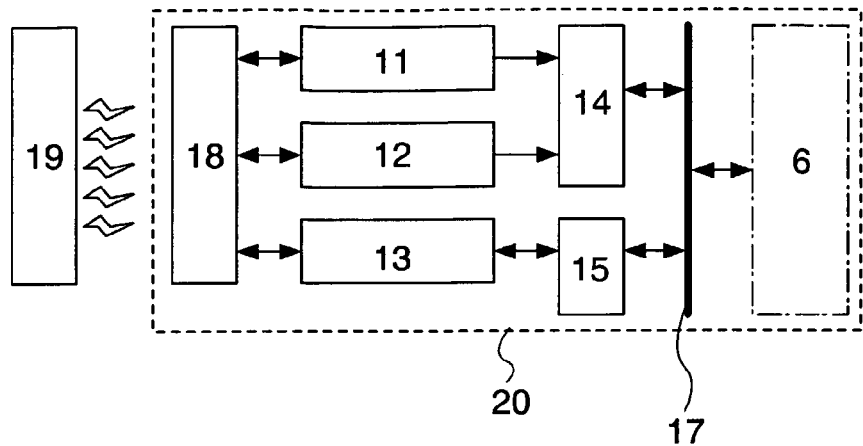
FIGS. 13A to 13C show a usage mode of a semiconductor device according to the invention.
Figure 13B:
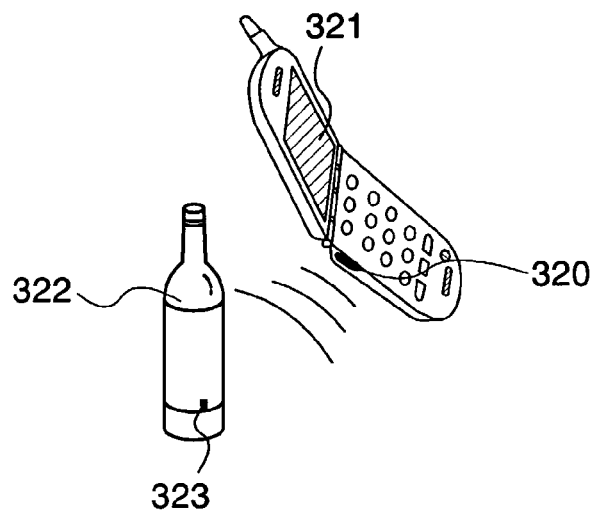
Figure 13C:
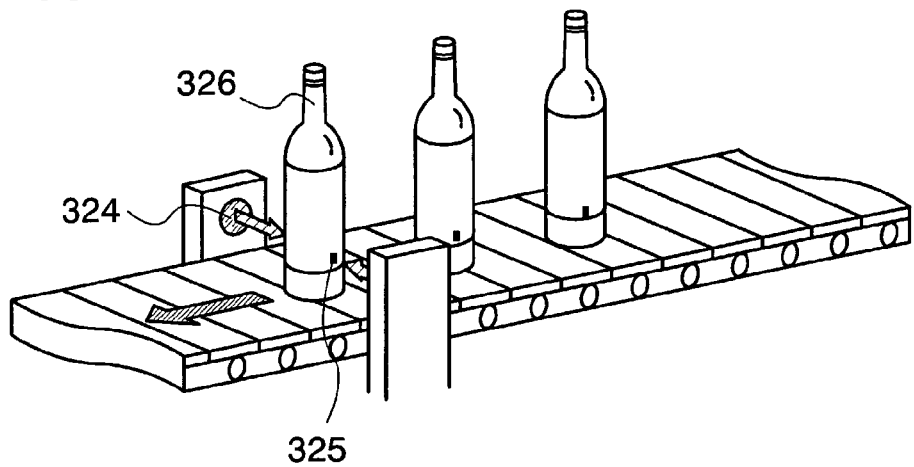

An RFID 20 has a function to communicate data without contact and includes a power supply circuit 11, a clock generating circuit 12, a data demodulation/modulation circuit 13, a control circuit 14 for controlling other circuits, an interface circuit 15, a memory 6, a data bus 17, and an antenna (antenna coil) 18 (FIG. 13A).

The power supply circuit 11 generates various kinds of power to be supplied to each circuit in the semiconductor device, based on an AC signal input from the antenna 18. The clock generating circuit 12 generates various clock signals to be supplied to each circuit in the semiconductor device, based on the AC signal input from the antenna 18. The data demodulation/modulation circuit 13 has a function to demodulate/modulate data to communicate with a reader/writer 19. The control circuit 14 has a function to control the memory 6. The antenna 18 has a function to transmit and receive electromagnetic waves or radio waves. The reader/writer 19 controls the process regarding communication with the semiconductor device, control of the semiconductor device, and data thereof.

The memory 6 has one structure of the organic memories shown in Embodiment Modes 1 to 8. An RFID is not limited to the aforementioned structure and may be additionally provided with other elements such as a limiter circuit of power supply voltage and a decoding hardware.

As for the RFID, a type in which power supply voltage is supplied to each circuit by electric waves without mounting a power supply (battery); another type in which power supply voltage is supplied to each circuit by mounting a power supply (battery) instead of an antenna; or still another type in which power supply voltage is supplied by radio waves and a power supply may be used.

It is advantageous to use a semiconductor device of the present invention for an RFID or the like, since non-contact communication is possible; multiple reading is possible; writing of data is possible; processing into various shapes is possible; directivity is wide and a wide recognition range is provided depending on the selected frequency; and the like. The RFID can be applied to an IC tag which can identify individual information of a person or an article with non-contact wireless communication, a label which is enabled to be attached to an article by label processing, a wristband for an event or an amusement, or the like. In addition, the RFID may be processed with a resin material or may be directly fixed to a metal obstructing wireless communication. Further, the RFID can be utilized for the operation of a system such as an entering-leaving management system or a checkout system.

Next, one mode of actually using the semiconductor device of the invention as the RFID will be explained. A reader/writer 320 is provided on a side of a portable terminal including a display area 321, and an RFID 323 is provided on a side of an article 322 (FIG. 13B). When the reader/writer 320 is held to the RFID 323 included in the article 322, information relating to a product, such as a raw material and a place of origin of the article, a test result in each production process, a history of distribution process, or further, description of the product is displayed in the display area 321. In addition, a product 326 can be inspected by using a reader/writer 324 and an RFID 325 provided on the product 326 when the product 326 is transported with a conveyor belt (FIG. 13C). In this manner, information can be easily obtained, and high functions and high added values are realized by utilizing an RFID for a system.

This embodiment mode can be freely combined with Embodiment Modes 1 to 8.

Embodiment Mode 10

In Embodiment Mode 10, a semiconductor device using the above structure, which is provided with a sensor capable of measuring various information such as a temperature or a pressure will be described with reference to FIGS. 24A and 24B.

Figure 24A:
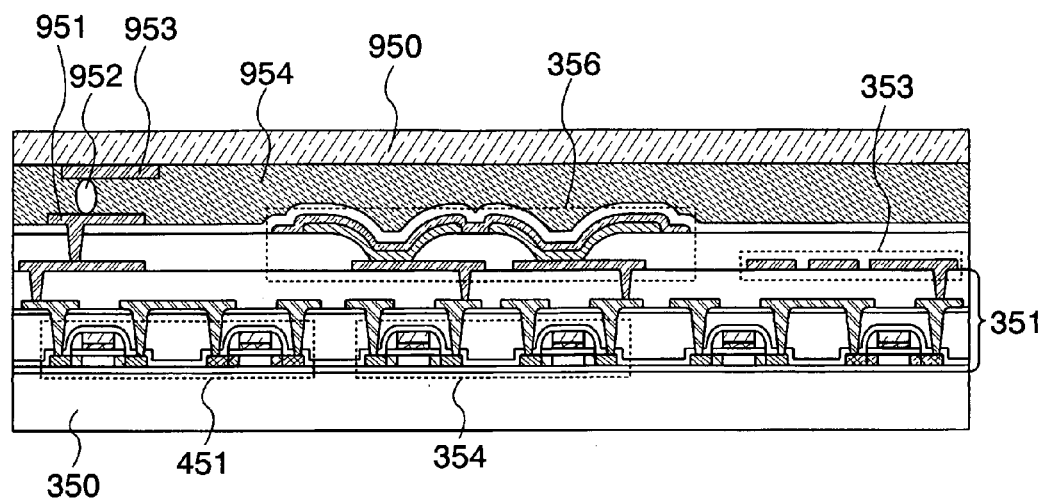
FIGS. 24A and 24B show one example of a structure of a semiconductor device according to the invention.

FIG. 24A shows an example of a structure in the case where a sensor portion is provided in the semiconductor device described in Embodiment Modes 1 to 9. An element formation layer 351 including transistors 451 and 354 is provided over a substrate 350, and a memory element portion 356 and an antenna portion 353 are provided above the element formation layer. In addition, a" sensor portion 950 is provided above the memory element portion 356.

The sensor portion 950 can detect temperature, humidity, illuminance, gas, gravity, pressure, sound, oscillation, acceleration, and other characteristics by physical or chemical means. Further, the sensor portion 950 includes a sensor and a sensor circuit for controlling the sensor. The sensor is formed with a resistor element, a photo-electronic conversion element, a thermo-electromotive force element, a transistor, a thermistor, a diode, or the like.

The sensor portion 950 is connected to the transistor 451 included in the element formation layer 351. Here, the sensor portion 950 is attached to the transistor 451 with an adhesive resin 954. A conductive layer 953 electrically connected to the sensor portion 950 is electrically connected to a conductive layer 951 electrically connected to the source or drain region of the transistor 451 through a conductive particle 952 contained in the resin 954; thus, the sensor portion 950 and the transistor 451 are electrically connected.

The sensor portion 950 may be arranged in any manner without limitation to the above structure. For example, the sensor portion 950 may be provided in the same layer as the memory element portion 356, or it may be provided in the same layer as the transistor 451. Further, the sensor portion 950 can be provided below the substrate 350.

Further, in the above structure, in order to connect the sensor portion 950 and the transistor 451, other than the above method, a known method such as a method with a conductive adhesive such as silver paste, copper paste, carbon paste, a method in which solder bonding is carried out, a TCP (tape carrier package) method, or a wire bonding method can be used.

In the above structure, an example of providing a sensor portion separately from a semiconductor device and thereafter attaching them together is described. Alternatively, the sensor portion can be directly fabricated in the semiconductor. This case will be explained with reference to FIGS. 25A and 25B.

Figure 25A:
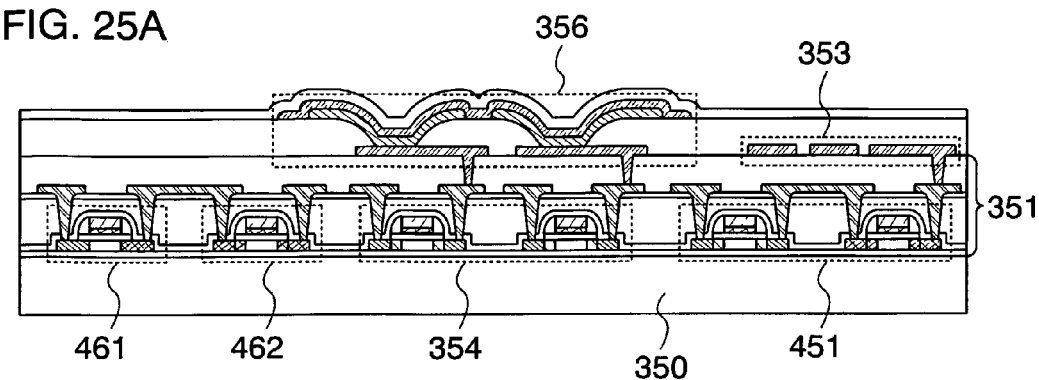
FIGS. 25A and 25B show examples of a structure of a semiconductor device according to the invention.

In FIG. 25A, a light sensor is provided in the same layer as the element formation layer 351 including the transistors 354 and 451. Here, a photodiode 461 including a p-type impurity region, an intrinsic semiconductor region, and an n-type impurity region is provided as the light sensor. Current value of the photodiode 461 changes when irradiated with light, so that light can be detected by measuring the change in the current value of a transistor 462 connected to the photodiode 461. The photodiode 461 may have a junction structure of a p-type impurity region, an intrinsic semiconductor region, and another p-type impurity region; an n-type impurity region, an intrinsic semiconductor region, and another n-type impurity region; or a p-type impurity region and an n-type impurity region. Further, a phototransistor may be provided instead of the photodiode.

Figure 25B:
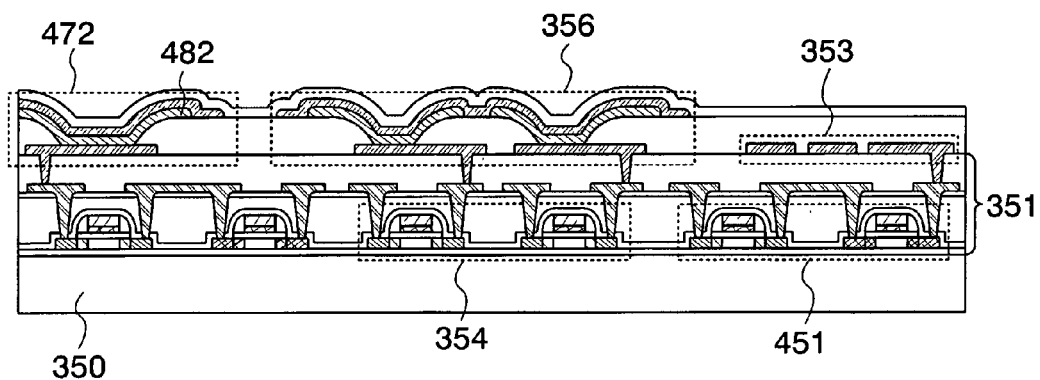

In FIG. 25B, a temperature sensor 472 is provided in the same layer as the memory element portion 356. Here, as the temperature sensor 472, an organic compound layer 482 is provided between a pair of conductive layers. The organic compound layer 482 has a property that the resistance value changes correspondingly to the ambient temperature. Specifically, assuming that the room temperature is the normal temperature, the resistance value decreases when the temperature is higher than the room temperature, and the resistance value increases when the temperature is lower than the room temperature. Accordingly, the change in the temperature can be detected by measuring the voltage when a certain value of current is flown through the pair of conductive layers.

Further, in FIG. 25B, an organic compound layer 482 of the memory element portion 356 and an organic compound layer 482 of the temperature sensor 472 can be formed using the same material. In the case of providing the organic compound layer 482 of the memory element portion 356 and the organic compound layer 482 of the temperature sensor 472 using the same material, when change in the resistance value of the organic compound layer 482 is detected by the temperature sensor 472, since the resistance value of the organic compound layer 482 of the memory element portion 356 is also changed, a circuit for compensating the change in voltage due to the change in resistance value of the organic compound layer 482 may preferably be provided to read out data stored in the memory element portion 356. In the structure shown in FIGS. 25A and 25B, another sensor described above can be formed without limiting to the light sensor and the temperature sensor.

Figure 24B:
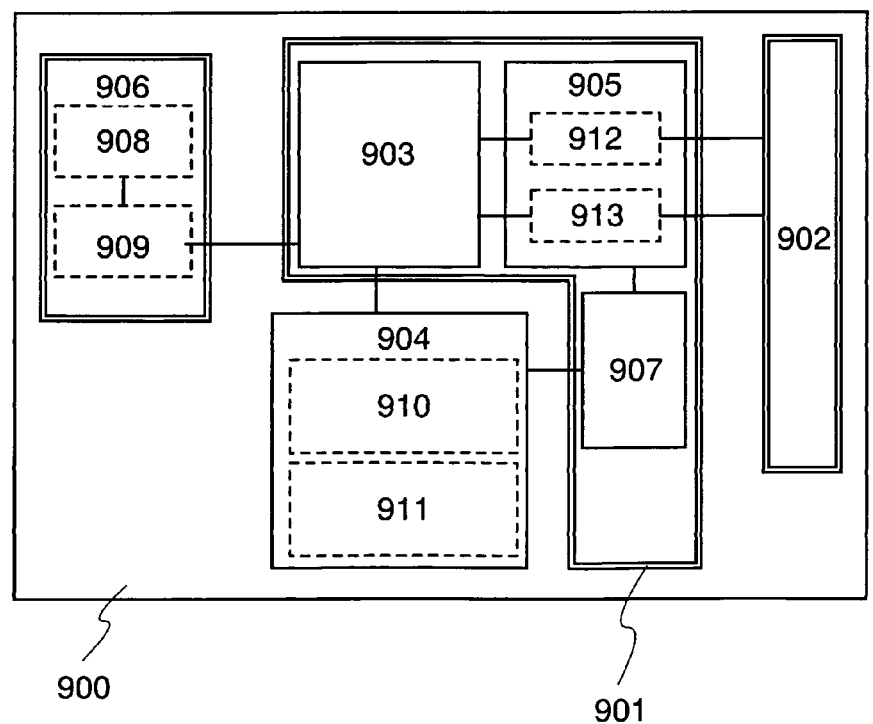

In FIG. 24B, a structure of an RFID 900 equipped with an element formation layer 901, a memory circuit area 904, a sensor 908, and an antenna 902 is shown. The sensor portion 906 detects temperature, humidity, illuminance, gas, gravity, pressure, sound, oscillation, acceleration, and other characteristics by physical or chemical means. The sensor portion 906 includes a sensor 908 and a sensor circuit 909 for controlling the sensor 908. The sensor 908 is formed with a resistor element, a photo-electronic conversion element, a thermo-electromotive force element, a transistor, a thermistor, a diode, or the like. The sensor circuit 909 detects change in impedance, reactance, inductance, voltage, or current, and carries out analog-to-digital conversion (A/D conversion) and outputs a signal to the arithmetic processing circuit area 903.

The element formation layer 901 includes the arithmetic processing circuit area 903, a communication circuit area 905, and a power supply circuit area 907. The memory circuit area 904 can be provided in the element formation layer 901. The memory circuit area 904 can store information received from the outside via the sensor portion 906 or the antenna 902 at any time. The memory circuit area 904 may have a structure including a first memory circuit area 910 which stores the signal detected by the sensor portion 906 and a second memory circuit area 911 which stores information written by a reader/writer device.

The first memory circuit area 910 may preferably include a flash memory or the like in which sequential writing can be carried out and data is not destroyed, so as to store information detected in the sensor portion 906. Further, a write-once memory element portion is preferably applied.

The communication circuit area 905 includes a demodulation circuit 912 and a modulation circuit 913. The demodulation circuit 912 demodulates a signal which is input through the antenna 902 and outputs the signal to the arithmetic processing circuit area 903. The signal includes a signal controlling the sensor portion 906 and information which is to be stored in the memory circuit area 904. In addition, the signal output from the sensor circuit 909 and information read out from the memory circuit area 904 are output to the modulation circuit 913 through the arithmetic processing circuit area 903. The modulation circuit 913 modulates this signal to a signal which is wirelessly communicable and outputs the signal to an external device through the antenna 902.

Power which is necessary for operating the arithmetic processing circuit area 903, the sensor portion 906, the memory circuit area 904, and the communication circuit area 905 is supplied through the antenna 902. Depending on the usage mode, a power supply (battery) may be built in.

Thus, by providing a sensor which can detect information of temperature, pressure, or the like, on the semiconductor device shown in Embodiment Modes 1 to 8, various information detected by the sensor can be stored and managed in the memory element portion. For example, a semiconductor device including a gas sensor is provided to a food and food condition can be managed. Specifically, the semiconductor device having a gas sensor is provided on a perishable food or the like and detects septic gas which is generated from the food. The stored data is regularly read by a reader/writer provided at the side of a display cabinet or a conveyor belt; thus, the freshness of foods can be controlled and foods which have started to rot can be sorted.

In addition, by providing a surface of a human body or inside the body with a semiconductor device having a sensor such as a temperature sensor or a pressure sensor, biological information such as pulse rate, heart rate, body temperature, blood pressure, an electrocardiogram, or an electromyogram can be stored in a memory element portion provided in the semiconductor device. The semiconductor device of the invention can read biological information without body restraint since the semiconductor device is thin and minute. Management of a physical condition and an exercise condition of a body and prevention and prediction of a disease can be enabled by regularly reading the stored information with the reader/writer. A home healthcare monitoring system or the like can be realized by obtaining biological information which is read with the reader/writer using a network such as Internet. Note that a semiconductor device having a sensor may be provided on an animal such as a domestic animal as well as a human body and a variety of information can be stored; thus, the animal can be controlled.

This embodiment mode can be freely combined with Embodiment Modes 1 to 8.

Embodiment Mode 11

Figure 14:
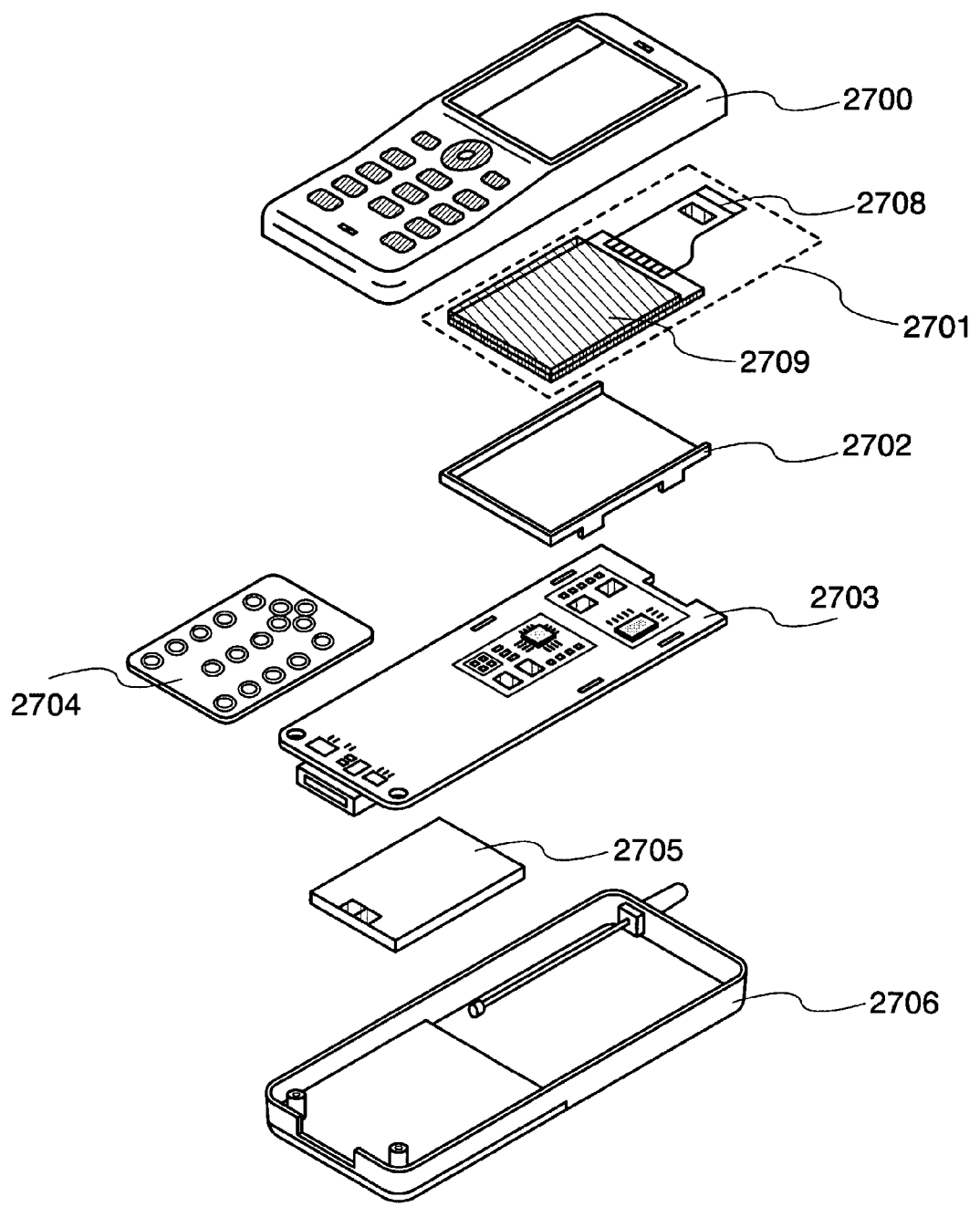
FIG. 14 shows a usage mode of a semiconductor device according to the invention.

The usage of a semiconductor device according to the invention is wide-ranging. For example, the semiconductor device can be used for an electronic device in which information is stored and displayed. For example, the semiconductor device can be used for a television set, a portable information terminal such as a cellular phone, a digital camera, a video camera, or a navigation system. The case of applying the semiconductor device of the invention to a cellular phone will be described with reference to FIG. 14.

The cellular phone includes chassis 2700 and 2706, a panel 2701, a housing 2702, a printed wiring board 2703, an operation button 2704, and a battery 2705. The panel 2701 is incorporated into the housing 2702 so as to be freely detached and attached, and the housing 2702 is fitted into the printed wiring board 2703. The shape and size of the housing 2702 can be appropriately changed depending on an electronic device into which the panel 2701 is incorporated. A plurality of packed semiconductor devices are mounted on the printed wiring board 2703, and the semiconductor device according to the invention can be used as one of the plurality of semiconductor devices. The plurality of semiconductor devices mounted on the printed wiring board 2703 each serves as a controller, a central processing unit (CPU), a memory, a power supply circuit, an audio processing circuit, a sending/receiving circuit, or the like.

The panel 2701 is connected to the printed wiring board 2703 via a connection film 2708. The panel 2701, the housing 2702, and the printed wiring board 2703 described above are placed inside the chassis 2700 and 2706 along with the operation button 2704 and the battery 2705. A pixel area 2709 included in the panel 2701 is disposed so as to be seen through an opening window provided on the chassis 2700.

The semiconductor device according to the invention has features of small size, thinness, and lightweight. Due to the features, limited space inside the chassis 2700 and 2706 of the electronic device can be effectively utilized. A semiconductor device according to the invention has a feature of including a memory circuit having a simple structure, and due to the feature, an electronic device using a semiconductor device having an inexpensive and highly integrated memory circuit can be provided. Further, the semiconductor device according to the invention has a feature of including a memory circuit which is nonvolatile and able to rewrite data, and due to the feature, an electronic device in which high functions and high added values are realized can be provided. Further, in a semiconductor device of the present invention, a transistor in which a single crystal semiconductor layer with preferable mobility and response speed is used as the channel region can be provided. In this case, an electronic device using a semiconductor device capable of high-speed operation and of which operation frequency is improved can be provided.

The semiconductor device according to the invention can also be utilized as an RFID 20. For example, the semiconductor device can be used by being provided on paper money, coin, securities, certificates, bearer bonds, packing containers, documents, recording media, commodities, vehicles, foods, garments, health articles, livingwares, medicines, electronic devices, and the like. These examples will be explained with reference to FIGS. 15A to 15H.

Figure 15A:
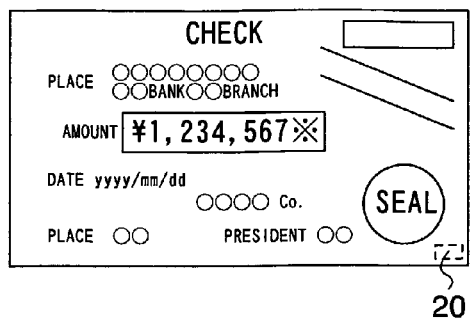
FIGS. 15A to 15H show usage modes of a semiconductor device according to the invention.
Figure 15B:
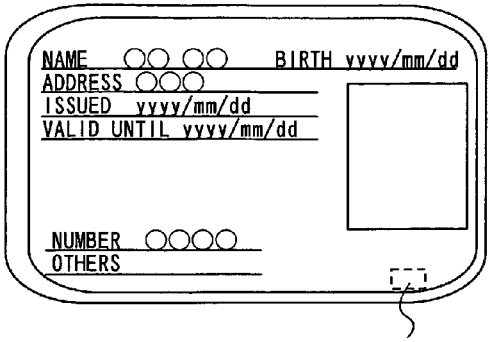
Figure 15C:
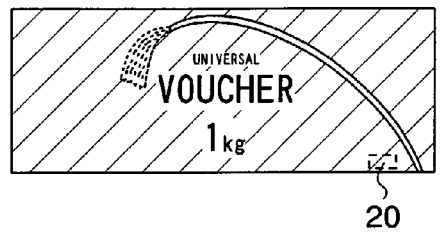
Figure 15D:
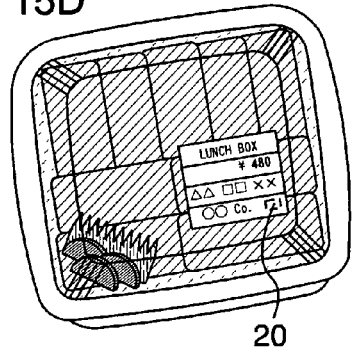
Figure 15E:
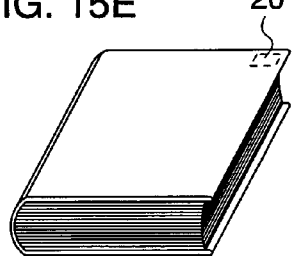
Figure 15F:
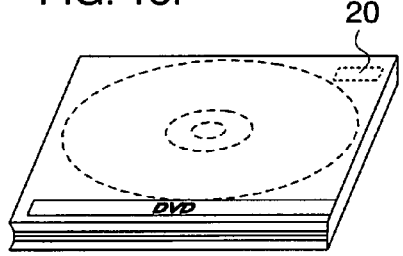
Figure 15G:
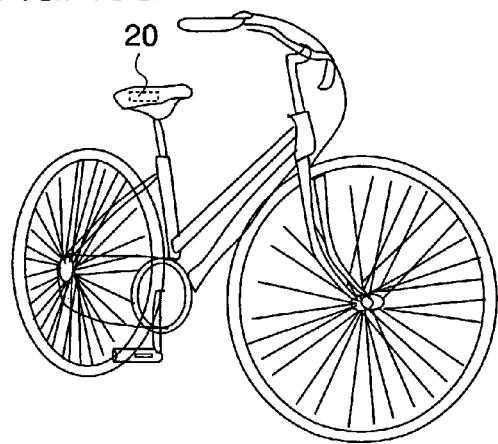
Figure 15H:
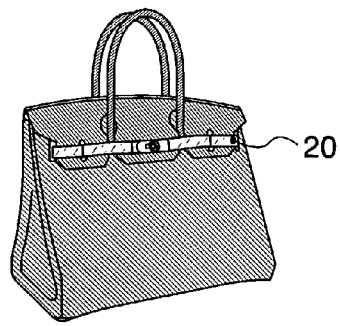

The paper money and coins are money distributed in the market and includes currency (cash vouchers) available in a certain area in a similar way to money, memorial coins, and the like. The securities refer to checks, stock certificates, promissory notes, and the like (FIG. 15A). The certificates refer to driver's licenses, certificates of residence, and the like (FIG. 15B). The bearer bonds refer to stamps, rice coupons, various merchandise coupons, and the like (FIG. 15C). The packing containers refer to wrapping paper for a box lunch or the like, plastic bottles, and the like (FIG. 15D). The documents refer to volumes, books, and the like (FIG. 15E). The recording media refer to DVD software, video tapes, and the like (FIG. 15F). The vehicles refer to wheeled vehicles such as bicycles, vessels, and the like (FIG. 15G). The commodities refer to bags, glasses, and the like (FIG. 15H). The foods refer to eatables, drinks, and the like. The garments refer to clothes, chaussures, and the like. The health articles refer to medical appliances, health appliances, and the like. The livingwares refer to furniture, lighting equipment, and the like. The medicines refer to medical products, pesticides, and the like. The electronic devices refer to liquid crystal display devices, EL display devices, television devices (TV sets or flat-screen TV sets), cellular phones, and the like.

Counterfeits can be prevented by providing an RFID on the paper money, coin, securities, certificates, bearer bonds, and the like. The efficiency of an inspection system or a system used in a rental shop can be improved by providing an RFID on packing containers, documents, recording media, commodities, foods, livingwares, electronic devices, or the like. By providing an RFID on each of the vehicles, health articles, medicines, and the like, counterfeits or theft can be prevented. Further in the case of providing the RFID on medicines, medicines can be prevented from being taken mistakenly. The RFID is provided on goods by being attached on their surfaces or embedded thereinto. For example, the RFID may be embedded in a paper in the case of a book or embedded in an organic resin in the case of a package formed of the organic resin.

Problems such as privacy after a user purchases a product can be solved by providing a system for erasing data in a memory element provided on an RFID.

The efficiency of an inspection system, a system used in a rental shop, or the like can be improved by providing an RFID on packing containers, recording media, commodities, foods, garments, livingwares, electronic devices, or the like. Counterfeits or theft can be prevented by providing an RFID on vehicles. Individual creatures can be easily identified by implanting an RFID in creatures such as animals. For example, health status such as body temperature in addition to year of birth, sex, breed, and the like can be easily managed by implanting an RFID equipped with a sensor in creatures such as domestic animals.

As described above, a semiconductor device according to the invention can be provided on anything as long as they are goods whose data can be stored. This embodiment mode can be freely combined with Embodiment Modes 1 to 9.

Embodiment 1

The element of this embodiment is formed over a glass substrate, and a film of indium tin oxide containing silicon oxide (ITSO) with a thickness of 110 nm is formed as a first electrode over the glass substrate. The ITSO is formed by a sputtering method. In this embodiment, the shape of the first electrode is 2 mm×2 mm. Subsequently, as pretreatment for forming an organic compound layer over the first electrode, a surface of the substrate is cleaned with a porous resin (typically made of PVA (polyvinyl alcohol), nylon, or the like), and heat treatment at a temperature of 200° C. is performed for one hour. Then, UV ozone treatment is performed for 370 seconds.

Next, a toluene solution of poly(N-propargyl-3-methylbutaneamide) which is a polymer indicated by the following structural formula 5 is deposited over the substrate by spin coating. The thickness of this polymer is 140 nm. Over this polymer film, an Al electrode is formed with a thickness of 200 nm. The Al electrode is formed by a vacuum vapor-deposition method using resistance heating.

[Chemical Formula 5]

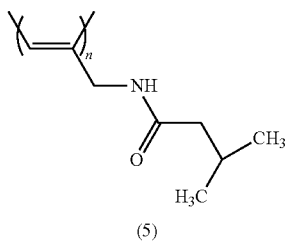

(5)

Figure 26:
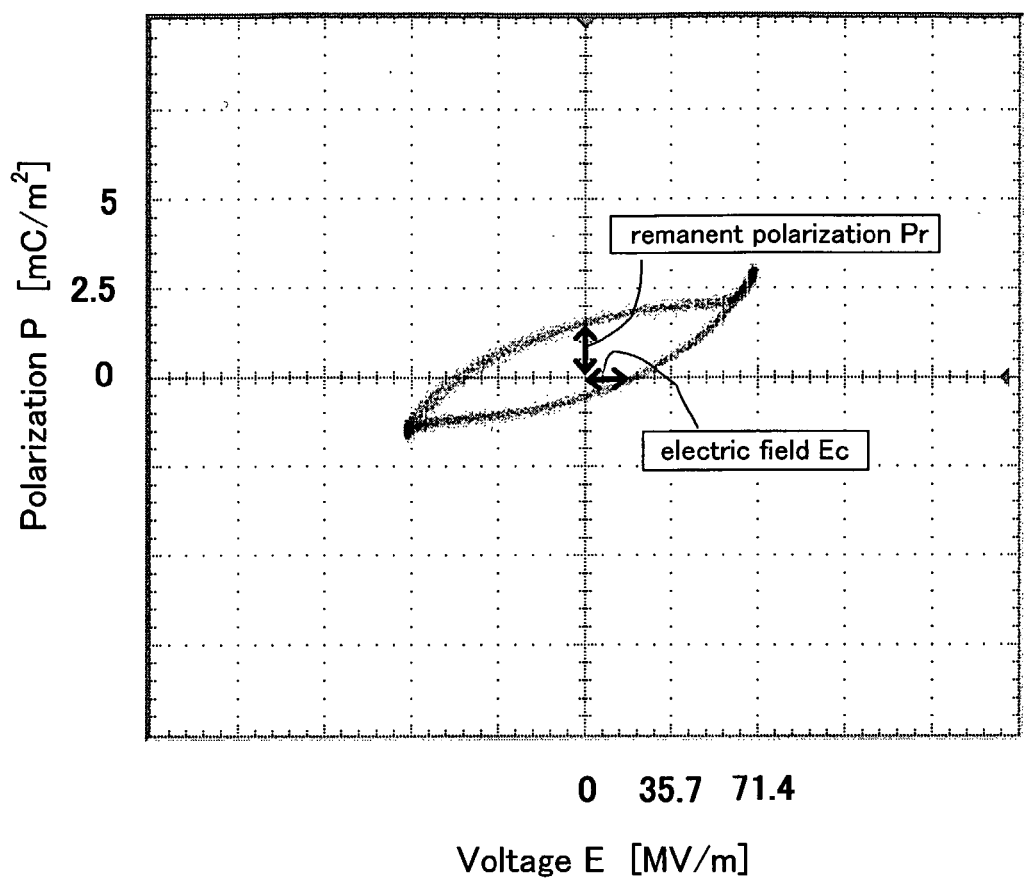
FIG. 26 shows a hysteresis curve of polarization-electric field of a memory element in a semiconductor device according to the invention.

The hysteresis curve of polarization-electric field of the present element is shown in FIG. 26. The measurement is performed by forming a system of measurement called a Sawyer and Tower circuit and applying an alternating current of 10 V at 1 Hz. As a result, it is found that polarization reversal is caused at an electric field of 35 MV/m. In addition, the remanent polarization reaches 1 mC/m². From these results, it is found that the present polymer shows characteristics as ferroelectrics.

This application is based on Japanese Patent Application serial No. 2005-133422 filed in Japan Patent Office on Apr. 28, 2005, the entire contents of which are hereby incorporated by reference.

EXPLANATION OF REFERENCE

11: power supply circuit, 12; clock generation circuit, 13: data demodulation/modulation circuit, 14: control circuit, 15: interface circuit, 16: memory circuit, 17: data bus, 18: antenna, 19: reader/writer, 20: RFID, 21: memory cell, 22: memory cell array, 23: interface, 24: word line driver circuit, 26: bit line driver circuit, 26a: column decoder, 26b: circuit, 26c: selector, 27 and 28: conductive layer, 29: organic compound layer, 30: substrate, 31 and 32: insulating layer, 34: semiconductor layer, 37: insulating layer, 38: organic compound layer, 39: memory element portion, 76: conductive layer, 77-79: insulating layer, 80: substrate, 81: pixel area, 82: driver circuit area, 83: memory cell portion, 84: connection film, 85: driving transistor, 86: transistor, 87: switching transistor, 88: conductive layer, 89: organic compound layer, 90 and 91: conductive layer, 92: organic compound layer, 93: conductive layer, 94: light emitting element, 95: conductive layer, 96: organic compound layer, 97: conductive layer, 98: memory element portion, 99: conductive layer, 216: memory circuit, 221: memory cell, 222: memory cell array, 223: interface, 224: word line driver circuit, 224a: row decoder, 224b: level shifter, 226: bit-line driver circuit, 226a: column decoder, 226b: circuit, 226c: selector, 230: substrate, 231 and 232: wire, 240: transistor, 241: memory element portion, 243: conductive layer, 244: organic compound layer, 245: conductive layer, 248: transistor, 249: insulating layer, 24a: row decoder, 24b: level shifter, 250: insulating layer, 251: element formation layer, 256: insulating layer, 320: reader/writer, 321: display portion, 322: article, 323: RFID, 324: reader/writer, 325: RFID, 326: product, 350: substrate, 351: element formation layer, 352: memory element portion, 353: antenna portion, 354: transistor, 355: conductive layer, 356: memory element portion, 357: antenna portion, 358: conductive layer, 359: conductive particle, 361: conductive layer, 362: organic compound layer, 363: conductive layer, 364 and 366: insulating layer, 371: conductive layer, 372: organic compound layer, 373: conductive layer, 374: insulating layer, 375: resin, 376: insulating layer, 400: substrate, 401a and 401b: conductive layer, 402: conductive layer, 403: semiconductor layer, 404: insulating layer, 405: gate electrode, 406: insulating layer, 407: organic compound layer, 408: conductive layer, 409: memory element portion, 410: nozzle, 411: conductive layer, 412: organic compound layer, 414a and 414b: conductive layer, 413: insulating layer, 415: conductive layer, 416: semiconductor layer, 417: insulating layer, 418: gate electrode, 419: memory element portion, 420a and 420b: conductive layer, 421 and 422: organic compound layer, 423: semiconductor layer, 424: insulating layer, 425: gate electrode, 426: insulating layer, 427: organic compound layer, 428: conductive layer, 451: transistor, 461: photodiode, 462: transistor, 472: temperature sensor, 482: organic compound layer, 701: substrate, 702: peeling layer, 703: insulating layer, 704: amorphous semiconductor layer, 705: gate insulating layer, 706 and 707: crystalline semiconductor layer, 711:

n-type impurity region, 712: p-type impurity region, 716: conductive layer, 726 and 727: n-type impurity region, 734: insulating layer, 739: insulating layer, 744 and 745: thin film transistor, 749-751: insulating layer, 752 and 757: conductive layer, 762: insulating layer, 763-765: conductive layer, 766: insulating layer, 767: contact hole, 771: conductive layer, 772: insulating layer, 773: opening portion, 775 and 776: substratum, 778: field effect transistor, 779: thin film transistor, 780 and 781: channel formation region, 785: p-type impurity region, 786: conductive layer, 787: organic compound layer, 789 and 790: memory element portion, 791: thin film integrated circuit, 900: RFID, 901: element formation layer, 902: antenna, 903: arithmetic processing circuit area, 904: memory circuit area, 905: communication circuit area, 906: sensor portion, 907: power source circuit area, 908: sensor, 909: sensor circuit, 910 and 911: memory circuit area, 912: demodulation circuit, 913: modulation circuit, 950: sensor portion, 951: conductive layer, 952: conductive particle, 953: conductive layer, 954: resin, 2700: chassis, 2701: panel, 2702: housing, 2703: printed wiring board, 2704: operation button, 2705: battery, 2708: connection film, and 2709: pixel region.

The invention claimed is:

1. A memory element comprising:
    a pair of electrodes; and
    an organic compound layer provided between the pair of electrodes,
    wherein the organic compound layer comprises a polymer material including an amide group at least at one kind of side chains, and
    wherein a main chain of the polymer material has a tacticity of 90% or more.

2. A memory element according to claim 1, wherein the polymer material has amide groups at side chains at a constant rate, and intramolecular hydrogen bonds are formed between the amide groups at side chains which are selected at a constant rate.

3. A memory element according to claim 2, wherein the intramolecular hydrogen bonds are accumulated along a polymer main chain, and a polymer chain is formed.

4. A memory element according to claim 1, wherein a direction of polarization of the polymer material is controlled by applying voltage to the pair of electrodes to control a direction of the amide group.

5. A memory element according to claim 1, wherein the polymer material contains a polyacrylamide derivative shown by a General Formula (1)

(1)

6. A memory element according to claim 5, wherein a main chain of the polyacrylamide derivative has an isotacticity of 90% or more.

7. A memory element according to claim 1, wherein the polymer material contains a polymethacrylamide derivative shown by a General Formula (2)

(2)

8. A memory element according to claim 7, wherein a main chain of the polymethacrylamide derivative has an isotacticity of 90% or more.

9. A memory element according to claim 1, wherein the polymer material contains a polypropargylamide derivative shown by a General Formula (3)

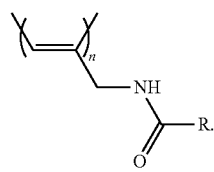

(3)

10. A memory element according to claim 9, wherein a main chain of the polypropargylamide derivative has a tacticity with a cis form of 90% or more.

11. A memory element according to claim 10, wherein the polypropargylamide derivative is obtained by polymerizing propargylamide with a rhodium catalyst or an iron catalyst.

12. A semiconductor device comprising:
    a plurality of bit lines extending in a first direction, wherein the plurality of bit lines include a first conductive layer;
    a plurality of word lines extending in a second direction which is perpendicular to the first direction, wherein the plurality of word lines include a second conductive layer;
    a plurality of memory cells each including a memory element portion; and
    a memory cell array including the plurality of memory cells,
    wherein the memory element portion has a stack structure including the first conductive layer, an organic compound layer, and the second conductive layer,
    wherein the organic compound layer comprises a polymer material including an amide group at least at one kind of side chains, and
    wherein a main chain of the polymer material has a tacticity of 90% or more.

13. A semiconductor device according to claim 12, wherein the polymer material contains a polyacrylamide derivative shown by General Formula (1)

(1)

14. A semiconductor device according to claim 12, wherein the polymer material contains a polymethacrylamide derivative shown by General Formula (2)

(2)

15. A semiconductor device according to claim 12, wherein the polymer material contains a polypropargylamide derivative shown by General Formula (3)

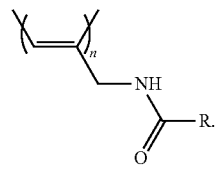
(3)

16. A semiconductor device according to claim 12, wherein the semiconductor device is an RFID chip.

* * * * *